US012685091B2

(12) United States Patent
Suzuki et al.

(10) Patent No.: US 12,685,091 B2
(45) Date of Patent: Jul. 14, 2026

(54) SUPPORT GLASS SUBSTRATE AND LAMINATED SUBSTRATE USING SAME

(71) Applicant: Nippon Electric Glass Co., Ltd., Shiga (JP)

(72) Inventors: Ryota Suzuki, Shiga (JP); Ken Yuki, Shiga (JP); Tetsuya Murata, Shiga (JP); Tomonori Ichimaru, Shiga (JP); Yuta Nagano, Shiga (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 774 days.

(21) Appl. No.: 17/927,190

(22) PCT Filed: May 18, 2021

(86) PCT No.: PCT/JP2021/018705
§ 371 (c)(1),
(2) Date: Nov. 22, 2022

(87) PCT Pub. No.: WO2021/241312
PCT Pub. Date: Dec. 2, 2021

(65) Prior Publication Data
US 2023/0212061 A1      Jul. 6, 2023

(30) Foreign Application Priority Data

May 28, 2020      (JP) ................................. 2020-093161

(51) Int. Cl.
*H10P 72/76* (2026.01)
*C03C 3/083* (2006.01)
(Continued)

(52) U.S. Cl.
CPC .......... *H10P 72/7616* (2026.01); *C03C 3/083* (2013.01); *C03C 3/085* (2013.01);
(Continued)

(58) Field of Classification Search
None
See application file for complete search history.

(56) References Cited

U.S. PATENT DOCUMENTS 6,187,441 B1     2/2001  Takeuchi et al.
2003/0109370 A1    6/2003  Ikenishi et al.
(Continued)

FOREIGN PATENT DOCUMENTS

CN          108367961 A  *  8/2018  ..........  C03B 17/064
CN          110845153        2/2020
(Continued)

OTHER PUBLICATIONS

WO 2020149040 Translation (Year: 2020).*
(Continued)

*Primary Examiner* — Melvin C. Mayes
(74) *Attorney, Agent, or Firm* — Wenderoth, Lind & Ponack, L.L.P.

(57) ABSTRACT

A support glass substrate of the present invention is a support glass substrate for supporting a substrate to be processed, the support glass substrate including lithium aluminosilicate-based glass, having a content of $Li_2O$ of from 0.02 mol % to 25 mol % in a glass composition, and having an average linear thermal expansion coefficient within a temperature range of from 30° C. to 380° C. of $38 \times 10^{-7}$/° C. or more and $160 \times 10^{-7}$/° C. or less.

23 Claims, 6 Drawing Sheets

(51) Int. Cl.

| | |
|---|---|
| *C03C 3/085* | (2006.01) |
| *C03C 3/087* | (2006.01) |
| *C03C 3/093* | (2006.01) |
| *C03C 3/095* | (2006.01) |
| *C03C 3/097* | (2006.01) |
| *C03C 3/11* | (2006.01) |
| *H10P 72/70* | (2026.01) |
| *H10W 72/00* | (2026.01) |

(52) U.S. Cl.
  CPC .............. *C03C 3/087* (2013.01); *C03C 3/093* (2013.01); *C03C 3/095* (2013.01); *C03C 3/097* (2013.01); *C03C 3/11* (2013.01); *H10P 72/70* (2026.01); *H10W 72/0198* (2026.01)

(56) References Cited

U.S. PATENT DOCUMENTS

| | | | |
|---|---|---|---|
| 2009/0131238 A1 | 5/2009 | Kishimoto et al. | |
| 2010/0167091 A1 | 7/2010 | Tachiwana et al. | |
| 2018/0082914 A1* | 3/2018 | Hanawa .................. | H01L 23/15 |
| 2018/0305241 A1* | 10/2018 | Sawamura ............. | H01L 24/96 |
| 2020/0017407 A1* | 1/2020 | Bello .................. | H01L 21/6835 |
| 2020/0325066 A1 | 10/2020 | Murayama et al. | |

FOREIGN PATENT DOCUMENTS

| | | |
|---|---|---|
| JP | 07-206467 | 8/1995 |
| JP | 10-241134 | 9/1998 |
| JP | 2002-274881 | 9/2002 |
| JP | 2002-358626 | 12/2002 |
| WO | 2007/020824 | 2/2007 |
| WO | 2007/142324 | 12/2007 |
| WO | 2018/110163 | 6/2018 |
| WO | 2019/021672 | 1/2019 |
| WO | 2019/021911 | 1/2019 |
| WO | WO 2019/021911 A * | 1/2019 ............. C03C 3/085 |
| WO | 2019/150654 | 8/2019 |
| WO | 2020/013984 | 1/2020 |
| WO | WO-2020149040 A1 * | 7/2020 ............. C03C 15/00 |
| WO | WO-2020161949 A1 * | 8/2020 ........... C03C 21/002 |

OTHER PUBLICATIONS

WO 2020161949 Translation (Year: 2020).*

English language translation of International Preliminary Report on Patentability and Written Opinion of the International Searching Authority issued Nov. 17, 2022 in International (PCT) Patent Application No. PCT/JP2021/018705.

Office Action issued May 19, 2025 in corresponding Chinese Patent Application No. 202180038287.5, with English-language Translation.

"Material surface technology and application manual", Oct. 31, 1998, Editor by Miaogen Qian; Beijing: China Machine Press, p. 836.

International Search Report issued Aug. 3, 2021, in International (PCT) Application No. PCT/JP2021/018705, with English translation.

* cited by examiner

Fig. 1

SUPPORT GLASS SUBSTRATE AND LAMINATED SUBSTRATE USING SAME

TECHNICAL FIELD

The present invention relates to a support glass substrate for supporting a substrate to be processed and a laminated substrate using the same, and more specifically, to a support glass substrate to be used for supporting a substrate to be processed in a manufacturing process for a semiconductor package (semiconductor device), and a laminated substrate using the same.

BACKGROUND ART

Portable electronic devices, such as a cellular phone, a notebook-size personal computer, and a smartphone, are required to be downsized and reduced in weight. Along with this, a mounting space for semiconductor chips to be used in those electronic devices is strictly limited, and there is a problem of high-density mounting of the semiconductor chips. In view of this, in recent years, there has been an attempt to perform high-density mounting of a semiconductor package by a three-dimensional mounting technology, that is, by laminating semiconductor chips on top of another and connecting the semiconductor chips through wiring.

In addition, a conventional wafer level package (WLP) is manufactured by forming bumps into a wafer shape and dicing the wafer into chips. However, the conventional WLP has problems in that it is difficult to increase the number of pins, and chipping and the like of semiconductor chips are liable to occur because the semiconductor chips are mounted under a state in which the back surfaces thereof are exposed.

Accordingly, as a new WLP, a fan-out type WLP has been proposed. In the fan-out type WLP, it is possible to increase the number of pins, and chipping and the like of semiconductor chips can be prevented by protecting end portions of the semiconductor chips.

CITATION LIST

Patent Literature 1: WO 2019/150654 A1
Patent Literature 2: WO 2020/013984 A1

SUMMARY OF INVENTION

Technical Problem

Incidentally, a method of manufacturing the fan-out type WLP includes the step of molding a plurality of semiconductor chips with a sealing material of a resin, to thereby form a substrate to be processed, followed by arranging wiring on one surface of the substrate to be processed, the step of forming solder bumps, and the like.

Those steps involve heat treatment at about 200° C. to about 300° C., and hence there is a risk in that the sealing material may be deformed, and a dimensional change may occur in the substrate to be processed. When the substrate to be processed changes in dimension, it becomes difficult to arrange wiring at high density on one surface of the substrate to be processed, and it is also difficult to form the solder bumps accurately.

It is effective to use a glass substrate as a supporting substrate for preventing the substrate to be processed from changing in dimension. However, even through use of the glass substrate, the substrate to be processed changes in dimension in some cases.

In addition, when the WLP is dropped onto the ground or the like by mistake at the time of manufacturing, the expensive substrate to be processed becomes unusable in some cases owing to breakage of the support glass substrate. In order to avoid such situations, it is important to increase the strength of the support glass substrate.

A promising glass substrate having high strength is lithium aluminosilicate-based glass (see Patent Literature 1). The lithium aluminosilicate-based glass generally has a higher Young's modulus than aluminoborosilicate-based glass, and hence has high mechanical strength, which leads to a high possibility that the glass is hardly broken at the time of dropping.

The present invention has been made in view of the above-mentioned circumstances, and a technical object of the present invention is to provide a support glass substrate, which is less liable to cause a dimensional change of a substrate to be processed and is less liable to be broken at the time of dropping, and a laminated substrate using the same.

Solution to Problem

The inventors of the present invention have repeated various experiments, and as a result, have found that the above-mentioned technical object can be achieved by using lithium aluminosilicate-based glass as a support glass substrate and restricting a thermal expansion coefficient thereof to fall within a predetermined range. Thus, the finding is proposed as the present invention. That is, according to one embodiment of the present invention, there is provided a support glass substrate for supporting a substrate to be processed, the support glass substrate comprising lithium aluminosilicate-based glass, having a content of $Li_2O$ of from 0.02 mol % to 25 mol % in a glass composition, and having an average linear thermal expansion coefficient within a temperature range of from 30° C. to 380° C. of $38 \times 10^{-7}/°$ C. or more and $160 \times 10^{-7}/°$ C. or less. Herein, the "lithium aluminosilicate-based glass" refers to glass comprising $SiO_2$, $Al_2O_3$, and $Li_2O$ in the glass composition. The "average linear thermal expansion coefficient within a temperature range of from 30° C. to 380° C." refers to a value measured for an average thermal expansion coefficient with a dilatometer.

In addition, it is preferred that the support glass substrate for supporting a substrate to be processed according to the one embodiment of the present invention comprise as the glass composition, in terms of mol %, 50% to 80% of $SiO_2$, 4% to 25% of $Al_2O_3$, 0% to 16% of $B_2O_3$, 0.9% to 15% of $Li_2O$, more than 0% to 21% of $Na_2O$, 0% to 15% of $K_2O$, 0% to 10% of MgO, 0% to 10% of ZnO, and 0% to 15% of $P_2O_5$.

In addition, it is preferred that the support glass substrate according to the one embodiment of the present invention satisfy the following relationship: a molar ratio $([Na_2O]—[Li_2O])/([Al_2O_3]+[B_2O_3]+[P_2O_5]) \leq 1.50$. Herein, the "$[Na_2O]$" refers to the content of $Na_2O$ in terms of mol %. The "$[Li_2O]$" refers to the content of $Li_2O$ in terms of mol %. The "$[Al_2O_3]$" refers to the content of $Al_2O_3$ in terms of mol %. The "$[B_2O_3]$" refers to the content of $B_2O_3$ in terms of mol %. The "$[P_2O_5]$" refers to the content of $P_2O_5$ in terms of mol %. The "$([Na_2O]—[Li_2O])/([Al_2O_3]+[B_2O_3]+[P_2O_5])$" refers to a value obtained by dividing a value obtained by subtracting the content of $Li_2O$ from the content of $Na_2O$ by the total content of $Al_2O_3$, $B_2O_3$, and $P_2O_5$.

In addition, it is preferred that the support glass substrate according to the one embodiment of the present invention satisfy the following relationship: a molar ratio $([B_2O_3]+$ $[Na_2O][P_2O_5])/([Al_2O_3]+[Li_2O])\geq0.001$. Herein, the "$([Na_2O]-[Li_2O])/([Al_2O_3]+[B_2O_3]+[P_2O_5])$" refers to a value obtained by dividing a value obtained by subtracting the content of $Li_2O$ from the content of $Na_2O$ by the total content of $Al_2O_3$, $B_2O_3$, and $P_2O_5$.

In addition, it is preferred that the support glass substrate according to the one embodiment of the present invention comprise 12 mol % or more of ($[Li_2O]+[Na_2O]+[K_2O]$), and satisfy the following relationship: $[SiO_2]+1.2\times[P_2O_5]-3\times[Al_2O_3]-2\times[Li_2O]-1.5\times[Na_2O]-[K_2O]-[B_2O_3]-40\%$. Herein, the "$[K_2O]$" refers to the content of $K_2O$ in terms of mol %. The "$[SiO_2]$" refers to the content of $SiO_2$ in terms of mol %. The "$([Li_2O]+[Na_2O]+[K_2O])$" refers to the total content of $Li_2O$, $Na_2O$, and $K_2O$. The "$[SiO_2]+1.2\times[P_2O_5]-3\times[Al_2O_3]-2\times[Li_2O]-1.5\times[Na_2O]-[K_2O]-[B_2O_3]$" refers to a value obtained by subtracting a content three times as large as the content of $Al_2O_3$, a content two times as large as the content of $Li_2O$, a content 1.5 times as large as the content of $Na_2O$, the content of $K_2O$, and the content of $B_2O_3$ from the sum of the content of $SiO_2$ and a content 1.2 times as large as the content of $P_2O_5$.

In addition, it is preferred that the support glass substrate according to the one embodiment of the present invention have a temperature at a viscosity at high temperature of $10^{2.5}$ dPa·s of less than 1,660° C. Herein, the "temperature at a viscosity at high temperature of $10^{2.5}$ dPa·s" may be measured, for example, by a platinum sphere pull up method.

In addition, it is preferred that the support glass substrate according to the one embodiment of the present invention comprise overflow-merged surfaces in a middle portion thereof in a sheet thickness direction, that is, the support glass substrate be formed by an overflow down-draw method. Herein, the "overflow down-draw method" is a method involving causing molten glass to overflow from both sides of forming body refractory, and subjecting the overflowing molten glasses to down-draw downward while the molten glasses are merged at the lower end of the forming body refractory, to thereby manufacture a glass substrate.

In addition, it is preferred that the support glass substrate according to the one embodiment of the present invention have a mass loss of 100.0 mg/cm$^2$ or less per unit surface area when immersed in a 5 mass % HCl aqueous solution warmed to 80° C. for 24 hours.

In addition, it is preferred that the support glass substrate according to the one embodiment of the present invention have a mass loss of 5.0 mg/cm$^2$ or less per unit surface area when immersed in a 5 mass % NaOH aqueous solution warmed to 80° C. for 6 hours.

In addition, it is preferred that the support glass substrate according to the one embodiment of the present invention comprise a compressive stress layer in a glass surface thereof. As a method of increasing the strength of a glass substrate, there is known a method involving subjecting the glass substrate to chemical tempering treatment (see Patent Literature 2). Moreover, as a method of increasing the strength of a tempered glass substrate, it is effective to increase the depth of layer of a compressive stress layer. Specifically, when a laminated substrate is dropped onto the ground and collides therewith, protrusions on the ground penetrate into the support glass substrate to reach a tensile stress layer, which may lead to the breakage of the support glass substrate. In view of the foregoing, when the depth of layer of the compressive stress layer is increased, the protrusions on the ground are less liable to reach the tensile stress layer, and thus the breakage probability of the support glass substrate can be reduced.

In addition, according to one embodiment of the present invention, there is provided a support glass substrate, preferably comprising a compressive stress layer in a glass surface thereof and comprising as a glass composition, in terms of mol %, 50% to 80% of $SiO_2$, 4% to 25% of $Al_2O_3$, 0% to 16% of $B_2O_3$, 0.9% to 15% of $Li_2O$, more than 0% to 21% of $Na_2O$, 0% to 15% of $K_2O$, 0% to 10% of MgO, 0% to 10% of ZnO, and 0% to 15% of $P_2O_5$.

In addition, in the support glass substrate according to the embodiments of the present invention, it is preferred that the compressive stress layer have a compressive stress value of from 165 MPa to 1,000 MPa on an outermost surface. Herein, the "compressive stress value on the outermost surface" and the "depth of layer" each refer to a value measured based on a retardation distribution curve observed, for example, with a scattered light photoelastic stress meter SLP-1000 (manufactured by Orihara Industrial Co., Ltd.). Moreover, the "depth of layer" refers to a depth at which the stress value becomes zero. In calculation of the stress characteristics, the refractive index and the optical elastic constant of each measurement sample are set to 1.51 and 30.1 [(nm/cm)/MPa], respectively.

In addition, in the support glass substrate according to the embodiments of the present invention, it is preferred that the compressive stress layer have a depth of layer of from 50 μm to 200 μm. Lithium aluminosilicate glass is advantageous in obtaining a large depth of layer. In particular, when a glass substrate comprising the lithium aluminosilicate glass is immersed in a molten salt containing $NaNO_3$ to ion-exchange a Li ion in the glass with a Na ion in the molten salt, a tempered glass substrate having a large depth of layer can be obtained.

In addition, it is preferred that the support glass substrate according to the embodiments of the present invention comprise a compressive stress layer in a glass surface thereof, comprise, as the glass composition, 17 mol % or more of $Al_2O_3$, 1 mol % or more of $P_2O_5$, and 12 mol % or more of ($[Li_2O]+[Na_2O]+[K_2O]$), and satisfy the following relationship: $[SiO_2]+1.2\times[P_2O_5]-3\times[Al_2O_3]-2\times[Li_2O]-1.5\times[Na_2O]-[K_2O]-[B_2O_3]\geq-20$ mol %.

In addition, it is preferred that the support glass substrate according to the embodiments of the present invention comprise a compressive stress layer in a glass surface thereof and have a stress profile having at least a first peak, a second peak, a first bottom, and a second bottom in a thickness direction.

In addition, it is preferred that the support glass substrate according to the embodiments of the present invention have a wafer shape or a substantially disc shape having a diameter of from 100 mm to 500 mm, have a sheet thickness of less than 2.0 mm, have a total thickness variation (TTV) of 5 μm or less, and have a warpage level of 60 μm or less. Herein, the "total thickness variation (TTV)" refers to a difference between the maximum thickness and the minimum thickness of the entire support glass substrate, and may be measured with, for example, SBW-331ML/d manufactured by Kobelco Research Institute, Inc. The "warpage level" refers to the total of the absolute value of the maximum distance between the highest point and the least squares focal plane of the entire support glass substrate, and the absolute value of the maximum distance between the lowest point and the least squares focal plane thereof, and may be measured with, for example, a Bow/Warp measurement device SBW-331M/Ld manufactured by Kobelco Research Institute, Inc.

In addition, it is preferred that the support glass substrate according to the embodiments of the present invention have a substantially rectangular shape of □200 mm or more, have a sheet thickness of 1.0 mm or more, and have a total thickness variation (TTV) of 30 μm or less.

In addition, it is preferred that the support glass substrate according to the embodiments of the present invention have a corner angle of from 89.0° to 91.0° when seen from above.

In addition, it is preferred that the support glass substrate according to the embodiments of the present invention comprise a positioning portion in an outer peripheral portion thereof, and it is more preferred that the positioning portion have any one of a notch structure, a chamfer structure, and a cutout structure.

According to one embodiment of the present invention, there is provided a laminate, preferably comprising at least a substrate to be processed and a support glass substrate for supporting the substrate to be processed, wherein the support glass substrate is the above-mentioned support glass substrate. It is preferred that the substrate to be processed comprise at least a semiconductor chip molded with a sealing material.

According to one embodiment of the present invention, there is provided a method of manufacturing a semiconductor package, preferably comprising the steps of: preparing a laminate comprising at least a substrate to be processed and a support glass substrate for supporting the substrate to be processed; and subjecting the substrate to be processed to processing treatment, wherein the support glass substrate is the above-mentioned support glass substrate.

In addition, in the method of manufacturing a semiconductor package according to the one embodiment of the present invention, it is preferred that the step of subjecting the substrate to be processed to processing treatment comprise arranging wiring on one surface of the substrate to be processed.

In addition, in the method of manufacturing a semiconductor package according to the one embodiment of the present invention, it is preferred that the step of subjecting the substrate to be processed to processing treatment comprise forming a solder bump on one surface of the substrate to be processed.

According to one embodiment of the present invention, there is provided a glass substrate, comprising as a glass composition, in terms of mol %, 50% to 65% of $SiO_2$, 8% to 25% of $Al_2O_3$, 0% to 10% of $B_2O_3$, 5.1% to 20% of $Li_2O$, more than 10% to 16.1% of $Na_2O$, 0% to 15% of $K_2O$, 0.01% to 3% of MgO, 0% to 10% of CaO, and 0.01% to 10% of $ZrO_2$, and having a Young's modulus of 80 GPa or more. Herein, the "Young's modulus" refers to a value calculated by a method in conformity with JIS R1602-1995 "Testing methods for elastic modulus of fine ceramics."

In addition, according to one embodiment of the present invention, there is provided a glass substrate, comprising as a glass composition, in terms of mol %, 50% to 65% of $SiO_2$, 8% to 18% of $Al_2O_3$, 0% to 10% of $B_2O_3$, 20% to 25% of $Li_2O$, 0.01% to 10% of $Na_2O$, 0% to 15% of $K_2O$, 0% to 10% of MgO, 0.01% to 10% of CaO, and 0% to 10% of $ZrO_2$, having a Young's modulus of 85 GPa or more, and having a fracture toughness $K_{1C}$ of 0.80 MPa·m$^{0.5}$ or more. Herein, the "fracture toughness $K_{1C}$" refers to a value calculated by a method in conformity with JIS R1607-2015 "Testing methods for fracture toughness of fine ceramics at room temperature."

According to one embodiment of the present invention, there is provided a glass substrate, comprising as a glass composition, in terms of mol %, 64% to 76% of $SiO_2$, 4% to 15% of $Al_2O_3$, 4% to 16% of $B_2O_3$, 0.1% to 14% of $Li_2O$, 0.01% to 14% of $Na_2O$, 0% to 15% of $K_2O$, 0% to 7% of MgO, 0% to 7% of CaO, 0% to 7% of SrO, 0% to 7% of BaO, and 0% to 10% of $ZrO_2$, having a Young's modulus of 60 GPa or more, and having an average linear thermal expansion coefficient within a temperature range of from 30° C. to 380° C. of $38 \times 10^{-7}/°$ C. or more and $85 \times 10^{-7}/°$ C. or less.

In addition, according to one embodiment of the present invention, there is provided a glass substrate, comprising as a glass composition, in terms of mol %, 64% to 76% of $SiO_2$, 4% to 15% of $Al_2O_3$, 4% to 16% of $B_2O_3$, 0.1% to 14% of $Li_2O$, 0.01% to 14% of $Na_2O$, 0% to 15% of $K_2O$, 0.01% to 7% of MgO, 0.01% to 7% of CaO, 0% to 7% of SrO, 0% to 7% of BaO, and 0% to 10% of $ZrO_2$, having a Young's modulus of 60 GPa or more, and having an average linear thermal expansion coefficient within a temperature range of from 30° C. to 380° C. of $38 \times 10^{-7}/°$ C. or more and $85 \times 10^{-7}/°$ C. or less.

In addition, according to one embodiment of the present invention, there is provided a glass substrate, comprising as a glass composition, in terms of mol %, 64% to 76% of $SiO_2$, 4% to 15% of $Al_2O_3$, 4% to 16% of $B_2O_3$, 0.1% to 14% of $Li_2O$, 0.01% to 14% of $Na_2O$, 0% to 15% of $K_2O$, 0% to 7% of MgO, 0% to 7% of CaO, 0.01% to 7% of SrO, 0% to 7% of BaO, and 0% to 10% of $ZrO_2$, having a Young's modulus of 60 GPa or more, and having an average linear thermal expansion coefficient within a temperature range of from 30° C. to 380° C. of $38 \times 10^{-7}/°$ C. or more and $85 \times 10^{-7}/°$ C. or less.

In addition, according to one embodiment of the present invention, there is provided a glass substrate, comprising as a glass composition, in terms of mol %, 64% to 76% of $SiO_2$, 4% to 15% of $Al_2O_3$, 4% to 16% of $B_2O_3$, 0.1% to 14% of $Li_2O$, 0.01% to 14% of $Na_2O$, 0% to 15% of $K_2O$, 0.01% to 7% of MgO, 0.01% to 7% of CaO, 0.01% to 7% of SrO, 0% to 7% of BaO, and 0% to 10% of $ZrO_2$, having a Young's modulus of 60 GPa or more, and having an average linear thermal expansion coefficient within a temperature range of from 30° C. to 380° C. of $38 \times 10^{-7}/°$ C. or more and $85 \times 10^{-7}/°$ C. or less.

In addition, according to one embodiment of the present invention, there is provided a glass substrate, comprising as a glass composition, in terms of mol %, 64% to 76% of $SiO_2$, 4% to 15% of $Al_2O_3$, 4% to 16% of $B_2O_3$, 1.5% to 8.5% of $Li_2O$, 0.01% to 14% of $Na_2O$, 0% to 15% of $K_2O$, 0.01% to 7% of MgO, 0.01% to 7% of CaO, 0.01% to 7% of SrO, 0% to 7% of BaO, and 0% to 10% of $ZrO_2$, having a Young's modulus of 60 GPa or more, and having an average linear thermal expansion coefficient within a temperature range of from 30° C. to 380° C. of $38 \times 10^{-7}/°$ C. or more and $85 \times 10^{-7}/°$ C. or less.

BRIEF DESCRIPTION OF DRAWINGS

Figure 1:
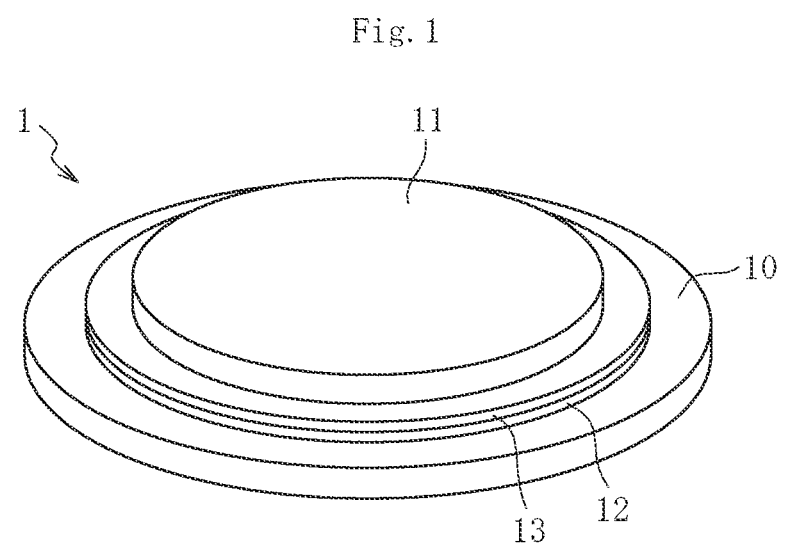

FIG. 1 is a conceptual perspective view for illustrating an example of a laminated substrate of the present invention.

DESCRIPTION OF EMBODIMENTS

Figure 2A:
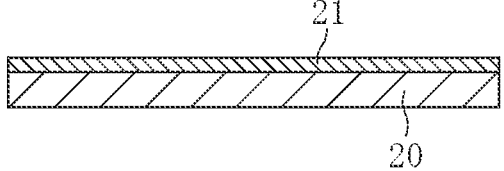
FIGS. 2(a)-2(g) are conceptual sectional views for illustrating a manufacturing process for a fan-out type WLP.
Figure 2B:
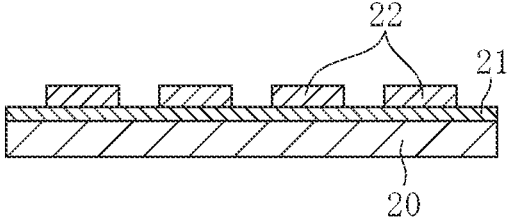
Figure 2C:
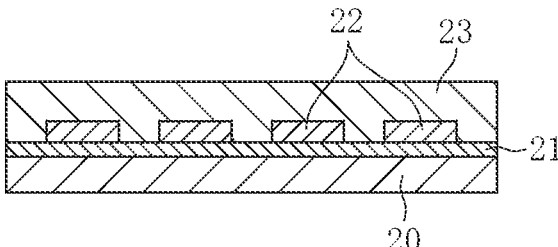
Figure 2D:
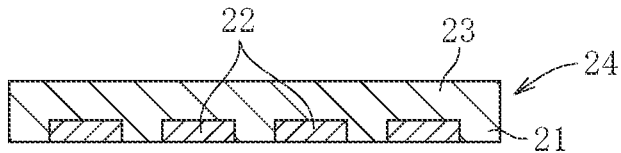
Figure 2E:
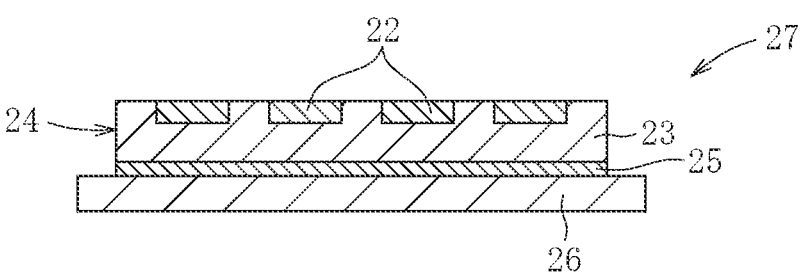
Figure 2F:
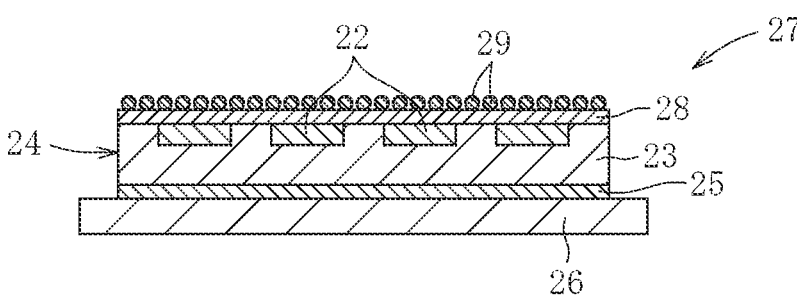
Figure 2G:
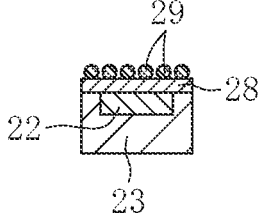
Figure 3A:
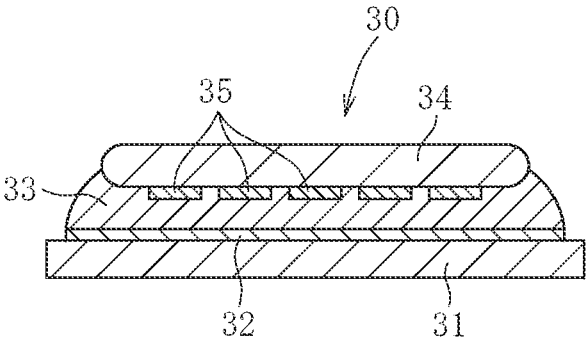
FIGS. 3(a)-(e) are conceptual sectional views for illustrating a step of thinning a substrate to be processed through use of a support glass substrate as a backgrind substrate.
Figure 3B:
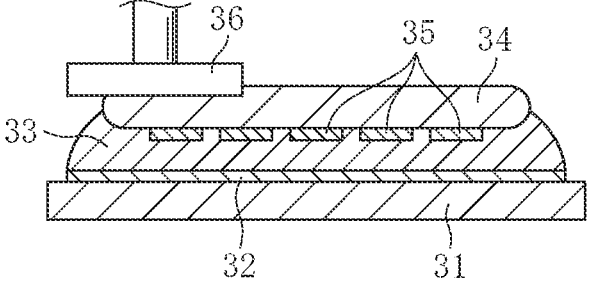
Figure 3C:
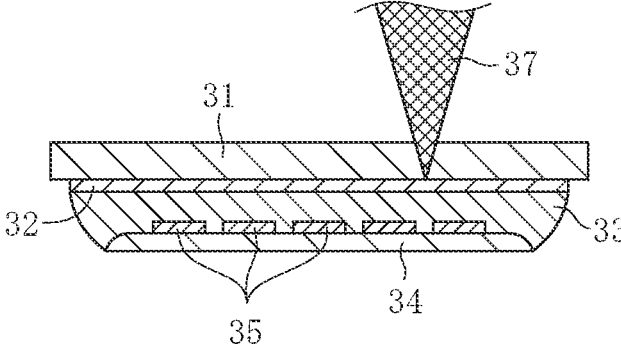
Figure 3D:
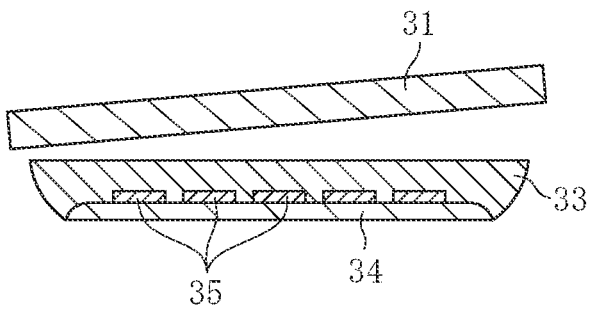
Figure 3E:
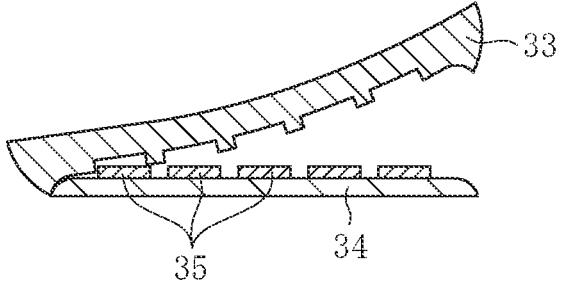

A support glass substrate of the present invention comprises lithium aluminosilicate-based glass and has a content of $Li_2O$ of from 0.02 mol % to 25 mol % in a glass composition. $Li_2O$ is a component that reduces a viscosity at high temperature to improve meltability and formability, and is also a component that increases a Young's modulus and a fracture toughness $K_{1c}$. In addition, $Li_2O$ is a component required for increasing a thermal expansion coefficient. Further, $Li_2O$ is an ion exchange component, and is particularly an essential component for obtaining a large depth of layer through ion exchange between a Li ion in the glass and a Na ion in a molten salt. Meanwhile, when the content of $Li_2O$ is too large, the devitrification property of the glass is increased, with the result that it becomes difficult to obtain transparent glass. In addition, a manufacturing cost also rises. Accordingly, a suitable lower limit of the content range of $Li_2O$ is 0.02 mol % or more, 0.03 mol % or more, 0.04 mol % or more, 0.05 mol % or more, 0.1 mol % or more, 0.2 mol % or more, 0.3 mol % or more, 0.4 mol % or more, 0.5 mol % or more, 0.9 mol % or more, 1 mol % or more, 1.5 mol % or more, 2 mol % or more, 3 mol % or more, 4 mol % or more, 4.5 mol % or more, 4.9 mol % or more, 5 mol % or more, 5.1 mol % or more, 5.2 mol % or more, 5.5 mol % or more, 6.5 mol % or more, 7 mol % or more, 7.3 mol % or more, 7.5 mol % or more, or 7.8 mol % or more, particularly 8 mol % or more. When the Young's modulus or the fracture toughness $K_{1c}$ is preferentially increased, the content of $Li_2O$ is 15 mol % or more, particularly 20 mol % or more. Accordingly, a suitable upper limit of the content range of $Li_2O$ is 25 mol % or less, 24 mol % or less, 23 mol % or less, 22 mol % or less, 21 mol % or less, 20.5 mol % or less, 20.1 mol % or less, 20 mol % or less, 19.9 mol % or less, 19.8 mol % or less, 19 mol % or less, 18 mol % or less, 17 mol % or less, 16 mol % or less, 15 mol % or less, 13 mol % or less, 12 mol % or less, 11.5 mol % or less, 11 mol % or less, 10.5 mol % or less, less than 10 mol %, 9.9 mol % or less, 9 mol % or less, or 8.9 mol % or less, particularly 8.5 mol % or less.

It is preferred to restrict the thermal expansion coefficient of the support glass substrate so as to match with the thermal expansion coefficient of a substrate to be processed. Specifically, when the ratio of a semiconductor chip is low and the ratio of a sealing material is high in the substrate to be processed, it is preferred to increase the thermal expansion coefficient of the support glass substrate. In contrast, when the ratio of the semiconductor chip is high and the ratio of the sealing material is low in the substrate to be processed, it is preferred to reduce the thermal expansion coefficient of the support glass substrate. Accordingly, the average linear thermal expansion coefficient of the support glass substrate within the temperature range of from 30° C. to 380° C. is preferably $38 \times 10^{-7}/°$ C. or more and $160 \times 10^{-7}/°$ C. or less, more preferably $45 \times 10^{-7}/°$ C. or more and $155 \times 10^{-7}/°$ C. or less, $50 \times 10^{-7}/°$ C. or more and $150 \times 10^{-7}/°$ C. or less, $55 \times 10^{-7}/°$ C. or more and $140 \times 10^{-7}/°$ C. or less, $60 \times 10^{-7}/°$ C. or more and $130 \times 10^{-7}/°$ C. or less, $65 \times 10^{-7}/°$ C. or more and $120 \times 10^{-7}/°$ C. or less, $65 \times 10^{-7}/°$ C. or more and $110 \times 10^{-7}/°$ C. or less, $70 \times 10^{-7}/°$ C. or more and $105 \times 10^{-7}/°$ C. or less, $75 \times 10^{-7}/°$ C. or more and $100 \times 10^{-7}/°$ C. or less, $80 \times 10^{-7}/°$ C. or more and $99 \times 10^{-7}/°$ C. or less, or $85 \times 10^{-7}/°$ C. or more and $98 \times 10^{-7}/°$ C. or less, particularly preferably $87 \times 10^{-7}/°$ C. or more and $96 \times 10^{-7}/°$ C. or less. The "thermal expansion coefficient within the temperature range of from 30° C. to 380° C." refers to a value measured for an average thermal expansion coefficient with a dilatometer.

It is preferred that the support glass substrate of the present invention comprise as the glass composition, in terms of mol %, 50% to 80% of $SiO_2$, 4% to 25% of $Al_2O_3$, 0% to 16% of $B_2O_3$, 0.9% to 15% of $Li_2O$, more than 0% to 21% of $Na_2O$, 0% to 15% of $K_2O$, 0% to 10% of MgO, 0% to 10% of ZnO, and 0% to 15% of $P_2O_5$. In the following description of the content range of each component, the expression "%" means "mol %".

$SiO_2$ is a component that forms a glass network. When the content of $SiO_2$ is too small, vitrification does not occur easily, and the thermal expansion coefficient becomes too high, with the result that thermal shock resistance is liable to be reduced. Accordingly, a suitable lower limit of the content range of $SiO_2$ is 50% or more, 55% or more, 57% or more, or 59% or more, particularly 61% or more. Meanwhile, when the content of $SiO_2$ is too large, the meltability and the formability are liable to be reduced, and the thermal expansion coefficient is excessively reduced, with the result that it becomes difficult to match the thermal expansion coefficient with those of peripheral materials. Accordingly, a suitable upper limit of the content range of $SiO_2$ is 80% or less, 70% or less, 68% or less, 66% or less, or 65% or less, particularly 64.5% or less.

$Al_2O_3$ is a component that increases a strain point, the Young's modulus, the fracture toughness, and a Vickers hardness, and is also a component that improves ion exchange performance. Accordingly, a suitable lower limit of the content range of $Al_2O_3$ is 4% or more, 8% or more, 10% or more, 12% or more, 13% or more, 14% or more, 14.4% or more, 15% or more, 15.3% or more, 15.6% or more, 16% or more, 16.5% or more, 17% or more, 17.5% or more, 18% or more, or more than 18%, particularly 18.5% or more. Meanwhile, when the content of $Al_2O_3$ is too large, the viscosity at high temperature is increased, with the result that the meltability and the formability are liable to be reduced. In addition, a devitrified crystal is liable to precipitate in the glass, and it becomes difficult to form the glass into a sheet shape by an overflow down-draw method or the like. Particularly when the glass substrate is formed by an overflow down-draw method involving using alumina-based refractory as forming body refractory, a devitrified crystal of spinel is liable to precipitate at an interface with the alumina-based refractory. Further, acid resistance is reduced, with the result that it becomes difficult to apply the glass to an acid treatment step. Accordingly, a suitable upper limit of the content range of $Al_2O_3$ is 25% or less, 21% or less, 20.5% or less, 20% or less, 19.9% or less, 19.5% or less, or 19.0% or less, particularly 18.9% or less. When the content of $Al_2O_3$, which has a large influence on the ion exchange performance, is set to fall with the suitable ranges, a profile having a first peak, a second peak, a first bottom, and a second bottom becomes easily formable.

$B_2O_3$ is a component that reduces the viscosity at high temperature and a density, and stabilizes the glass to cause less precipitation of a crystal, to thereby reduce a liquidus temperature. When the content of $B_2O_3$ is too small, there is a risk in that the glass may be unstable, and devitrification resistance may be reduced. Accordingly, a suitable lower limit of the content range of $B_2O_3$ is 0% or more, 0.1% or more, 0.2% or more, 0.5% or more, 0.6% or more, 0.7% or more, 0.8% or more, or 0.9% or more, particularly 1% or more. Meanwhile, when the content of $B_2O_3$ is too large, there is a risk in that the depth of layer may be reduced. In particular, the efficiency of ion exchange between a Na ion in the glass and a K ion in a molten salt is liable to be reduced, and the depth of layer ($DOL\_ZERO_K$) of a compressive stress layer is liable to be reduced. Accordingly, a suitable upper limit of the content range of $B_2O_3$ is 16% or less, 14% or less, 12% or less, 10% or less, 5% or less, 4% or less, 3.8% or less, 3.5% or less, 3.3% or less, 3.2% or less, 3.1% or less, or 3% or less, particularly 2.9% or less. When the content of $B_2O_3$ is set to fall within the suitable ranges, the profile having a first peak, a second peak, a first bottom, and a second bottom becomes easily formable.

The content and effects of $Li_2O$ are as described above.

$Na_2O$ is an ion exchange component, and is also a component that reduces the viscosity at high temperature to improve the meltability and the formability. In addition, $Na_2O$ is a component that improves the devitrification resistance, and is particularly a component that suppresses devitrification caused by a reaction with alumina-based refractory. Further, $Na_2O$ is also a component that increases the thermal expansion coefficient. Accordingly, a suitable lower limit of the content range of $Na_2O$ is more than 0%, 3% or more, 4% or more, 5% or more, 6% or more, 7% or more, 7.5% or more, 8% or more, 8.5% or more, 8.8% or more, or 9% or more, particularly more than 10%. Meanwhile, when the content of $Na_2O$ is too large, the thermal expansion coefficient is excessively increased, and the thermal shock resistance is liable to be reduced. In addition, the glass composition loses its component balance, and the devitrification resistance may be reduced contrarily. Accordingly, a suitable upper limit of the content range of $Na_2O$ is 21% or less, 20% or less, or 19% or less, particularly 18% or less, 16.1% or less, 14% or less, 15% or less, or 13% or less, particularly 11% or less.

$K_2O$ is a component that reduces the viscosity at high temperature to improve the meltability and the formability. However, when the content of $K_2O$ is too large, the thermal expansion coefficient is excessively increased, and the thermal shock resistance is liable to be reduced. In addition, the compressive stress value of the compressive stress layer on the outermost surface is liable to be reduced. Further, $K_2O$ is also a component that increases the thermal expansion coefficient. Accordingly, a suitable upper limit of the content range of $K_2O$ is 15% or less, 10% or less, 7% or less, 6% or less, 5% or less, 4% or less, 3% or less, 2% or less, 1.5% or less, 1% or less, less than 1%, or 0.5% or less, particularly less than 0.1%. When the viewpoint of increasing the depth of layer is emphasized, a suitable lower limit of the content range of $K_2O$ is 0% or more, 0.1% or more, or 0.3% or more, particularly 0.5% or more.

The molar ratio $[Li_2O]/([Na_2O]+[K_2O])$ is preferably from 0.0 to 15.4, from 0.1 to 10.0, from 0.2 to 5.0, from 0.3 to 3.0, from 0.4 to 1.0, or from 0.5 to 0.9, particularly preferably from 0.6 to 0.8. When the molar ratio $[Li_2O]/([Na_2O]+[K_2O])$ is too low, there is a risk in that the ion exchange performance cannot be sufficiently exhibited. In particular, the efficiency of ion exchange between a Li ion in the glass and a Na ion in the molten salt is liable to be reduced. Meanwhile, when the molar ratio $[Li_2O]/([Na_2O]+[K_2O])$ is too high, a devitrified crystal is liable to precipitate in the glass, and it becomes difficult to form the glass into a sheet shape by an overflow down-draw method or the like. The "$[Li_2O]/([Na_2O]+[K_2O])$" refers to a value obtained by dividing the content of $Li_2O$ by the total content of $Na_2O$ and $K_2O$.

MgO is a component that reduces the viscosity at high temperature to improve the meltability and the formability, and increases the strain point and the Vickers hardness. Among alkaline earth metal oxides, MgO is a component that has a high effect of improving the ion exchange performance. However, when the content of MgO is too large, the devitrification resistance is liable to be reduced, and in particular, it becomes difficult to suppress devitrification caused by a reaction with alumina-based refractory. Accordingly, a suitable content of MgO is from 0% to 10%, from 0.01% to 7%, from 0.05% to 5%, from 0.1% to 4%, or from 0.2% to 3.5%, particularly from 0.5% to less than 3%.

ZnO is a component that improves the ion exchange performance, and is particularly a component that has a high effect of increasing the compressive stress value of the compressive stress layer on the outermost surface. In addition, ZnO is also a component that reduces the viscosity at high temperature without reducing a viscosity at low temperature. A suitable lower limit of the content range of ZnO is 0% or more, 0.1% or more, 0.3% or more, 0.5% or more, or 0.7% or more, particularly 1% or more. Meanwhile, when the content of ZnO is too large, there is a tendency that the glass undergoes phase separation, the devitrification resistance is reduced, the density is increased, or the depth of layer is reduced. Accordingly, a suitable upper limit of the content range of ZnO is 10% or less, 6% or less, 5% or less, 4% or less, 3% or less, 2% or less, 1.5% or less, 1.3% or less, or 1.2% or less, particularly 1.1% or less.

$P_2O_5$ is a component that improves the ion exchange performance, and is particularly a component that increases the depth of layer. Further, $P_2O_5$ is a component that also improves the acid resistance. When the content of $P_2O_5$ is too small, there is a risk in that the ion exchange performance cannot be sufficiently exhibited. In particular, the efficiency of ion exchange between a Na ion in the glass and a K ion in the molten salt is liable to be reduced, and the depth of layer ($DOL\_ZERO_K$) of the compressive stress layer is liable to be reduced. In addition, there is a risk in that the glass may be unstable, and the devitrification resistance may be reduced. Accordingly, a suitable lower limit of the content range of $P_2O_5$ is 0% or more, 0.1% or more, 0.4% or more, 0.7% or more, 1% or more, 1.2% or more, 1.4% or more, 1.6% or more, 2% or more, 2.3% or more, or 2.5% or more, particularly 3% or more. Meanwhile, when the content of $P_2O_5$ is too large, the glass is liable to undergo phase separation, or water resistance is liable to be reduced. In addition, the depth of layer obtained through ion exchange between a Li ion in the glass and a Na ion in the molten salt is excessively increased, with the result that the compressive stress value ($CS_{Na}$) of the compressive stress layer is liable to be reduced. Accordingly, a suitable upper limit of the content range of $P_2O_5$ is 15% or less, 10% or less, 5% or less, or 4.5% or less, particularly 4% or less. When the content of $P_2O_5$ is set to fall within the suitable ranges, a non-monotonic profile becomes easily formable.

An alkali metal oxide is a component that reduces the viscosity at high temperature to improve the meltability and the formability, and is also an ion exchange component. Accordingly, a suitable lower limit of the content range of the alkali metal oxide ($[Li_2O]+[Na_2O]+[K_2O]$) is 5% or more, 6% or more, 7% or more, 8% or more, 9% or more, 10% or more, 11% or more, 12% or more, 13% or more, or 14% or more, particularly 15% or more. However, when the content of the alkali metal oxide ($[Li_2O]+[Na_2O]+[K_2O]$) is too large, there is a risk in that the thermal expansion coefficient may be increased. In addition, there is a risk in that the acid resistance may be reduced. Accordingly, a suitable upper limit of the content range of the alkali metal oxide ($[Li_2O]+[Na_2O]+[K_2O]$) is 28% or less, 25% or less, 23% or less, 20% or less, or 19% or less, particularly 18% or less.

The molar ratio $[Li_2O]/[P_2O_5]$ is preferably 0 or more, from 0.1 to 30, from 0.5 to 29, from 0.9 to 28, from 3.8 to 27, from 4 to 26, or from 10 to 25, particularly preferably from 15 to 20. When the molar ratio $[Li_2O]/[P_2O_5]$ is too low, the efficiency of ion exchange between a Li ion in the glass and a Na ion in the molten salt is liable to be reduced. Meanwhile, when the molar ratio $[Li_2O]/[P_2O_5]$ is too high, a devitrified crystal is liable to precipitate in the glass, and it becomes difficult to form the glass into a sheet shape by an overflow down-draw method or the like. The "$[Li_2O]/[P_2O_5]$" refers to a value obtained by dividing the content of $Li_2O$ by the content of $P_2O_5$.

The molar ratio $([Na_2O]—[Li_2O])/([Al_2O_3]+[B_2O_3]+[P_2O_5])$ is preferably 1.50 or less, 0.70 or less, 0.50 or less, 0.30 or less, 0.29 or less, 0.27 or less, 0.26 or less, 0.25 or less, 0.23 or less, or 0.20 or less, particularly preferably 0.15 or less. When the molar ratio $([Na_2O]—[Li_2O])/([Al_2O_3]+[B_2O_3]+[P_2O_5])$ is too high, there is a risk in that the ion exchange performance cannot be sufficiently exhibited. In particular, the efficiency of ion exchange between a Li ion in the glass and a Na ion in the molten salt is liable to be reduced.

The molar ratio $([B_2O_3]+[Na_2O]—[P_2O_5])/([Al_2O_3]+[Li_2O])$ is preferably 0.001 or more, 0.05 or more, 0.15 or more, 0.25 or more, 0.30 or more, 0.35 or more, 0.40 or more, 0.42 or more, or 0.43 or more, particularly preferably 0.45 or more. When the molar ratio $([B_2O_3]+[Na_2O]—[P_2O_5])/([Al_2O_3]+[Li_2O])$ is too low, a devitrified crystal is liable to precipitate in the glass, and it becomes difficult to form the glass into a sheet shape by an overflow down-draw method or the like.

The $([SiO_2]+1.2\times[P_2O_5]-3\times[Al_2O_3]-2\times[Li_2O]-1.5\times[Na_2O]—[K_2O]—[B_2O_3])$ is preferably −40% or more, −30% or more, −25% or more, or −22% or more, particularly preferably −20% or more. When the $([SiO_2]+1.2\times[P_2O_5]-3\times[Al_2O_3]-2\times[Li_2O]-1.5\times[Na_2O]—[K_2O]—[B_2O_3])$ is too low, the acid resistance is liable to be reduced. Meanwhile, when the $([SiO_2]+1.2\times[P_2O_5]-3\times[Al_2O_3]-2\times[Li_2O]-1.5\times[Na_2O]—[K_2O]—[B_2O_3])$ is too high, there is a risk in that the ion exchange performance cannot be sufficiently exhibited.

Accordingly, the $([SiO_2]+1.2\times[P_2O_5]-3\times[Al_2O_3]-2\times[Li_2O]-1.5\times[Na_2O]—[K_2O]—[B_2O_3])$ is preferably 50% or less, 40% or less, 30% or less, 20% or less, 15% or less, 10% or less, or 5% or less, particularly preferably 0% or less.

For example, the following components other than the above-mentioned components may be added.

CaO is a component that reduces the viscosity at high temperature to improve the meltability and the formability without reducing the devitrification resistance as compared to other components, and increases the strain point and the Vickers hardness. However, when the content of CaO is too large, there is a risk in that the ion exchange performance may be reduced, or an ion exchange solution may be degraded at the time of ion exchange treatment. Accordingly, a suitable upper limit of the content range of CaO is 10% or less, 8% or less, 7% or less, 6% or less, 5% or less, 4% or less, 3.5% or less, 3% or less, 2% or less, 1% or less, less than 1%, or 0.5% or less, particularly from 0.01% to less than 0.1%.

SrO and BaO are each a component that reduces the viscosity at high temperature to improve the meltability and the formability, and increases the strain point and the Young's modulus. However, when the contents of SrO and BaO are too large, an ion exchange reaction is liable to be inhibited. Besides, the density or the thermal expansion coefficient is increased inappropriately, or the glass is liable to devitrify. Accordingly, suitable contents of SrO and BaO are each from 0% to 7%, from 0% to 5%, from 0% to 3%, from 0% to 2%, from 0% to 1.5%, from 0% to 1%, from 0% to 0.5%, or from 0% to 0.1%, particularly from 0.01% to less than 0.1%.

$ZrO_2$ is a component that increases the Vickers hardness, and is also a component that increases viscosity around the liquidus viscosity and the strain point. However, when the content of $ZrO_2$ is too large, there is a risk in that the devitrification resistance is remarkably reduced. Accordingly, a suitable content of $ZrO_2$ is from 0% to 5%, from 0% to 4%, from 0% to 3%, from 0% to 1.5%, or from 0% to 1%, particularly from 0.01% to 0.1%.

$TiO_2$ is a component that improves the ion exchange performance, and is also a component that reduces the viscosity at high temperature. However, when the content of $TiO_2$ is too large, transparency and the devitrification resistance are liable to be reduced. Accordingly, a suitable content of $TiO_2$ is from 0% to 3%, from 0% to 1.5%, from 0% to 1%, or from 0% to 0.1%, particularly from 0.001 mol % to 0.1 mol %.

$SnO_2$ is a component that improves the ion exchange performance. However, when the content of $SnO_2$ is too large, the devitrification resistance is liable to be reduced. Accordingly, a suitable lower limit of the content range of $SnO_2$ is 0.005% or more, or 0.01% or more, particularly 0.1% or more, and a suitable upper limit thereof is 3% or less, or 2% or less, particularly 1% or less.

Cl is a fining agent, but is a component that adversely affects an environment or a facility when the content thereof is too large. Accordingly, a suitable lower limit of the content range of Cl is 0.001% or more, particularly 0.01% or more, and a suitable upper limit thereof is 0.3% or less, or 0.2% or less, particularly 0.1% or less.

As a fining agent, one kind or two or more kinds selected from the group consisting of $SO_3$ and $CeO_2$ (preferably the group consisting of $SO_3$) may be added at from 0.001% to 1%.

$Fe_2O_3$ is an impurity that is inevitably mixed in from raw materials. A suitable upper limit of the content range of $Fe_2O_3$ is 2,000 ppm or less (0.2% or less), 1,500 ppm or less (0.15% or less), less than 1,000 ppm (less than 0.1%), less than 800 ppm, less than 600 ppm, or less than 400 ppm, particularly less than 300 ppm. When the content of $Fe_2O_3$ is too large, the transmittance of a cover glass is liable to be reduced. Meanwhile, a suitable lower limit of the content range of $Fe_2O_3$ is 10 ppm or more, 20 ppm or more, 30 ppm or more, 50 ppm or more, 80 ppm or more, or 100 ppm or more. When the content of $Fe_2O_3$ is too small, a raw material cost rises owing to the use of high-purity raw materials, and a product cannot be manufactured inexpensively.

A rare earth oxide, such as $Nd_2O_3$, $La_2O_3$, $Y_2O_3$, $Nb_2O_5$, $Ta_2O_5$, or $Hf_2O_3$, is a component that increases the Young's modulus. However, the costs of raw materials therefor are high. In addition, when the rare earth oxide is added in a large amount, the devitrification resistance is liable to be reduced. Accordingly, a suitable content of the rare earth oxide is 5% or less, 3% or less, 2% or less, 1% or less, or 0.5% or less, particularly 0.1% or less.

It is preferred that the support glass substrate of the present invention be substantially free of each of $As_2O_3$, $Sb_2O_3$, PbO, and F as a glass composition from the standpoint of environmental considerations. In addition, it is also preferred that the support glass substrate be substantially free of $Bi_2O_3$ from the standpoint of environmental considerations. The "substantially free of" has a concept in which the explicit component is not positively added as a glass component, but its addition at an impurity level is permitted, and specifically refers to the case in which the content of the explicit component is less than 0.05%.

The support glass substrate of the present invention preferably has the following characteristics.

The temperature at a viscosity at high temperature of $10^{2.5}$ dPa·s of the support glass substrate of the present invention is preferably less than 1,800° C., more preferably less than 1,660° C., 1,640° C. or less, less than 1,620° C., or 1,600° C. or less, particularly preferably from 1,400° C. to 1,590° C. When the temperature at a viscosity at high temperature of $10^{2.5}$ dPa·s is too high, the meltability and the formability are reduced, with the result that it becomes difficult to form molten glass into a sheet shape.

A density is preferably 2.80 g/cm$^3$ or less, 2.70 g/cm$^3$ or less, 2.60 g/cm$^3$ or less, 2.58 g/cm$^3$ or less, 2.56 g/cm$^3$ or less, 2.55 g/cm$^3$ or less, 2.53 g/cm$^3$ or less, 2.50 g/cm$^3$ or less, 2.49 g/cm$^3$ or less, or 2.45 g/cm$^3$ or less, particularly preferably from 2.35 g/cm$^3$ to 2.44 g/cm$^3$. As the density becomes lower, the weight of a tempered glass substrate can be reduced more.

A softening point is preferably 985° C. or less, 970° C. or less, 950° C. or less, 930° C. or less, 900° C. or less, 880° C. or less, or 860° C. or less, particularly preferably from 850° C. to 700° C. The "softening point" refers to a value measured based on a method of ASTM C338.

A liquidus viscosity is preferably $10^{3.0}$ dPa·s or more, $10^{3.2}$ dPa·s or more, $10^{3.4}$ dPa·s or more, $10^{3.6}$ dPa·s or more, $10^{3.74}$ dPa·s or more, $10^{4.5}$ dPa·s or more, $10^{4.8}$ dPa·s or more, $10^{4.9}$ dPa·s or more, $10^{5.0}$ dPa·s or more, $10^{5.1}$ dPa·s or more, $10^{5.2}$ dPa·s or more, $10^{5.3}$ dPa·s or more, or $10^{5.4}$ dPa·s or more, particularly preferably $10^{5.5}$ dPa·s or more. As the liquidus viscosity becomes higher, devitrification resistance is improved more, and devitrified stones are less liable to be generated at the time of forming. The "liquidus viscosity" as used herein refers to a value measured for a viscosity at a liquidus temperature by a platinum sphere pull up method. The "liquidus temperature" refers to a temperature obtained as described below. Glass powder which has passed through a standard 30-mesh sieve (500 μm) and remained on a 50-mesh sieve (300 μm) is loaded into a platinum boat, and the platinum boat is kept for 24 hours in a temperature gradient furnace and is then taken out of the furnace. At this time, a highest temperature at which devitrification (devitrified stones) is observed with a microscope in glass is measured.

A Young's modulus is preferably 63 GPa or more, 65 GPa or more, 68 GPa or more, 70 GPa or more, 74 GPa or more, from 75 GPa to 100 GPa, or from 80 GPa to 95 GPa, particularly preferably from 85 GPa to 90 GPa. When the Young's modulus is low, the support glass substrate is liable to be broken. In addition, the support glass substrate is liable to be deflected in the case of having a small sheet thickness.

A fracture toughness $K_{1C}$ is preferably 0.80 MPa·m$^{0.5}$ or more, 0.81 MPa·m$^{0.5}$ or more, 0.82 MPa·m$^{0.5}$ or more, 0.83 MPa·m$^{0.5}$ or more, or 0.84 MPa·m$^{0.5}$ or more, particularly preferably 0.85 MPa·m$^{0.5}$ or more. When the fracture toughness $K_{1C}$ is low, the support glass substrate is liable to be broken.

The mass loss of the support glass substrate of the present invention per unit surface area when the support glass substrate is immersed in a 5 mass % HCl aqueous solution warmed to 80° C. for 24 hours is preferably 100.0 mg/cm$^2$ or less, 90 mg/cm$^2$ or less, 80 mg/cm$^2$ or less, 70 mg/cm$^2$ or less, 60 mg/cm$^2$ or less, 50 mg/cm$^2$ or less, 40 mg/cm$^2$ or less, or 30 mg/cm$^2$ or less, particularly preferably 20 mg/cm$^2$ or less. The support glass substrate may be brought into contact with an acid chemical in a manufacturing process for a semiconductor package, and preferably has high acid resistance from the viewpoint of preventing a process failure.

The mass loss per unit surface area when the support glass substrate is immersed in a 5 mass % NaOH aqueous solution warmed to 80° C. for 6 hours is preferably 5.0 mg/cm$^2$ or less, 4.9 mg/cm$^2$ or less, 4.8 mg/cm$^2$ or less, 4.7 mg/cm$^2$ or less, 4.6 mg/cm$^2$ or less, 4.5 mg/cm$^2$ or less, 4.0 mg/cm$^2$ or less, or 3.0 mg/cm$^2$ or less, particularly preferably 2.0 mg/cm$^2$ or less. The support glass substrate is often washed and recycled in a manufacturing process for a semiconductor package. In this case, the support glass substrate may be brought into contact with an alkaline chemical or detergent, and is required to have high alkali resistance.

The support glass substrate of the present invention preferably has the following shape.

The support glass substrate of the present invention preferably has a wafer shape or a substantially disc shape, and the diameter thereof is preferably 100 mm or more and 500 mm or less, particularly preferably 150 mm or more and 450 mm or less. With this configuration, the support glass substrate is easily applied to a manufacturing process for a fan-out type WLP. As required, the support glass substrate may be processed into any other shape, for example, a rectangular shape.

The support glass substrate of the present invention also preferably has a substantially rectangular shape, and the dimensions thereof are preferably −200 mm or more or from □220 mm to −750 mm, particularly preferably from □250 mm to −500 mm. With this configuration, the support glass substrate is easily applied to a manufacturing process for a fan-out type panel level package (PLP). As required, the support glass substrate may be processed into any other shape, for example, a triangular shape or a trapezoidal shape.

A sheet thickness is preferably less than 2.0 mm, 1.5 mm or less, 1.2 mm or less, 1.1 mm or less, or 1.0 mm or less, particularly preferably 0.9 mm or less. As the sheet thickness becomes smaller, the mass of a laminated substrate is reduced, and hence a handling property is improved. Meanwhile, when the sheet thickness is excessively small, the strength of the support glass substrate itself decreases, and hence the support glass substrate does not easily function as a supporting substrate. Accordingly, the sheet thickness is preferably 0.1 mm or more, 0.2 mm or more, 0.3 mm or more, 0.4 mm or more, 0.5 mm or more, or 0.6 mm or more, particularly preferably more than 0.7 mm.

A total thickness variation (TTV) is preferably 5 μm or less, 4 μm or less, 3 μm or less, 2 μm or less, or 1 μm or less, particularly preferably from 0.1 μm to less than 1 μm. In addition, an arithmetic average roughness Ra is preferably 20 nm or less, 10 nm or less, 5 nm or less, 2 nm or less, or 1 nm or less, particularly preferably 0.5 nm or less. As surface accuracy becomes higher, the accuracy of processing treatment is increased more easily. In particular, wiring accuracy can be increased, and hence high-density wiring can be performed. In addition, the strength of the support glass substrate is increased, with the result that the support glass substrate and a laminated substrate are less liable to be broken. Further, the number of times of reuse of the support glass substrate can be increased. The "arithmetic average roughness Ra" may be measured with a stylus-type surface roughness meter or an atomic force microscope (AFM).

A warpage level is preferably 60 μm or less, 55 μm or less, 50 μm or less, or from 1 μm to 45 μm, particularly preferably from 5 μm to 40 μm. As the warpage level becomes smaller, the accuracy of processing treatment is increased more easily. In particular, wiring accuracy can be increased, and hence high-density wiring can be performed.

When the support glass substrate has a wafer shape or a substantially disc shape, the circularity thereof is preferably 1 mm or less, 0.1 mm or less, or 0.05 mm or less, particularly preferably 0.03 mm or less. As the circularity becomes smaller, the support glass substrate is applied to a manufacturing process for a fan-out type WLP more easily. The "circularity" refers to a value obtained by subtracting a minimum outside diameter value from a maximum outside diameter value except for a notch structure.

The support glass substrate of the present invention preferably comprises a positioning portion. The positioning portion preferably has any one of a notch structure, a chamfer structure, and a cutout structure, and particularly preferably has a notch structure. The notch structure more preferably has, in a deep portion thereof, a substantially circular shape or a substantially V-groove shape in plan view. This facilitates the position fixation of the support glass substrate by bringing a positioning member such as a positioning pin into abutment with the notch structure of the support glass substrate. As a result, this facilitates position alignment between the support glass substrate and the substrate to be processed. Particularly when a notch structure is also formed in the substrate to be processed, and the positioning member is brought into abutment with the notch structure, the position alignment is facilitated in the entire laminated substrate. Cracks are liable to occur in the notch structure owing to abutment with the positioning member, but the support glass substrate of the present invention, which has high strength, is particularly effective in the case of having a notch structure.

When the positioning member is brought into abutment with the notch structure of the support glass substrate, a stress is liable to be concentrated in the notch structure, and the support glass substrate is liable to be broken from the notch structure. In particular, the tendency becomes remarkable when the support glass substrate is curved by external force. Accordingly, in the support glass substrate of the present invention, an end edge region in which a surface and an end surface of the notch structure intersect with each other is preferably entirely or partially chamfered. With this configuration, the breakage from the notch structure can be effectively avoided.

In the support glass substrate of the present invention having a wafer shape or a substantially disc shape, the end edge region in which a surface and an end surface of the notch structure intersect with each other is entirely or partially chamfered. It is preferred that 50% or more of the end edge region in which a surface and an end surface of the notch structure intersect with each other be chamfered. It is more preferred that 90% or more of the end edge region in which a surface and an end surface of the notch structure intersect with each other be chamfered. It is still more preferred that the entirety of the end edge region in which a surface and an end surface of the notch structure intersect with each other be chamfered. As a larger region of the notch structure is chamfered, the breakage probability of the support glass substrate from the notch structure can be reduced.

The chamfer width of the notch structure in a surface direction is preferably from 50 μm to 900 μm, from 200 μm to 800 μm, from 300 μm to 700 μm, or from 400 μm to 650 μm, particularly preferably from 500 μm to 600 μm. When the chamfer width of the notch structure in the surface direction is too small, the support glass substrate is liable to be broken from the notch structure. Meanwhile, when the chamfer width of the notch structure in the surface direction is too large, chamfering efficiency is reduced, and the manufacturing cost of the support glass substrate is liable to rise.

The chamfer width of the notch structure in a sheet thickness direction is preferably from 5% to 80%, from 20% to 75%, from 30% to 70%, or from 35% to 65%, particularly preferably from 40% to 60% of the sheet thickness. When the chamfer width of the notch structure in the sheet thickness direction is too small, the support glass substrate is liable to be broken from the notch structure. Meanwhile, when the chamfer width of the notch structure in the sheet thickness direction is too large, external force is liable to be concentrated in the end surface of the notch structure, with the result that the support glass substrate is liable to be broken from the end surface of the notch structure.

When the support glass substrate has a substantially rectangular shape, the support glass substrate has a corner angle of preferably from 89.0° to 91.0°, from 89.1° to 90.9°, from 89.2° to 90.8°, from 89.3° to 90.7°, or from 89.4° to 90.6°, particularly preferably from 89.5° to 90.5° when seen from above, that is, in plan view. As the corner angle is closer to 90°, the positioning of the support glass substrate can be performed more accurately at the time of conveyance.

The support glass substrate of the present invention preferably comprises, on the surface thereof, an information identification part comprising dots as a constituent unit. The information identification part comprises one or more kinds of elements selected from a letter, a symbol, a two-dimensional code, and a figure, and the element is formed of a plurality of dots. The information identification part preferably comprises at least one piece of information selected from the dimensions, linear thermal expansion coefficient, lot, total thickness variation (TTV), manufacturer, distributor, and material code of the support glass substrate. The "dimensions" include the thickness dimension and outer diameter dimension of the support glass substrate, the dimensions of the notch structure, and the like.

The outer diameter dimension of the dot is preferably from 0.05 mm to 0.20 mm or from 0.07 mm to 0.13 mm or less, particularly preferably from 0.09 mm to 0.11 mm. When the outer diameter dimension of the dot is too small, the viewability of the information identification part is liable to be reduced. Meanwhile, when the outer diameter dimension of the dot is too large, the strength of the support glass substrate is not easily ensured.

The dots adjacent to each other have a distance between centers of preferably from 0.06 mm to 0.25 mm. When the dots adjacent to each other have an excessively small distance between centers, the strength of the support glass substrate is not easily ensured. Meanwhile, when the dots adjacent to each other have an excessively large distance between centers, the viewability of the information identification part is liable to be reduced.

It is preferred that the information identification part comprise dots as a constituent unit, and the dots each have an annular groove shape. When the dots each have an annular groove shape, a region enclosed by the annular groove (an inside region with respect to the groove) remains without being removed by a laser, and hence a reduction in strength of a region in which the information identification part is formed can be prevented to the extent possible. In addition, in the case of the annular groove, the viewability is not significantly reduced even when the width dimension of the groove is reduced as long as the outer diameter dimension thereof is not changed. Thus, when the width dimension of the groove is reduced without changing the outer diameter dimension thereof, the inside region with respect to the groove can be enlarged accordingly, with the result that, while the viewability is ensured, required strength can be maintained.

The depth dimension of the groove forming the dot is preferably from 2 μm to 30 μm. When the depth dimension of the groove is too small, the viewability of the information identification part is liable to be reduced. Meanwhile, when the depth dimension of the groove is too large, the strength of the support glass substrate is not easily ensured.

The information identification part may be formed by various methods, but the information identification part is preferably formed by radiating a pulse laser to abrade glass in the irradiated region, that is, the information identification part is preferably formed by laser abrasion. With this configuration, abrasion can be performed without accumulating excessive heat in the glass in the irradiated region. As a result, not only the length of a crack in a thickness direction but also the length of a crack extending from the dot in a surface direction can be reduced.

The support glass substrate of the present invention is preferably manufactured by blending and mixing glass raw materials to produce a glass batch, and loading the glass batch into a glass melting furnace, followed by fining and stirring the resultant molten glass, and supplying the molten glass to a forming device to form the glass into a sheet shape.

The support glass substrate of the present invention preferably has overflow-merged surfaces in a middle portion thereof in a sheet thickness direction. In the overflow down-draw method, surfaces that are to serve as the surfaces of the support glass substrate are formed in a state of free surfaces without being brought into contact with trough-shaped refractory. Accordingly, with slight polishing, the total thickness variation can be reduced to less than 2.0 μm, particularly to less than 1.0 μm. As a result, the manufacturing cost of the support glass substrate can be reduced.

It is preferred that the surface of the support glass substrate of the present invention be polished after its formation by the overflow down-draw method. With this configuration, the total thickness variation can be easily controlled to less than 2.0 μm, 1.5 μm or less, or 1.0 μm or less, particularly from 0.1 μm to less than 1.0 μm.

The support glass substrate of the present invention preferably has a compressive stress layer in a glass surface thereof, and more preferably has a compressive stress layer through ion exchange. When the compressive stress layer is formed in the glass surface, the breakage probability of the support glass substrate can be reduced at the time of dropping of a laminated substrate onto the ground.

In the support glass substrate of the present invention, the compressive stress layer has a compressive stress value on the outermost surface of preferably from 165 MPa to 1,000 MPa, 200 MPa or more, 220 MPa or more, 250 MPa or more, 280 MPa or more, 300 MPa or more, or 310 MPa or more, particularly preferably 320 MPa or more. When the compressive stress value of the compressive stress layer on the outermost surface becomes higher, the Vickers hardness is increased more. Meanwhile, when an excessively large compressive stress is formed in the surface, an internal tensile stress of the support glass substrate is increased excessively, and there is a risk in that a dimensional change before and after ion exchange treatment may be increased. Accordingly, the compressive stress value of the compressive stress layer on the outermost surface is preferably 1,000 MPa or less, 900 MPa or less, 700 MPa or less, 680 MPa or less, or 650 MPa or less, particularly preferably 600 MPa or less. There is a tendency that the compressive stress value of the compressive stress layer on the outermost surface is increased when an ion exchange time period is shortened, or the temperature of an ion exchange solution is reduced.

The compressive stress layer has a depth of layer of preferably from 50 μm to 200 μm, 50 μm or more, 60 μm or more, 80 μm or more, or 100 μm or more, particularly preferably 120 μm or more. As the depth of layer becomes larger, protrusions on the ground are less liable to reach the tensile stress layer of the support glass substrate at the time of dropping of the laminated substrate, and thus the breakage probability of the support glass substrate can be reduced more. Meanwhile, when the depth of layer is too large, there is a risk in that a dimensional change before and after the ion exchange treatment may be increased. Further, there is a tendency that the compressive stress value of the compressive stress layer on the outermost surface is reduced. Accordingly, the depth of layer is preferably 200 μm or less, 180 μm or less, or 150 μm or less, particularly preferably 140 μm or less. There is a tendency that the depth of layer is increased when the ion exchange time period is prolonged, or the temperature of the ion exchange solution is increased.

The ion exchange treatment is preferably performed a plurality of times. As the ion exchange treatment performed a plurality of times, it is preferred to perform ion exchange treatment in which the support glass substrate is immersed in a molten salt containing a $KNO_3$ molten salt, and then perform ion exchange treatment in which the support glass substrate is immersed in a molten salt containing a $NaNO_3$ molten salt. With this configuration, while a large depth of layer is ensured, the compressive stress value of the compressive stress layer on the outermost surface can be increased.

Figure 4:
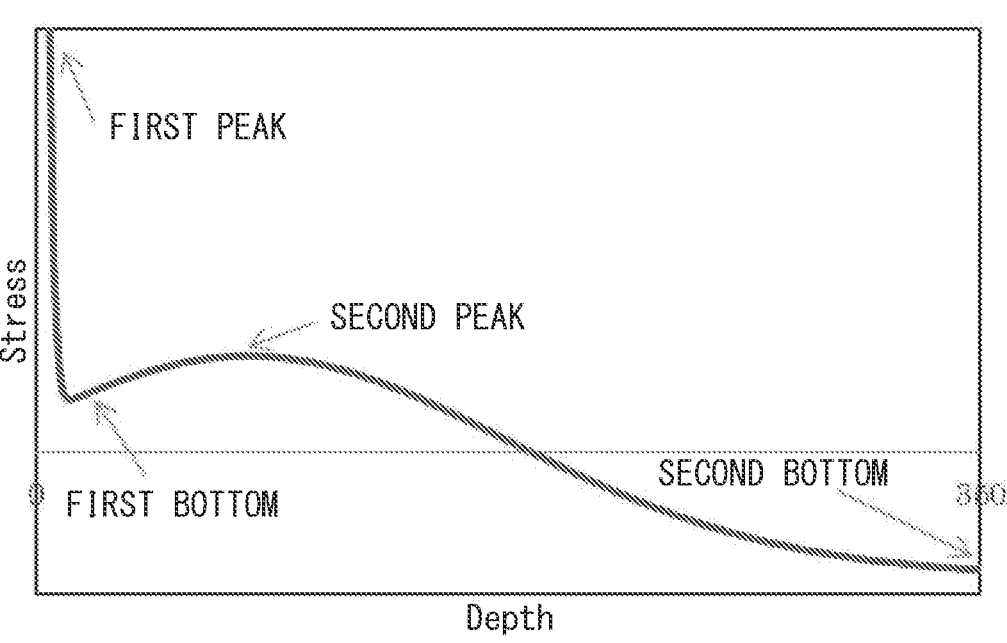
FIG. 4 is an explanatory view for illustrating an example of a stress profile having a first peak, a second peak, a first bottom, and a second bottom.
Figure 5:
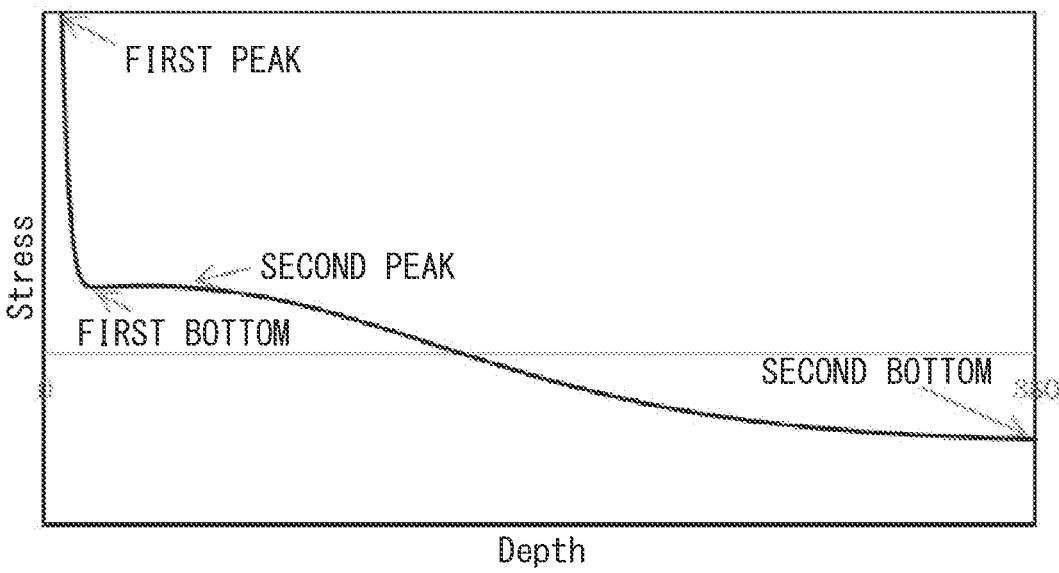
FIG. 5 is another explanatory view for illustrating an example of a stress profile having a first peak, a second peak, a first bottom, and a second bottom.

In particular, it is preferred to perform ion exchange treatment (first ion exchange step) in which the support glass substrate is immersed in a $NaNO_3$ molten salt or a mixed molten salt of $NaNO_3$ and $KNO_3$, and then perform ion exchange treatment (second ion exchange step) in which the support glass substrate is immersed in a mixed molten salt of $KNO_3$ and $LiNO_3$. With this configuration, a non-monotonic stress profile illustrated in each of FIG. 4 and FIG. 5, that is, a stress profile having at least a first peak, a second peak, a first bottom, and a second bottom can be formed. As a result, the breakage probability of the support glass substrate can be significantly reduced at the time of dropping of the laminated substrate.

In the first ion exchange step, a Li ion in the glass and a Na ion in the molten salt are ion-exchanged with each other, and in the case of using the mixed molten salt of $NaNO_3$ and $KNO_3$, a Na ion in the glass and a K ion in the molten salt are further ion-exchanged with each other. Herein, the ion exchange between a Li ion in the glass and a Na ion in the molten salt is faster and more efficient than the ion exchange between a Na ion in the glass and a K ion in the molten salt. In the second ion exchange step, a Na ion in the vicinity of the glass surface (a shallow region from the outermost surface to a sheet thickness of 20%) and a Li ion in the molten salt are ion-exchanged with each other, and besides, a Na ion in the vicinity of the glass surface (the shallow region from the outermost surface to a sheet thickness of 20%) and a K ion in the molten salt are ion-exchanged with each other. That is, in the second ion exchange step, while a Na ion in the vicinity of the glass surface is released, a K ion, which has a large ionic radius, can be introduced. As a result, while a large depth of layer is maintained, the compressive stress value of the compressive stress layer on the outermost surface can be increased.

In the first ion exchange step, the temperature of the molten salt is preferably from 360° C. to 400° C., and the ion exchange time period is preferably from 30 minutes to 6 hours. In the second ion exchange step, the temperature of the ion exchange solution is preferably from 370° C. to 400° C., and the ion exchange time period is preferably from 15 minutes to 3 hours.

In order to form the non-monotonic stress profile, it is preferred that the concentration of $NaNO_3$ be higher than the concentration of $KNO_3$ in the mixed molten salt of $NaNO_3$ and $KNO_3$ to be used in the first ion exchange step, and that the concentration of $KNO_3$ be higher than the concentration of $LiNO_3$ in the mixed molten salt of $KNO_3$ and $LiNO_3$ to be used in the second ion exchange step.

In the mixed molten salt of $NaNO_3$ and $KNO_3$ to be used in the first ion exchange step, the concentration of $KNO_3$ is preferably 0 mass % or more, 0.5 mass % or more, 1 mass % or more, 5 mass % or more, 7 mass % or more, 10 mass % or more, or 15 mass % or more, particularly preferably from 20 mass % to 90 mass %. When the concentration of $KNO_3$ is too high, there is a risk in that the compressive stress value obtained through ion exchange between a Li ion in the glass and a Na ion in the molten salt may be excessively reduced. In addition, when the concentration of $KNO_3$ is too low, there is a risk in that the measurement of a stress with a surface stress meter FSM-6000 may become difficult.

In the mixed molten salt of $KNO_3$ and $LiNO_3$ to be used in the second ion exchange step, the concentration of $LiNO_3$ is preferably from more than 0 mass % to 5 mass %, from more than 0 mass % to 3 mass %, or from more than 0 mass % to 2 mass %, particularly preferably from 0.1 mass % to 1 mass %. When the concentration of $LiNO_3$ is too low, it becomes difficult to release a Na ion in the vicinity of the glass surface. Meanwhile, when the concentration of $LiNO_3$ is too high, there is a risk in that the compressive stress value obtained through ion exchange between a Na ion in the vicinity of the glass surface and a K ion in the molten salt may be excessively reduced.

A laminated substrate of the present invention comprises at least a substrate to be processed and a support glass substrate for supporting the substrate to be processed, wherein the support glass substrate is the above-mentioned support glass substrate. The laminated substrate of the present invention preferably comprises an adhesive layer between the substrate to be processed and the support glass substrate. The adhesive layer is preferably formed of a resin, and for example, a thermosetting resin, a photocurable resin (in particular, a UV-curable resin), and the like are preferred. In addition, the adhesive layer preferably has heat resistance that withstands the heat treatment in the manufacturing process for a fan-out type WLP. With this configuration, the adhesive layer is less liable to be melted in the manufacturing process for a fan-out type WLP, and the accuracy of the processing treatment can be enhanced. A UV-curable tape may also be used as the adhesive layer in order to fix the substrate to be processed and the support glass substrate easily.

The laminated substrate of the present invention preferably further comprises a peeling layer between the substrate to be processed and the support glass substrate, more specifically between the substrate to be processed and the adhesive layer, or preferably further comprises a peeling layer between the support glass substrate and the adhesive layer. With this configuration, after the substrate to be processed is subjected to predetermined processing treatment, the substrate to be processed is easily peeled from the support glass substrate. From the viewpoint of productivity, it is preferred that the substrate to be processed be peeled from the support glass substrate through use of irradiation light such as laser light. An infrared laser light source, such as a YAG laser (wavelength of 1,064 nm) or a semiconductor laser (wavelength of from 780 nm to 1,300 nm), may be used as a laser light source. In addition, a resin degradable by infrared laser irradiation may be used for the peeling layer. In addition, a substance that absorbs infrared light efficiently and converts the light into heat may also be added to the resin. For example, carbon black, graphite powder, metal powder fine particles, a dye, a pigment, and the like may also be added to the resin.

The peeling layer is formed of a material in which "in-layer peeling" or "interfacial peeling" occurs through use of irradiation light such as laser light. That is, the peeling layer is formed of a material in which the interatomic or intermolecular binding force between atoms or molecules is lost or reduced to cause ablation or the like, to thereby cause peeling, through irradiation with light having predetermined intensity. There are the case in which components contained in the peeling layer turn into a gas to be released, to thereby cause separation, through irradiation with irradiation light, and the case in which the peeling layer absorbs light to turn into a gas and the vapor thereof is released, to thereby cause separation.

In the laminated substrate of the present invention, it is preferred that the support glass substrate be larger than the substrate to be processed. With this configuration, even when the center positions of the substrate to be processed and the support glass substrate are slightly separated from each other at a time when the substrate to be processed is supported, an edge portion of the substrate to be processed is less liable to protrude from the support glass substrate.

A method of manufacturing a semiconductor package of the present invention comprises the steps of: preparing a laminated substrate comprising at least a substrate to be processed and a support glass substrate for supporting the substrate to be processed; and subjecting the substrate to be processed to processing treatment, wherein the support glass substrate is the above-mentioned support glass substrate.

It is preferred that the method of manufacturing a semiconductor package of the present invention further comprise a step of conveying the laminated substrate. With this configuration, the treatment efficiency of the processing treatment can be enhanced. The "step of conveying the laminated substrate" and the "step of subjecting the substrate to be processed to processing treatment" are not required to be performed separately, and may be performed simultaneously.

In the method of manufacturing a semiconductor package of the present invention, it is preferred that the processing treatment be treatment involving arranging wiring on one surface of the substrate to be processed or treatment involving forming solder bumps on one surface of the substrate to be processed. In the method of manufacturing a semiconductor package of the present invention, during the treatment, a dimensional change is less liable to occur in the substrate to be processed, and hence those steps can be performed properly.

Besides the foregoing, the processing treatment may be any of treatment involving mechanically polishing one surface (in general, the surface on an opposite side to the support glass substrate) of the substrate to be processed, treatment involving subjecting one surface (in general, the surface on an opposite side to the support glass substrate) of the substrate to be processed to dry etching, and treatment involving subjecting one surface (in general, the surface on an opposite side to the support glass substrate) of the substrate to be processed to wet etching. In the method of manufacturing a semiconductor package of the present invention, warpage is less liable to occur in the substrate to be processed, and the stiffness of the laminated substrate can be maintained. As a result, the processing treatment can be performed properly.

The present invention is further described with reference to the drawings.

FIG. 1 is a conceptual perspective view for illustrating an example of a laminated substrate 1 of the present invention. In FIG. 1, the laminated substrate 1 comprises a support glass substrate 10 and a substrate 11 to be processed. The support glass substrate 10 is bonded onto the substrate 11 to be processed so as to prevent a dimensional change of the substrate 11 to be processed. In addition, the support glass substrate 10 comprises lithium aluminosilicate-based glass, has a content of $Li_2O$ of from 0.02 mol % to 25 mol % in a glass composition, and has an average linear thermal expansion coefficient within a temperature range of from 30° C. to 380° C. of $45 \times 10^{-7}/°$ C. or more and $160 \times 10^{-7}/°$ C. or less. In addition, a peeling layer 12 and an adhesive layer 13 are arranged between the support glass substrate 10 and the substrate 11 to be processed. The peeling layer 12 is held in contact with the support glass substrate 10, and the adhesive layer 13 is held in contact with the substrate 11 to be processed.

As is understood from FIG. 1, the laminated substrate 1 comprises the support glass substrate 10, the peeling layer 12, the adhesive layer 13, and the substrate 11 to be processed, which are laminated and arranged in the stated order. The shape of the support glass substrate 10 is determined depending on the substrate 11 to be processed, and in FIG. 1, both the support glass substrate 10 and the substrate 11 to be processed have a wafer shape. In addition to amorphous silicon (a-Si), for example, silicon oxide, a silicate compound, silicon nitride, aluminum nitride, or titanium nitride may be used for the peeling layer 12. The peeling layer 12 is formed by plasma CVD, spin coating using a sol-gel method, or the like. The adhesive layer 13 is made of a resin and is formed through application, for example, by any of various printing methods, an ink jet method, a spin coating method, a roll coating method, or the like. The adhesive layer 13 is removed by being dissolved in a solvent or the like after the support glass substrate 10 is peeled from the substrate 11 to be processed through use of the peeling layer 12.

FIG. 2 are conceptual sectional views for illustrating a manufacturing process for a fan-out type WLP. FIG. 2(a) is an illustration of a state in which an adhesive layer 21 is formed on one surface of a supporting member 20. As required, a peeling layer may be formed between the supporting member 20 and the adhesive layer 21. Next, as illustrated in FIG. 2(b), a plurality of semiconductor chips 22 are bonded onto the adhesive layer 21. In this case, an active surface of each semiconductor chip 22 is brought into contact with the adhesive layer 21. Then, as illustrated in FIG. 2(c), the semiconductor chips 22 are molded with a sealing material 23 of a resin. As the sealing material 23, a material having less dimensional change after compression molding and having less dimensional change during formation of wiring is used. Subsequently, as illustrated in FIG. 2(d) and FIG. 2(e), a substrate 24 to be processed having the semiconductor chips 22 molded therein is separated from the supporting member 20 and is then adhesively fixed onto a support glass substrate 26 via an adhesive layer 25. In this case, in the surface of the substrate 24 to be processed, the surface on an opposite side to the surface in which the semiconductor chips 22 are buried is arranged on the support glass substrate 26 side. Thus, a laminated substrate 27 can be obtained. As required, a peeling layer may be formed between the adhesive layer 25 and the support glass substrate 26. Further, after the obtained laminated substrate 27 is conveyed, as illustrated in FIG. 2(f), a wiring 28 is formed on the surface of the substrate 24 to be processed in which the semiconductor chips 22 are buried, and then a plurality of solder bumps 29 are formed. Finally, after the substrate 24 to be processed is separated from the support glass substrate 26, the substrate 24 to be processed is cut for each semiconductor chip 22 to be used in a later packaging step (FIG. 2(g)).

FIG. 3 are conceptual sectional views for illustrating a step of thinning the substrate to be processed through use of the support glass substrate as a backgrind substrate. FIG. 3(a) is an illustration of a laminated substrate 30. The laminated substrate 30 comprises a support glass substrate 31, a peeling layer 32, an adhesive layer 33, and a substrate 34 to be processed (silicon wafer), which are laminated and arranged in the stated order. A plurality of semiconductor chips 35 are formed by a photolithography method or the like on the surface of the substrate to be processed brought into contact with the adhesive layer 33. FIG. 3(b) is an illustration of a step of thinning the substrate 34 to be processed with a polishing device 36. Through this step, the substrate 34 to be processed is mechanically polished to be thinned to, for example, several tens of micrometers. FIG. 3(c) is an illustration of a step of irradiating the peeling layer 32 with UV light 37 through the support glass substrate 31. After the performance of this step, the support glass substrate 31 can be separated as illustrated in FIG. 3(d). The support glass substrate 31 having been separated is reused as required. FIG. 3(e) is an illustration of a step of removing the adhesive layer 33 from the substrate 34 to be processed. After the performance of this step, the substrate 34 to be processed having been thinned can be collected.

A glass substrate of the present invention comprises as a glass composition, in terms of mol %, 50% to 65% of $SiO_2$, 8% to 25% of $Al_2O_3$, 0% to 10% of $B_2O_3$, 5.1% to 20% of $Li_2O$, more than 10% to 16.1% of $Na_2O$, 0% to 15% of $K_2O$, 0.01% to 3% of MgO, 0% to 10% of CaO, and 0.01% to 10% of $ZrO_2$, and has a Young's modulus of 80 GPa or more. In addition, a glass substrate of the present invention comprises as a glass composition, in terms of mol %, 50% to 65% of $SiO_2$, 8% to 18% of $Al_2O_3$, 0% to 10% of $B_2O_3$, 20% to 25% of $Li_2O$, 0.01% to 10% of $Na_2O$, 0% to 15% of $K_2O$, 0% to 10% of MgO, 0.01% to 10% of CaO, and 0% to 10% of $ZrO_2$, has a Young's modulus of 85 GPa or more, and has a fracture toughness $K_{1C}$ of 0.80 MPa·m$^{0.5}$ or more. The technical features of the glass substrate of the present invention have already been described in the description section of the support glass substrate of the present invention, and hence detailed description thereof is omitted here.

A glass substrate of the present invention comprises as a glass composition, in terms of mol %, 64% to 76% of $SiO_2$, 4% to 15% of $Al_2O_3$, 4% to 16% of $B_2O_3$, 0.1% to 14% of $Li_2O$, 0.01% to 14% of $Na_2O$, 0% to 15% of $K_2O$, 0% to 7% of MgO, 0% to 7% of CaO, 0% to 7% of SrO, 0% to 7% of BaO, and 0% to 10% of $ZrO_2$, has a Young's modulus of 60 GPa or more, and has an average linear thermal expansion coefficient within a temperature range of from 30° C. to 380° C. of $38 \times 10^{-7}/°$ C. or more and $85 \times 10^{-7}/°$ C. or less. In addition, a glass substrate of the present invention comprises as a glass composition, in terms of mol %, 64% to 76% of $SiO_2$, 4% to 15% of $Al_2O_3$, 4% to 16% of $B_2O_3$, 0.1% to 14% of $Li_2O$, 0.01% to 14% of $Na_2O$, 0% to 15% of $K_2O$, 0.01% to 7% of MgO, 0.01% to 7% of CaO, 0% to 7% of SrO, 0% to 7% of BaO, and 0% to 10% of $ZrO_2$, having a Young's modulus of 60 GPa or more, and having an average linear thermal expansion coefficient within a temperature range of from 30° C. to 380° C. of $38\times10^{-7}$/° C. or more and $85\times10^{-7}$/° C. or less. In addition, a glass substrate of the present invention comprises as a glass composition, in terms of mol %, 64% to 76% of $SiO_2$, 4% to 15% of $Al_2O_3$, 4% to 16% of $B_2O_3$, 0.1% to 14% of $Li_2O$, 0.01% to 14% of $Na_2O$, 0% to 15% of $K_2O$, 0% to 7% of MgO, 0% to 7% of CaO, 0.01% to 7% of SrO, 0% to 7% of BaO, and 0% to 10% of $ZrO_2$, has a Young's modulus of 60 GPa or more, and has an average linear thermal expansion coefficient within a temperature range of from 30° C. to 380° C. of $38\times10^{-7}$/° C. or more and $85\times10^{-7}$/° C. or less. In addition, a glass substrate of the present invention comprises as a glass composition, in terms of mol %, 64% to 76% of $SiO_2$, 4% to 15% of $Al_2O_3$, 4% to 16% of $B_2O_3$, 0.1% to 14% of $Li_2O$, 0.01% to 14% of $Na_2O$, 0% to 15% of $K_2O$, 0.01% to 7% of MgO, 0.01% to 7% of CaO, 0.01% to 7% of SrO, 0% to 7% of BaO, and 0% to 10% of $ZrO_2$, has a Young's modulus of 60 GPa or more, and has an average linear thermal expansion coefficient within a temperature range of from 30° C. to 380° C. of $38\times10^{-7}$/° C. or more and $85\times10^{-7}$/° C. or less. In addition, a glass substrate of the present invention comprises as a glass composition, in terms of mol %, 64% to 76% of $SiO_2$, 4% to 15% of $Al_2O_3$, 4% to 16% of $B_2O_3$, 1.5% to 8.5% of $Li_2O$, 0.01% to 14% of $Na_2O$, 0% to 15% of $K_2O$, 0.01% to 7% of MgO, 0.01% to 7% of CaO, 0.01% to 7% of SrO, 0% to 7% of BaO, and 0% to 10% of $ZrO_2$, has a Young's modulus of 60 GPa or more, and has an average linear thermal expansion coefficient within a temperature range of from 30° C. to 380° C. of $38\times10^{-7}$/° C. or more and $85\times10^{-7}$/° C. or less. The technical features of the glass substrate of the present invention have already been described in the description section of the support glass substrate of the present invention, and hence detailed description thereof is omitted here.

Example 1

Now, the present invention is described by way of Examples. However, Examples below are merely examples, and the present invention is by no means limited to the following Examples.

The glass compositions and glass characteristics of Examples (Sample Nos. 1 to 361) of the present invention are shown in Tables 1 to 36. In the tables, the "N.A." means "unmeasured", the "Li/(Na+K)" means the molar ratio $[Li_2O]/([Na_2O]+[K_2O])$, the "Li+Na+K" means the molar ratio $[Li_2O]+[Na_2O]+[K_2O]$, the "Li/P" means the molar ratio $[Li_2O]/[P_2O_5]$, the "(Na—Li)/(Al+B+P)" means the molar ratio $([Na_2O]-[Li_2O])/([Al_2O_3]+[B_2O_3]+[P_2O_5])$, the "(B+Na—P)/(Al+Li)" means the molar ratio $([B_2O_3]+[Na_2O]-[P_2O_5])/([Al_2O_3]+[Li_2O])$, and the "Si+1.2P-3Al-2Li-1.5Na—K—B" means the $[SiO_2]+1.2\times[P_2O_5]-3\times[Al_2O_3]-2\times[Li_2O]-1.5\times[Na_2O]-[K_2O]-[B_2O_3]$. In addition, a value in parentheses is a calculation value estimated from the glass composition.

TABLE 1

| (mol %) | No. 1 | No. 2 | No. 3 | No. 4 | No. 5 | No. 6 | No. 7 | No. 8 | No. 9 | No. 10 |
|---|---|---|---|---|---|---|---|---|---|---|
| $SiO_2$ | 59.07 | 59.07 | 60.07 | 61.07 | 61.07 | 61.07 | 61.07 | 61.07 | 61.07 | 61.07 |
| $Al_2O_3$ | 17.81 | 15.81 | 17.81 | 18.81 | 17.81 | 16.81 | 16.81 | 15.81 | 15.81 | 17.81 |
| $B_2O_3$ | 0.00 | 0.00 | 0.00 | 0.00 | 0.00 | 0.00 | 0.00 | 0.00 | 0.00 | 0.00 |
| $Li_2O$ | 8.34 | 8.34 | 8.34 | 7.34 | 7.34 | 8.34 | 7.34 | 7.34 | 8.34 | 8.34 |
| $Na_2O$ | 11.10 | 13.10 | 10.10 | 9.10 | 10.10 | 10.10 | 11.10 | 12.10 | 11.10 | 9.10 |
| $K_2O$ | 0.00 | 0.00 | 0.00 | 0.00 | 0.00 | 0.00 | 0.00 | 0.00 | 0.00 | 0.00 |
| MgO | 0.00 | 0.00 | 0.00 | 0.00 | 0.00 | 0.00 | 0.00 | 0.00 | 0.00 | 0.00 |
| CaO | 0.00 | 0.00 | 0.00 | 0.00 | 0.00 | 0.00 | 0.00 | 0.00 | 0.00 | 0.00 |
| SrO | 0.00 | 0.00 | 0.00 | 0.00 | 0.00 | 0.00 | 0.00 | 0.00 | 0.00 | 0.00 |
| BaO | 0.00 | 0.00 | 0.00 | 0.00 | 0.00 | 0.00 | 0.00 | 0.00 | 0.00 | 0.00 |
| $ZrO_2$ | 0.00 | 0.00 | 0.00 | 0.00 | 0.00 | 0.00 | 0.00 | 0.00 | 0.00 | 0.00 |
| $Y_2O_3$ | 0.00 | 0.00 | 0.00 | 0.00 | 0.00 | 0.00 | 0.00 | 0.00 | 0.00 | 0.00 |
| ZnO | 1.16 | 1.16 | 1.16 | 1.16 | 1.16 | 1.16 | 1.16 | 1.16 | 1.16 | 1.16 |
| $P_2O_5$ | 2.47 | 2.47 | 2.47 | 2.47 | 2.47 | 2.47 | 2.47 | 2.47 | 2.47 | 2.47 |
| $SnO_2$ | 0.04 | 0.04 | 0.04 | 0.04 | 0.04 | 0.04 | 0.04 | 0.04 | 0.04 | 0.04 |
| $Fe_2O_3$ | 0.00 | 0.00 | 0.00 | 0.00 | 0.00 | 0.00 | 0.00 | 0.00 | 0.00 | 0.00 |
| $TiO_2$ | 0.00 | 0.00 | 0.00 | 0.00 | 0.00 | 0.00 | 0.00 | 0.00 | 0.00 | 0.00 |
| Cl | 0.00 | 0.00 | 0.00 | 0.00 | 0.00 | 0.00 | 0.00 | 0.00 | 0.00 | 0.00 |
| Li/(Na + K) | 0.75 | 0.64 | 0.83 | 0.81 | 0.73 | 0.83 | 0.66 | 0.61 | 0.75 | 0.92 |
| (Na + K)/Li | 1.33 | 1.57 | 1.21 | 1.24 | 1.38 | 1.21 | 1.51 | 1.65 | 1.33 | 1.09 |
| Li + Na + K | 19.44 | 21.44 | 18.44 | 16.44 | 17.44 | 18.44 | 18.44 | 19.44 | 19.44 | 17.44 |
| Li/P | 3.38 | 3.38 | 3.38 | 2.97 | 2.97 | 3.38 | 2.97 | 2.97 | 3.38 | 3.38 |
| P/Li | 0.30 | 0.30 | 0.30 | 0.34 | 0.34 | 0.30 | 0.34 | 0.34 | 0.30 | 0.30 |
| (Na – Li)/ (Al + B + P) | 0.14 | 0.26 | 0.09 | 0.08 | 0.14 | 0.09 | 0.19 | 0.26 | 0.15 | 0.04 |
| (B + Na – P)/ (Al + Li) | 0.33 | 0.44 | 0.29 | 0.25 | 0.30 | 0.30 | 0.36 | 0.42 | 0.36 | 0.25 |
| Si + 1.2P – 3Al – 2Li – 1.5Na – K – B | −24.72 | −21.72 | −22.22 | −20.72 | −19.22 | −18.22 | −17.72 | −16.22 | −16.72 | −19.72 |
| ρ (g/cm³) | 2.452 | 2.459 | 2.445 | 2.438 | 2.440 | 2.441 | 2.444 | 2.447 | 2.443 | 2.437 |
| $\alpha_{30-380°\ C.}$ $(\times10^{-7}$/° C.) | 87.3 | 94.6 | 83.6 | 75.0 | 83.0 | 81.0 | 85.0 | 88.5 | 87.9 | 78.0 |
| Ts (° C.) | 856 | N.A. | N.A. | 915 | 889 | 874 | 867 | 861 | 844 | N.A. |
| $10^{2.5}$ dPa · s (° C.) | 1,518 | 1,475 | 1,535 | 1,561 | 1,560 | 1,547 | 1,552 | 1,535 | 1,524 | 1,550 |
| TL (° C.) | 1,049 | 916 | 1,088 | 1,125 | 1,078 | 1,085 | 1,035 | 976 | 1,056> | 1,125 |
| logη at TL (dPa · s) | 5.3 | 6.4 | 3.9 | 5.2 | 5.4 | 5.2 | 5.6 | 6.1 | 5.2< | 4.9 |

TABLE 1-continued

| (mol %) | No. 1 | No. 2 | No. 3 | No. 4 | No. 5 | No. 6 | No. 7 | No. 8 | No. 9 | No. 10 |
|---|---|---|---|---|---|---|---|---|---|---|
| Acid resistance (HCl 5 wt % 80° C. 24 h) | N.A. | N.A. | N.A. | N.A. | N.A. | N.A. | N.A. | N.A. | N.A. | N.A. |
| Alkali resistance (NaOH 5 wt % 80° C. 6 h) | N.A. | N.A. | N.A. | N.A. | N.A. | N.A. | N.A. | N.A. | N.A. | N.A. |
| E (GPa) | N.A. | N.A. | N.A. | N.A. | N.A. | N.A. | N.A. | N.A. | N.A. | N.A. |
| $K_{IC}$ (MPa · m$^{0.5}$) | N.A. | N.A. | N.A. | N.A. | N.A. | N.A. | N.A. | N.A. | N.A. | N.A. |
| $CS_K$ (MPa) | 1,248 | 1,129 | 1,292 | 1,389 | 1,309 | 1,248 | 1,264 | 1,198 | 1,152 | 1,326 |
| $DOL\_ZERO_K$ (μm) | 20 | 24 | 19 | 16 | 19 | 19 | 21 | 24 | 22 | 18 |
| $CS_{Na}$ (MPa) | 287 | 201 | 312 | 279 | 269 | 269 | 248 | 211 | 236 | 299 |
| $DOL\_ZERO_{Na}$ (μm) | 125 | 121 | 126 | 134 | 123 | 123 | 128 | 126 | 143 | 136 |

TABLE 2

| (mol %) | No. 11 | No. 12 | No. 13 | No. 14 | No. 15 | No. 16 | No. 17 | No. 18 | No. 19 | No. 20 |
|---|---|---|---|---|---|---|---|---|---|---|
| $SiO_2$ | 63.07 | 61.07 | 63.07 | 63.07 | 61.07 | 61.07 | 60.30 | 61.07 | 59.07 | 60.07 |
| $Al_2O_3$ | 15.81 | 17.81 | 15.81 | 17.81 | 15.81 | 15.81 | 18.95 | 17.81 | 15.81 | 17.81 |
| $B_2O_3$ | 0.00 | 0.00 | 0.00 | 0.00 | 0.00 | 0.00 | 0.20 | 0.00 | 2.00 | 2.00 |
| $Li_2O$ | 8.34 | 8.34 | 7.34 | 8.34 | 7.34 | 8.34 | 7.22 | 8.34 | 8.34 | 8.34 |
| $Na_2O$ | 11.10 | 11.10 | 12.10 | 9.10 | 12.10 | 11.10 | 8.20 | 9.10 | 13.10 | 10.10 |
| $K_2O$ | 0.00 | 0.00 | 0.00 | 0.00 | 0.00 | 0.00 | 0.44 | 0.00 | 0.00 | 0.00 |
| MgO | 0.00 | 0.00 | 0.00 | 0.00 | 2.00 | 2.00 | 0.26 | 2.00 | 0.00 | 0.00 |
| CaO | 0.00 | 0.00 | 0.00 | 0.00 | 0.00 | 0.00 | 0.00 | 0.00 | 0.00 | 0.00 |
| SrO | 0.00 | 0.00 | 0.00 | 0.00 | 0.00 | 0.00 | 0.00 | 0.00 | 0.00 | 0.00 |
| BaO | 0.00 | 0.00 | 0.00 | 0.00 | 0.00 | 0.00 | 0.00 | 0.00 | 0.00 | 0.00 |
| $ZrO_2$ | 0.00 | 0.00 | 0.00 | 0.00 | 0.00 | 0.00 | 0.00 | 0.00 | 0.00 | 0.00 |
| $Y_2O_3$ | 0.00 | 0.00 | 0.00 | 0.00 | 0.00 | 0.00 | 0.00 | 0.00 | 0.00 | 0.00 |
| ZnO | 1.16 | 1.16 | 1.16 | 1.16 | 1.16 | 1.16 | 0.00 | 1.16 | 1.16 | 1.16 |
| $P_2O_5$ | 0.47 | 0.47 | 0.47 | 0.47 | 0.47 | 0.47 | 4.28 | 0.47 | 0.47 | 0.47 |
| $SnO_2$ | 0.04 | 0.04 | 0.04 | 0.04 | 0.04 | 0.04 | 0.05 | 0.04 | 0.04 | 0.04 |
| $Fe_2O_3$ | 0.00 | 0.00 | 0.00 | 0.00 | 0.00 | 0.00 | 0.03 | 0.00 | 0.00 | 0.00 |
| $TiO_2$ | 0.00 | 0.00 | 0.00 | 0.00 | 0.00 | 0.00 | 0.00 | 0.00 | 0.00 | 0.00 |
| Cl | 0.00 | 0.00 | 0.00 | 0.00 | 0.00 | 0.00 | 0.07 | 0.00 | 0.00 | 0.00 |
| Li/(Na + K) | 0.75 | 0.75 | 0.61 | 0.92 | 0.61 | 0.75 | 0.84 | 0.92 | 0.64 | 0.83 |
| (Na + K)/Li | 1.33 | 1.33 | 1.65 | 1.09 | 1.65 | 1.33 | 1.20 | 1.09 | 1.57 | 1.21 |
| Li + Na + K | 19.44 | 19.44 | 19.44 | 17.44 | 19.44 | 19.44 | 15.86 | 17.44 | 21.44 | 18.44 |
| Li/P | 17.73 | 17.73 | 15.60 | 17.73 | 15.60 | 17.73 | 1.69 | 17.73 | 17.73 | 17.73 |
| P/Li | 0.06 | 0.06 | 0.06 | 0.06 | 0.06 | 0.06 | 0.59 | 0.06 | 0.06 | 0.06 |
| (Na − Li)/ (Al + B + P) | 0.17 | 0.15 | 0.29 | 0.04 | 0.29 | 0.17 | 0.04 | 0.04 | 0.26 | 0.09 |
| (B + Na − P)/ (Al + Li) | 0.44 | 0.41 | 0.50 | 0.33 | 0.50 | 0.44 | 0.16 | 0.33 | 0.61 | 0.44 |
| Si + 1.2P − 3Al − 2Li − 1.5Na − K − B | −17.12 | −25.12 | −16.62 | −20.12 | −18.62 | −19.12 | −18.79 | −22.12 | −26.12 | −26.62 |
| ρ (g/cm$^3$) | 2.454 | 2.460 | 2.457 | 2.446 | 2.471 | 2.469 | 2.403 | 2.463 | 2.462 | 2.442 |
| $\alpha_{30\text{-}380°\ C.}$ ($\times 10^{-7}/°$ C.) | 86.9 | 87.1 | 88.8 | 79.4 | 89.2 | 88.2 | 73.5 | 78.4 | 92.0 | 82.3 |
| Ts (° C.) | N.A. | N.A. | 823 | N.A. | 806 | N.A. | 926 | N.A. | 743 | N.A. |
| $10^{2.5}$ dPa · s (° C.) | 1,527 | 1,528 | 1,535 | 1,558 | 1,489 | 1,480 | 1,579 | 1,507 | 1,449 | 1,496 |
| TL (° C.) | 1,032 | 1,070 | 984 | 1,134 | 957 | 1,018 | 1,108 | 1,230 | 904 | 1,089 |
| logη at TL (dPa · s) | 5.1 | 5.1 | 5.7 | 4.9 | 5.7 | 5 | 5.5 | 3.9 | 5.6 | 4.9 |
| Acid resistance (HCl 5 wt % 80° C. 24 h) | N.A. | N.A. | N.A. | N.A. | N.A. | N.A. | 19.9 | N.A. | N.A. | N.A. |
| Alkali resistance (NaOH 5 wt % 80° C. 6 h) | N.A. | N.A. | N.A. | N.A. | N.A. | N.A. | 1.5 | N.A. | N.A. | N.A. |
| E (GPa) | 80 | 80 | N.A. | N.A. | N.A. | N.A. | N.A. | N.A. | 78 | N.A. |
| $K_{IC}$ (MPa · m$^{0.5}$) | N.A. | N.A. | N.A. | N.A. | N.A. | N.A. | N.A. | N.A. | N.A. | N.A. |
| $CS_K$ (MPa) | 967 | 1,165 | 1,083 | 1,449 | 1,170 | 1,149 | 1,072 | 1,460 | 932 | 1,293 |
| $DOL\_ZERO_K$ (μm) | 18 | 17 | 17 | 16 | 14 | 12 | 25 | 10 | 14 | 14 |
| $CS_{Na}$ (MPa) | 278 | 305 | 236 | 304 | 224 | 262 | 260 | 309 | 298 | 302 |
| $DOL\_ZERO_{Na}$ (μm) | 116 | 119 | 119 | 137 | 98 | 104 | 126 | 104 | 93 | 107 |

TABLE 3

| (mol %) | No. 21 | No. 22 | No. 23 | No. 24 | No. 25 | No. 26 | No. 27 | No. 28 | No. 29 | No. 30 |
|---|---|---|---|---|---|---|---|---|---|---|
| $SiO_2$ | 60.07 | 61.07 | 61.07 | 61.07 | 61.07 | 59.07 | 59.07 | 59.07 | 59.07 | 59.07 |
| $Al_2O_3$ | 15.81 | 18.81 | 17.81 | 16.81 | 16.81 | 17.81 | 16.81 | 18.81 | 18.81 | 17.81 |
| $B_2O_3$ | 2.00 | 2.00 | 2.00 | 2.00 | 2.00 | 2.00 | 2.00 | 2.00 | 2.00 | 2.00 |
| $Li_2O$ | 8.34 | 7.34 | 7.34 | 8.34 | 7.34 | 7.34 | 8.34 | 8.34 | 7.34 | 9.34 |
| $Na_2O$ | 12.10 | 9.10 | 10.10 | 10.10 | 11.10 | 12.10 | 12.10 | 10.10 | 11.10 | 10.10 |
| $K_2O$ | 0.00 | 0.00 | 0.00 | 0.00 | 0.00 | 0.00 | 0.00 | 0.00 | 0.00 | 0.00 |
| MgO | 0.00 | 0.00 | 0.00 | 0.00 | 0.00 | 0.00 | 0.00 | 0.00 | 0.00 | 0.00 |
| CaO | 0.00 | 0.00 | 0.00 | 0.00 | 0.00 | 0.00 | 0.00 | 0.00 | 0.00 | 0.00 |
| SrO | 0.00 | 0.00 | 0.00 | 0.00 | 0.00 | 0.00 | 0.00 | 0.00 | 0.00 | 0.00 |
| BaO | 0.00 | 0.00 | 0.00 | 0.00 | 0.00 | 0.00 | 0.00 | 0.00 | 0.00 | 0.00 |
| $ZrO_2$ | 0.00 | 0.00 | 0.00 | 0.00 | 0.00 | 0.00 | 0.00 | 0.00 | 0.00 | 0.00 |
| $Y_2O_3$ | 0.00 | 0.00 | 0.00 | 0.00 | 0.00 | 0.00 | 0.00 | 0.00 | 0.00 | 0.00 |
| ZnO | 1.16 | 1.16 | 1.16 | 1.16 | 1.16 | 1.16 | 1.16 | 1.16 | 1.16 | 1.16 |
| $P_2O_5$ | 0.47 | 0.47 | 0.47 | 0.47 | 0.47 | 0.47 | 0.47 | 0.47 | 0.47 | 0.47 |
| $SnO_2$ | 0.04 | 0.04 | 0.04 | 0.04 | 0.04 | 0.04 | 0.04 | 0.04 | 0.04 | 0.04 |
| $Fe_2O_3$ | 0.00 | 0.00 | 0.00 | 0.00 | 0.00 | 0.00 | 0.00 | 0.00 | 0.00 | 0.00 |
| $TiO_2$ | 0.00 | 0.00 | 0.00 | 0.00 | 0.00 | 0.00 | 0.00 | 0.00 | 0.00 | 0.00 |
| Cl | 0.00 | 0.00 | 0.00 | 0.00 | 0.00 | 0.00 | 0.00 | 0.00 | 0.00 | 0.00 |
| Li/(Na + K) | 0.69 | 0.81 | 0.73 | 0.83 | 0.66 | 0.61 | 0.69 | 0.83 | 0.66 | 0.93 |
| (Na + K)/Li | 1.45 | 1.24 | 1.38 | 1.21 | 1.51 | 1.65 | 1.45 | 1.21 | 1.51 | 1.08 |
| Li + Na + K | 20.44 | 16.44 | 17.44 | 18.44 | 18.44 | 19.44 | 20.44 | 18.44 | 18.44 | 19.44 |
| Li/P | 17.73 | 15.60 | 15.60 | 17.73 | 15.60 | 15.60 | 17.73 | 17.73 | 15.60 | 19.85 |
| P/Li | 0.06 | 0.06 | 0.06 | 0.06 | 0.06 | 0.06 | 0.06 | 0.06 | 0.06 | 0.05 |
| (Na – Li)/(Al + B + P) | 0.21 | 0.08 | 0.14 | 0.09 | 0.19 | 0.23 | 0.19 | 0.08 | 0.18 | 0.04 |
| (B + Na – P)/(Al + Li) | 0.56 | 0.41 | 0.46 | 0.46 | 0.52 | 0.54 | 0.54 | 0.43 | 0.48 | 0.43 |
| Si + 1.2P – 3Al – 2Li – 1.5Na – K – B | –23.62 | –25.12 | –23.62 | –22.62 | –22.12 | –28.62 | –27.62 | –30.62 | –30.12 | –29.62 |
| $\rho$ (g/cm³) | 2.455 | 2.438 | 2.438 | 2.440 | 2.443 | 2.452 | 2.456 | 2.450 | 2.450 | 2.450 |
| $\alpha_{30-380° C.}$ (×10⁻⁷/° C.) | 88.9 | 73.6 | 79.6 | 83.0 | 83.7 | 88.0 | 90.0 | 82.0 | 83.0 | 84.0 |
| Ts (° C.) | 756 | 882 | 862 | 827 | 821 | 819 | 777 | 850 | 856 | N.A. |
| $10^{2.5}$ dPa · s (° C.) | 1,488 | 1,530 | 1,530 | 1,508 | 1,524 | 1,509 | 1,474 | 1,493 | 1,507 | 1,480 |
| TL (° C.) | 967 | 1,060 | 1,078 | 1,091 | 1,030 | 991 | 985 | 1,051 | 1,040 | 1,068 |
| logn at TL (dPa · s) | 5.3 | 5.5 | 5.2 | 4.8 | 5.3 | 5.6 | 5.3 | 5.2 | 5.4 | 4.8 |
| Acid resistance (HCl 5 wt % 80° C. 24 h) | N.A. | N.A. | N.A. | N.A. | N.A. | N.A. | N.A. | N.A. | N.A. | N.A. |
| Alkali resistance (NaOH 5 wt % 80° C. 6 h) | N.A. | N.A. | N.A. | N.A. | N.A. | N.A. | N.A. | N.A. | N.A. | N.A. |
| E (GPa) | N.A. | N.A. | N.A. | N.A. | N.A. | 76 | 78 | N.A. | N.A. | N.A. |
| $K_{1C}$ (MPa · m⁰·⁵) | N.A. | N.A. | N.A. | N.A. | N.A. | N.A. | N.A. | N.A. | N.A. | N.A. |
| $CS_K$ (MPa) | 860 | 1,438 | 1,385 | 1,218 | 1,230 | 1,264 | 1,087 | 1,439 | 1,433 | 1,225 |
| $DOL\_ZERO_K$ (µm) | 13 | 12 | 15 | 13 | 15 | 14 | 14 | 12 | 14 | 12 |
| $CS_{Na}$ (MPa) | 259 | 297 | 312 | 324 | 271 | 282 | 292 | 309 | 280 | 340 |
| $DOL\_ZERO_{Na}$ (µm) | 100 | 111 | 119 | 108 | 111 | 106 | 92 | 112 | 118 | 112 |

TABLE 4

| (mol %) | No. 31 | No. 32 | No. 33 | No. 34 | No. 35 | No. 36 | No. 37 | No. 38 | No. 39 | No. 40 |
|---|---|---|---|---|---|---|---|---|---|---|
| $SiO_2$ | 61.07 | 61.07 | 61.07 | 63.58 | 61.07 | 61.07 | 63.40 | 66.59 | 63.51 | 60.94 |
| $Al_2O_3$ | 15.81 | 15.81 | 17.81 | 16.55 | 17.81 | 19.81 | 15.88 | 11.26 | 16.60 | 13.57 |
| $B_2O_3$ | 2.00 | 2.00 | 2.00 | 0.00 | 2.00 | 0.00 | 0.00 | 0.00 | 0.00 | 0.59 |
| $Li_2O$ | 7.34 | 8.34 | 8.34 | 8.19 | 4.34 | 8.34 | 6.37 | 10.19 | 8.20 | 0.03 |
| $Na_2O$ | 12.10 | 11.10 | 9.10 | 8.09 | 13.10 | 7.10 | 10.66 | 5.42 | 8.12 | 15.27 |
| $K_2O$ | 0.00 | 0.00 | 0.00 | 0.52 | 0.00 | 0.00 | 0.02 | 1.41 | 0.52 | 3.24 |
| MgO | 0.00 | 0.00 | 0.00 | 0.33 | 0.00 | 0.00 | 0.01 | 3.15 | 0.30 | 3.54 |
| CaO | 0.00 | 0.00 | 0.00 | 0.00 | 0.00 | 0.00 | 0.02 | 0.02 | 0.00 | 0.00 |
| SrO | 0.00 | 0.00 | 0.00 | 0.00 | 0.00 | 0.00 | 0.00 | 0.00 | 0.00 | 0.00 |
| BaO | 0.00 | 0.00 | 0.00 | 0.00 | 0.00 | 0.00 | 0.00 | 0.00 | 0.00 | 0.00 |
| $ZrO_2$ | 0.00 | 0.00 | 0.00 | 0.00 | 0.00 | 0.00 | 0.00 | 1.29 | 0.00 | 0.00 |
| $Y_2O_3$ | 0.00 | 0.00 | 0.00 | 0.00 | 0.00 | 0.00 | 0.00 | 0.53 | 0.00 | 0.00 |
| ZnO | 1.16 | 1.16 | 1.16 | 0.00 | 1.16 | 1.16 | 1.13 | 0.00 | 0.00 | 0.00 |
| $P_2O_5$ | 0.47 | 0.47 | 0.47 | 2.70 | 0.47 | 2.47 | 2.49 | 0.00 | 2.71 | 2.62 |
| $SnO_2$ | 0.04 | 0.04 | 0.04 | 0.04 | 0.04 | 0.04 | 0.00 | 0.00 | 0.04 | 0.14 |
| $Fe_2O_3$ | 0.00 | 0.00 | 0.00 | 0.00 | 0.00 | 0.00 | 0.02 | 0.00 | 0.00 | 0.01 |
| $TiO_2$ | 0.00 | 0.00 | 0.00 | 0.00 | 0.00 | 0.00 | 0.00 | 0.16 | 0.00 | 0.00 |

TABLE 4-continued

| (mol %) | No. 31 | No. 32 | No. 33 | No. 34 | No. 35 | No. 36 | No. 37 | No. 38 | No. 39 | No. 40 |
|---|---|---|---|---|---|---|---|---|---|---|
| Cl | 0.00 | 0.00 | 0.00 | 0.00 | 0.00 | 0.00 | 0.00 | 0.00 | 0.00 | 0.05 |
| Li/(Na + K) | 0.61 | 0.75 | 0.92 | 0.95 | 0.33 | 1.18 | 0.60 | 1.49 | 0.95 | 0.00 |
| (Na + K)/Li | 1.65 | 1.33 | 1.09 | 1.05 | 3.02 | 0.85 | 1.68 | 0.67 | 1.05 | 617.00 |
| Li + Na + K | 19.44 | 19.44 | 17.44 | 16.80 | 17.44 | 15.44 | 17.05 | 17.02 | 16.84 | 18.54 |
| Li/P | 15.60 | 17.73 | 17.73 | 3.03 | 9.23 | 3.38 | 2.56 | — | 3.03 | 0.01 |
| P/Li | 0.06 | 0.06 | 0.06 | 0.33 | 0.11 | 0.30 | 0.39 | 0.00 | 0.33 | 87.33 |
| (Na − Li)/ (Al + B + P) | 0.26 | 0.15 | 0.04 | −0.01 | 0.43 | −0.06 | 0.23 | −0.42 | 0.00 | 0.91 |
| (B + Na − P)/ (Al + Li) | 0.59 | 0.52 | 0.41 | 0.22 | 0.66 | 0.16 | 0.37 | 0.25 | 0.22 | 0.97 |
| Si + 1.2P − 3Al − 2Li − 1.5Na − K − B | −20.62 | −21.12 | −24.12 | −11.87 | −22.12 | −22.72 | −10.00 | 2.89 | −12.14 | −3.42 |
| $\rho$ (g/cm$^3$) | 2.449 | 2.448 | 2.435 | 2.404 | 2.442 | 2.437 | 2.428 | N.A. | 2.404 | 2.440 |
| $\alpha_{30\text{-}380°\,C.}$ ($\times10^{-7}$/° C.) | 87.3 | 85.9 | 78.3 | 79.4 | 82.8 | 67.6 | 81.3 | N.A. | N.A. | 104.3 |
| Ts (° C.) | 785 | 781 | N.A. | N.A. | 891 | 917 | 876 | N.A. | 892 | 925 |
| $10^{2.5}$ dPa · s (° C.) | 1,508 | 1,487 | 1,519 | 1,593 | 1,564 | 1,541 | 1,561 | N.A. | 1,593 | 1,588 |
| TL (° C.) | 938> | 1,034 | 1,117 | 1,145 | 938> | 1,343< | 1,008 | N.A. | 1,145 | N.A. |
| log$\eta$ at TL (dPa · s) | 5.8< | 4.9 | 4.9 | 5.14 | 7.0< | 3.5> | 6.3 | N.A. | 5.14 | N.A. |
| Acid resistance (HCl 5 wt % 80° C. 24 h) | N.A. | N.A. | N.A. | N.A. | N.A. | N.A. | N.A. | N.A. | 4.0 | N.A. |
| Alkali resistance (NaOH 5 wt % 80° C. 6 h) | N.A. | N.A. | N.A. | N.A. | N.A. | N.A. | N.A. | N.A. | 0.6 | N.A. |
| E (GPa) | N.A. | N.A. | N.A. | 77 | N.A. | N.A. | 77 | N.A. | 78 | 70 |
| $K_{1C}$ (MPa · m$^{0.5}$) | N.A. | N.A. | N.A. | N.A. | N.A. | N.A. | N.A. | N.A. | N.A. | N.A. |
| $CS_K$ (MPa) | 1,045 | 1,026 | 1,379 | 1,021 | 1,474 | 1,376 | N.A. | N.A. | 1,021 | N.A. |
| DOL__ZERO$_K$ (μm) | 15 | 13 | 14 | 26 | 21 | 11 | N.A. | N.A. | 26 | N.A. |
| $CS_{Na}$ (MPa) | 255 | 280 | 330 | 310 | 163 | 324 | N.A. | N.A. | 310 | N.A. |
| DOL__ZERO$_{Na}$ (μm) | 105 | 105 | 115 | 131 | 132 | 116 | N.A. | N.A. | 131 | N.A. |

TABLE 5

| (mol %) | No. 41 | No. 42 | No. 43 | No. 44 | No. 45 | No. 46 | No. 47 | No. 48 | No. 49 | No. 50 |
|---|---|---|---|---|---|---|---|---|---|---|
| SiO$_2$ | 62.24 | 62.24 | 60.24 | 60.24 | 62.24 | 62.24 | 60.24 | 60.24 | 58.24 | 56.24 |
| Al$_2$O$_3$ | 17.81 | 15.81 | 17.81 | 15.81 | 17.81 | 15.81 | 17.81 | 15.81 | 17.81 | 17.81 |
| B$_2$O$_3$ | 2.00 | 2.00 | 2.00 | 2.00 | 0.00 | 0.00 | 0.00 | 0.00 | 2.00 | 2.00 |
| Li$_2$O | 8.34 | 8.34 | 8.34 | 8.34 | 8.34 | 8.34 | 8.34 | 8.34 | 8.34 | 8.34 |
| Na$_2$O | 9.10 | 11.10 | 11.10 | 13.10 | 9.10 | 11.10 | 11.10 | 13.10 | 9.10 | 11.10 |
| K$_2$O | 0.00 | 0.00 | 0.00 | 0.00 | 0.00 | 0.00 | 0.00 | 0.00 | 4.00 | 4.00 |
| MgO | 0.00 | 0.00 | 0.00 | 0.00 | 0.00 | 0.00 | 0.00 | 0.00 | 0.00 | 0.00 |
| CaO | 0.00 | 0.00 | 0.00 | 0.00 | 0.00 | 0.00 | 0.00 | 0.00 | 0.00 | 0.00 |
| SrO | 0.00 | 0.00 | 0.00 | 0.00 | 0.00 | 0.00 | 0.00 | 0.00 | 0.00 | 0.00 |
| BaO | 0.00 | 0.00 | 0.00 | 0.00 | 0.00 | 0.00 | 0.00 | 0.00 | 0.00 | 0.00 |
| ZrO$_2$ | 0.00 | 0.00 | 0.00 | 0.00 | 0.00 | 0.00 | 0.00 | 0.00 | 0.00 | 0.00 |
| Y$_2$O$_3$ | 0.00 | 0.00 | 0.00 | 0.00 | 0.00 | 0.00 | 0.00 | 0.00 | 0.00 | 0.00 |
| ZnO | 0.00 | 0.00 | 0.00 | 0.00 | 0.00 | 0.00 | 0.00 | 0.00 | 0.00 | 0.00 |
| P$_2$O$_5$ | 0.47 | 0.47 | 0.47 | 0.47 | 2.47 | 2.47 | 2.47 | 2.47 | 0.47 | 0.47 |
| SnO$_2$ | 0.04 | 0.04 | 0.04 | 0.04 | 0.04 | 0.04 | 0.04 | 0.04 | 0.04 | 0.04 |
| Fe$_2$O$_3$ | 0.01 | 0.01 | 0.01 | 0.01 | 0.01 | 0.01 | 0.01 | 0.01 | 0.01 | 0.01 |
| TiO$_2$ | 0.01 | 0.01 | 0.01 | 0.01 | 0.01 | 0.01 | 0.01 | 0.01 | 0.01 | 0.01 |
| Cl | 0.01 | 0.01 | 0.01 | 0.01 | 0.01 | 0.01 | 0.01 | 0.01 | 0.01 | 0.01 |
| Li/(Na + K) | 0.92 | 0.75 | 0.75 | 0.64 | 0.92 | 0.75 | 0.75 | 0.64 | 0.64 | 0.55 |
| (Na + K)/Li | 1.09 | 1.33 | 1.33 | 1.57 | 1.09 | 1.33 | 1.33 | 1.57 | 1.57 | 1.81 |
| Li + Na + K | 17.44 | 19.44 | 19.44 | 21.44 | 17.44 | 19.44 | 19.44 | 21.44 | 21.44 | 23.44 |
| Li/P | 17.73 | 17.73 | 17.73 | 17.73 | 3.38 | 3.38 | 3.38 | 3.38 | 17.73 | 17.73 |
| P/Li | 0.06 | 0.06 | 0.06 | 0.06 | 0.30 | 0.30 | 0.30 | 0.30 | 0.06 | 0.06 |
| (Na − Li)/ (Al + B + P) | 0.04 | 0.15 | 0.14 | 0.26 | 0.04 | 0.15 | 0.14 | 0.26 | 0.04 | 0.14 |
| (B + Na − P)/ (Al + Li) | 0.41 | 0.52 | 0.48 | 0.61 | 0.25 | 0.36 | 0.33 | 0.44 | 0.41 | 0.48 |
| Si + 1.2P − 3Al − 2Li − 1.5Na − K − B | −22.96 | −19.96 | −27.96 | −24.96 | −18.56 | −15.56 | −23.56 | −20.56 | −30.96 | −35.96 |
| $\rho$ (g/cm$^3$) | 2.410 | 2.426 | 2.427 | 2.442 | 2.413 | 2.422 | 2.428 | 2.436 | 2.442 | 2.458 |
| $\alpha_{30\text{-}380°\,C.}$ ($\times10^{-7}$/° C.) | 80.3 | 86.9 | 86.9 | 91.8 | 80.8 | 88.6 | 88.7 | 94.8 | 96.9 | 103.9 |
| Ts (° C.) | 877 | 775 | 827 | 738 | 917 | N.A. | 877 | N.A. | 773 | N.A. |

TABLE 5-continued

| (mol %) | No. 41 | No. 42 | No. 43 | No. 44 | No. 45 | No. 46 | No. 47 | No. 48 | No. 49 | No. 50 |
|---|---|---|---|---|---|---|---|---|---|---|
| $10^{2.5}$ dPa · s (° C.) | 1,538 | 1,517 | 1,516 | 1,467 | 1,580 | 1,548 | 1,546 | 1,498 | 1,492 | 1,461 |
| TL (° C.) | 1,152 | 1,047 | 1,030 | 914 | 1,126 | 1,029 | 1,125 | 1,066 | 1,216 | 941 |
| logη at TL (dPa · s) | 4.66 | 4.87 | 5.33 | 5.55 | 5.19 | 5.62 | 4.87 | 4.90 | 3.74 | 5.25 |
| Acid resistance (HCl 5 wt % 80° C. 24 h) | 34.8< | N.A. | 34.8< | N.A. | 34.8 | 28.5 | 34.8< | 34.8< | N.A. | N.A. |
| Alkali resistance (NaOH 5 wt % 80° C. 6 h) | 0.8 | N.A. | 0.8 | N.A. | 0.9 | 0.8 | 0.9 | 0.7 | N.A. | N.A. |
| E (GPa) | 78 | 78 | 78 | 79 | 78 | 77 | 77 | 77 | 78 | 79 |
| $K_{1C}$ (MPa · m$^{0.5}$) | N.A. | N.A. | N.A. | N.A. | N.A. | N.A. | N.A. | N.A. | N.A. | N.A. |
| $CS_K$ (MPa) | 1,307 | 932 | 1,124 | 751 | 1,262 | 1,016 | 1,151 | 1,018 | 810 | N.A. |
| DOL_ZERO$_K$ (μm) | 15.7 | 14.8 | 15.4 | 13.1 | 21.4 | 24.4 | 23.6 | 26.8 | 23.1 | N.A. |
| $CS_{Na}$ (MPa) | 279 | 221 | 272 | 212 | 258 | 197 | 324 | 165 | 202 | N.A. |
| DOL_ZERO$_{Na}$ (μm) | 135.7 | 118.8 | 116.2 | 105.0 | 153.7 | 158.0 | 131.9 | 133.5 | 85.6 | N.A. |

TABLE 6

| (mol %) | No. 51 | No. 52 | No. 53 | No. 54 | No. 55 | No. 56 | No. 57 | No. 58 | No. 59 | No. 60 |
|---|---|---|---|---|---|---|---|---|---|---|
| $SiO_2$ | 58.24 | 56.24 | 61.24 | 61.24 | 60.24 | 62.24 | 62.24 | 60.24 | 60.24 | 62.24 |
| $Al_2O_3$ | 17.81 | 17.81 | 16.81 | 15.81 | 16.81 | 15.81 | 15.81 | 17.81 | 15.81 | 15.81 |
| $B_2O_3$ | 0.00 | 0.00 | 0.00 | 0.00 | 0.00 | 0.50 | 0.00 | 0.00 | 0.00 | 0.50 |
| $Li_2O$ | 8.34 | 8.34 | 8.34 | 8.34 | 8.34 | 8.34 | 5.84 | 5.84 | 5.84 | 5.84 |
| $Na_2O$ | 9.10 | 11.10 | 11.10 | 12.10 | 12.10 | 11.10 | 11.10 | 11.10 | 13.10 | 11.10 |
| $K_2O$ | 4.00 | 4.00 | 0.00 | 0.00 | 0.00 | 0.00 | 2.50 | 2.50 | 2.50 | 2.50 |
| MgO | 0.00 | 0.00 | 0.00 | 0.00 | 0.00 | 0.00 | 0.00 | 0.00 | 0.00 | 0.00 |
| CaO | 0.00 | 0.00 | 0.00 | 0.00 | 0.00 | 0.00 | 0.00 | 0.00 | 0.00 | 0.00 |
| SrO | 0.00 | 0.00 | 0.00 | 0.00 | 0.00 | 0.00 | 0.00 | 0.00 | 0.00 | 0.00 |
| BaO | 0.00 | 0.00 | 0.00 | 0.00 | 0.00 | 0.00 | 0.00 | 0.00 | 0.00 | 0.00 |
| $ZrO_2$ | 0.00 | 0.00 | 0.00 | 0.00 | 0.00 | 0.00 | 0.00 | 0.00 | 0.00 | 0.00 |
| $Y_2O_3$ | 0.00 | 0.00 | 0.00 | 0.00 | 0.00 | 0.00 | 0.00 | 0.00 | 0.00 | 0.00 |
| ZnO | 0.00 | 0.00 | 0.00 | 0.00 | 0.00 | 0.00 | 0.00 | 0.00 | 0.00 | 0.00 |
| $P_2O_5$ | 2.47 | 2.47 | 2.47 | 2.47 | 2.47 | 1.97 | 2.47 | 2.47 | 2.47 | 1.97 |
| $SnO_2$ | 0.04 | 0.04 | 0.04 | 0.04 | 0.04 | 0.04 | 0.04 | 0.04 | 0.04 | 0.04 |
| $Fe_2O_3$ | 0.01 | 0.01 | 0.01 | 0.01 | 0.01 | 0.01 | 0.01 | 0.01 | 0.01 | 0.01 |
| $TiO_2$ | 0.01 | 0.01 | 0.01 | 0.01 | 0.01 | 0.01 | 0.01 | 0.01 | 0.01 | 0.01 |
| Cl | 0.01 | 0.01 | 0.01 | 0.01 | 0.01 | 0.01 | 0.01 | 0.01 | 0.01 | 0.01 |
| Li/(Na + K) | 0.64 | 0.55 | 0.75 | 0.69 | 0.69 | 0.75 | 0.43 | 0.43 | 0.37 | 0.43 |
| (Na + K)/Li | 1.57 | 1.81 | 1.33 | 1.45 | 1.45 | 1.33 | 2.33 | 2.33 | 2.67 | 2.33 |
| Li + Na + K | 21.44 | 23.44 | 19.44 | 20.44 | 20.44 | 19.44 | 19.44 | 19.44 | 21.44 | 19.44 |
| Li/P | 3.38 | 3.38 | 3.38 | 3.38 | 3.38 | 4.23 | 2.36 | 2.36 | 2.36 | 2.96 |
| P/Li | 0.30 | 0.30 | 0.30 | 0.30 | 0.30 | 0.24 | 0.42 | 0.42 | 0.42 | 0.34 |
| (Na − Li)/ (Al + B + P) | 0.04 | 0.14 | 0.14 | 0.21 | 0.19 | 0.15 | 0.29 | 0.26 | 0.40 | 0.29 |
| (B + Na − P)/ (Al + Li) | 0.25 | 0.33 | 0.34 | 0.40 | 0.38 | 0.40 | 0.40 | 0.36 | 0.49 | 0.44 |
| Si + 1.2P − 3Al − 2Li − 1.5Na − K − B | −26.56 | −31.56 | −19.56 | −18.06 | −22.06 | −16.66 | −13.06 | −21.06 | −18.06 | −14.16 |
| ρ (g/cm$^3$) | 2.442 | 2.455 | 2.423 | 2.427 | 2.431 | 2.419 | 2.426 | 2.432 | 2.440 | 2.425 |
| $\alpha_{30-380° C.}$ (×10$^{-7}$/° C.) | 99.8 | 107.4 | 88.4 | 92.1 | 92.1 | 87.6 | 96.7 | 95.2 | 102.5 | 95.3 |
| Ts (° C.) | N.A. | N.A. | 860 | N.A. | N.A. | N.A. | N.A. | 893 | N.A. | N.A. |
| $10^{2.5}$ dPa · s (° C.) | 1,537 | 1,494 | 1,547 | 1,528 | 1,529 | 1,537 | 1,589 | 1,593 | 1,544 | 1,576 |
| TL (° C.) | 1,120 | 1,018 | N.A. | N.A. | N.A. | N.A. | N.A. | N.A. | N.A. | N.A. |
| logη at TL (dPa · s) | 4.78< | 5.39 | N.A. | N.A. | N.A. | N.A. | N.A. | N.A. | N.A. | N.A. |
| Acid resistance (HCl 5 wt % 80° C. 24 h) | 34.8< | 34.8< | N.A. | N.A. | N.A. | N.A. | N.A. | N.A. | N.A. | N.A. |
| Alkali resistance (NaOH 5 wt % 80° C. 6 h) | 0.9 | 0.9 | N.A. | N.A. | N.A. | N.A. | N.A. | N.A. | N.A. | N.A. |
| E (GPa) | 77 | 77 | 77 | 77 | 77 | 77 | 74 | 75 | 75 | 75 |
| $K_{1C}$ (MPa · m$^{0.5}$) | N.A. | N.A. | N.A. | N.A. | N.A. | N.A. | N.A. | N.A. | N.A. | N.A. |
| $CS_K$ (MPa) | 889 | N.A. | 915 | 894 | 1,173 | 806 | N.A. | N.A. | N.A. | N.A. |
| DOL_ZERO$_K$ (μm) | 36.1 | N.A. | 28.8 | 29.9 | 31.2 | 24.9 | N.A. | N.A. | N.A. | N.A. |

TABLE 6-continued

| (mol %) | No. 51 | No. 52 | No. 53 | No. 54 | No. 55 | No. 56 | No. 57 | No. 58 | No. 59 | No. 60 |
|---|---|---|---|---|---|---|---|---|---|---|
| $CS_{Na}$ (MPa) | 259 | N.A. | 255 | 194 | 227 | 237 | N.A. | N.A. | N.A. | N.A. |
| $DOL\_ZERO_{Na}$ (μm) | 95.1 | N.A. | 132.3 | 140.8 | 150.6 | 147.3 | N.A. | N.A. | N.A. | N.A. |

TABLE 7

| (mol %) | No. 61 | No. 62 | No. 63 | No. 64 | No. 65 | No. 66 | No. 67 | No. 68 | No. 69 | No. 70 |
|---|---|---|---|---|---|---|---|---|---|---|
| $SiO_2$ | 63.07 | 63.07 | 66.40 | 66.40 | 63.07 | 63.07 | 63.07 | 63.07 | 63.07 | 63.07 |
| $Al_2O_3$ | 16.81 | 16.81 | 8.51 | 8.51 | 16.81 | 16.81 | 16.81 | 16.81 | 17.21 | 15.71 |
| $B_2O_3$ | 0.00 | 0.00 | 0.00 | 0.00 | 0.00 | 0.00 | 0.00 | 0.00 | 0.60 | 0.60 |
| $Li_2O$ | 4.34 | 4.34 | 4.21 | 4.21 | 4.34 | 4.34 | 4.34 | 4.34 | 4.34 | 4.34 |
| $Na_2O$ | 14.10 | 13.10 | 8.55 | 8.55 | 13.10 | 13.10 | 13.10 | 13.10 | 13.10 | 13.10 |
| $K_2O$ | 0.00 | 1.00 | 3.73 | 3.73 | 0.00 | 0.00 | 0.00 | 0.00 | 0.00 | 0.00 |
| MgO | 0.00 | 0.00 | 0.00 | 0.00 | 1.00 | 0.00 | 0.00 | 0.00 | 0.00 | 0.00 |
| CaO | 0.00 | 0.00 | 0.00 | 0.00 | 0.00 | 0.00 | 0.00 | 0.00 | 0.00 | 0.00 |
| SrO | 0.00 | 0.00 | 0.00 | 0.00 | 0.00 | 0.00 | 0.00 | 0.00 | 0.00 | 0.00 |
| BaO | 0.00 | 0.00 | 0.00 | 0.00 | 0.00 | 0.00 | 0.00 | 0.00 | 0.00 | 0.00 |
| $ZrO_2$ | 0.00 | 0.00 | 0.00 | 0.00 | 0.00 | 0.00 | 0.00 | 0.00 | 0.00 | 0.00 |
| $Y_2O_3$ | 0.00 | 0.00 | 0.00 | 0.00 | 0.00 | 0.00 | 0.00 | 0.00 | 0.00 | 0.00 |
| ZnO | 1.16 | 1.16 | 6.02 | 4.02 | 1.16 | 1.16 | 1.16 | 2.16 | 1.16 | 1.16 |
| $P_2O_5$ | 0.47 | 0.47 | 0.81 | 2.81 | 0.47 | 1.47 | 0.47 | 0.47 | 0.47 | 1.97 |
| $SnO_2$ | 0.04 | 0.04 | 0.04 | 0.04 | 0.04 | 0.04 | 0.04 | 0.04 | 0.04 | 0.04 |
| $Fe_2O_3$ | 0.01 | 0.01 | 0.01 | 0.01 | 0.01 | 0.01 | 0.01 | 0.01 | 0.01 | 0.01 |
| $TiO_2$ | 0.00 | 0.00 | 1.74 | 1.74 | 0.00 | 0.00 | 1.00 | 0.00 | 0.00 | 0.00 |
| Cl | 0.01 | 0.01 | 0.01 | 0.01 | 0.01 | 0.01 | 0.01 | 0.01 | 0.01 | 0.01 |
| Li/(Na + K) | 0.31 | 0.31 | 0.34 | 0.34 | 0.33 | 0.33 | 0.33 | 0.33 | 0.33 | 0.33 |
| (Na + K)/Li | 3.25 | 3.25 | 2.91 | 2.91 | 3.02 | 3.02 | 3.02 | 3.02 | 3.02 | 3.02 |
| Li + Na + K | 18.44 | 18.44 | 16.48 | 16.48 | 17.44 | 17.44 | 17.44 | 17.44 | 17.44 | 17.44 |
| Li/P | 9.23 | 9.23 | 5.18 | 1.50 | 9.23 | 2.95 | 9.23 | 9.23 | 9.23 | 2.20 |
| P/Li | 0.11 | 0.11 | 0.19 | 0.67 | 0.11 | 0.34 | 0.11 | 0.11 | 0.11 | 0.45 |
| (Na − Li)/ (Al + B + P) | 0.56 | 0.51 | 0.47 | 0.38 | 0.51 | 0.48 | 0.51 | 0.51 | 0.48 | 0.48 |
| (B + Na − P)/ (Al + Li) | 0.64 | 0.60 | 0.61 | 0.45 | 0.60 | 0.55 | 0.60 | 0.60 | 0.61 | 0.58 |
| Si + 1.2P − 3Al − 2Li − 1.5Na − K − B | −16.62 | −16.12 | 16.89 | 19.29 | −15.12 | −13.92 | −15.12 | −15.12 | −16.92 | −10.62 |
| ρ (g/cm³) | 2.460 | 2.461 | 2.535 | 2.478 | 2.460 | 2.446 | 2.458 | 2.472 | 2.448 | 2.437 |
| $\alpha_{30-380°\,C.}$ (×10⁻⁷/° C.) | 90.5 | 93.3 | 90.6 | 90.4 | 86.1 | 85.8 | 86.0 | 85.2 | 85.9 | 85.8 |
| Ts (° C.) | 890 | 902 | 918 | N.A. | 903 | 918 | 903 | 899 | 904 | 873 |
| $10^{2.5}$ dPa · s (° C.) | 1,592 | 1,488 | 1,603 | 1,531 | 1,591 | 1,613 | 1,597 | 1,596 | 1,598 | 1,599 |
| TL (° C.) | N.A. | N.A. | N.A. | N.A. | N.A. | N.A. | N.A. | N.A. | N.A. | N.A. |
| logη at TL (dPa · s) | N.A. | N.A. | N.A. | N.A. | N.A. | N.A. | N.A. | N.A. | N.A. | N.A. |
| Acid resistance (HCl 5 wt % 80° C. 24 h) | 33.3< | 33.3< | 0 | N.A. | 33.3< | 33.3 | N.A. | N.A. | N.A. | N.A. |
| Alkali resistance (NaOH 5 wt % 80° C. 6 h) | 0.6 | 0.6 | 0.6 | N.A. | 0.1 | 0.7 | N.A. | N.A. | N.A. | N.A. |
| E (GPa) | 77 | 77 | 75 | 73 | 78 | 75 | 76 | 77 | 76 | 74 |
| $K_{IC}$ (MPa · m⁰·⁵) | N.A. | N.A. | N.A. | N.A. | N.A. | N.A. | N.A. | N.A. | N.A. | N.A. |
| $CS_K$ (MPa) | N.A. | N.A. | N.A. | N.A. | N.A. | N.A. | 1,265 | 1,290 | 1,264 | N.A. |
| $DOL\_ZERO_K$ (μm) | N.A. | N.A. | N.A. | N.A. | N.A. | N.A. | 24.6 | 22.2 | 25.4 | N.A. |
| $CS_{Na}$ (MPa) | N.A. | N.A. | N.A. | N.A. | N.A. | N.A. | 167 | 170 | 175 | N.A. |
| $DOL\_ZERO_{Na}$ (μm) | N.A. | N.A. | N.A. | N.A. | N.A. | N.A. | 122.8 | 127.7 | 133.1 | N.A. |

TABLE 8

| (mol %) | No. 71 | No. 72 | No. 73 | No. 74 | No. 75 | No. 76 | No. 77 | No. 78 | No. 79 | No. 80 |
|---|---|---|---|---|---|---|---|---|---|---|
| $SiO_2$ | 63.07 | 63.07 | 63.07 | 63.22 | 63.94 | 66.40 | 64.76 | 65.76 | 64.76 | 65.76 |
| $Al_2O_3$ | 15.71 | 14.21 | 17.81 | 17.00 | 12.71 | 10.25 | 16.25 | 16.25 | 16.25 | 16.25 |
| $B_2O_3$ | 0.60 | 0.60 | 0.00 | 0.40 | 0.40 | 0.00 | 0.10 | 0.10 | 0.10 | 0.10 |
| $Li_2O$ | 4.34 | 4.34 | 4.34 | 4.34 | 8.34 | 4.21 | 5.20 | 5.20 | 5.70 | 5.70 |
| $Na_2O$ | 13.10 | 13.10 | 13.10 | 13.10 | 11.10 | 8.55 | 11.00 | 11.00 | 10.50 | 10.50 |
| $K_2O$ | 1.50 | 1.50 | 0.00 | 1.50 | 0.50 | 4.23 | 1.25 | 1.25 | 1.25 | 1.25 |
| MgO | 0.00 | 0.00 | 0.00 | 0.00 | 0.50 | 0.00 | 1.00 | 0.00 | 1.00 | 0.00 |

TABLE 8-continued

| (mol %) | No. 71 | No. 72 | No. 73 | No. 74 | No. 75 | No. 76 | No. 77 | No. 78 | No. 79 | No. 80 |
|---|---|---|---|---|---|---|---|---|---|---|
| CaO | 0.00 | 0.00 | 0.00 | 0.00 | 0.00 | 0.00 | 0.00 | 0.00 | 0.00 | 0.00 |
| SrO | 0.00 | 0.00 | 0.00 | 0.00 | 0.00 | 0.00 | 0.00 | 0.00 | 0.00 | 0.00 |
| BaO | 0.00 | 0.00 | 0.00 | 0.00 | 0.00 | 0.00 | 0.00 | 0.00 | 0.00 | 0.00 |
| $ZrO_2$ | 0.00 | 0.00 | 0.00 | 0.00 | 0.00 | 0.00 | 0.00 | 0.00 | 0.00 | 0.00 |
| $Y_2O_3$ | 0.00 | 0.00 | 0.00 | 0.00 | 0.00 | 0.00 | 0.00 | 0.00 | 0.00 | 0.00 |
| ZnO | 1.16 | 1.16 | 1.16 | 0.00 | 0.00 | 5.52 | 0.00 | 0.00 | 0.00 | 0.00 |
| $P_2O_5$ | 0.47 | 1.97 | 0.47 | 0.40 | 2.47 | 0.81 | 0.40 | 0.40 | 0.40 | 0.40 |
| $SnO_2$ | 0.04 | 0.04 | 0.04 | 0.04 | 0.04 | 0.04 | 0.04 | 0.04 | 0.04 | 0.04 |
| $Fe_2O_3$ | 0.01 | 0.01 | 0.01 | 0.01 | 0.01 | 0.01 | 0.01 | 0.01 | 0.01 | 0.01 |
| $TiO_2$ | 0.00 | 0.00 | 0.00 | 0.00 | 0.00 | 0.00 | 0.00 | 0.00 | 0.00 | 0.00 |
| Cl | 0.01 | 0.01 | 0.01 | 0.01 | 0.01 | 0.01 | 0.01 | 0.01 | 0.01 | 0.01 |
| Li/(Na + K) | 0.30 | 0.30 | 0.33 | 0.30 | 0.72 | 0.33 | 0.42 | 0.42 | 0.49 | 0.49 |
| (Na + K)/Li | 3.36 | 3.36 | 3.02 | 3.36 | 1.39 | 3.03 | 2.36 | 2.36 | 2.06 | 2.06 |
| Li + Na + K | 18.94 | 18.94 | 17.44 | 18.94 | 19.94 | 16.98 | 17.45 | 17.45 | 17.45 | 17.45 |
| Li/P | 9.23 | 2.20 | 9.23 | 10.85 | 3.38 | 5.18 | 13.00 | 13.00 | 14.25 | 14.25 |
| P/Li | 0.11 | 0.45 | 0.11 | 0.09 | 0.30 | 0.19 | 0.08 | 0.08 | 0.07 | 0.07 |
| (Na − Li)/ (Al + B + P) | 0.52 | 0.52 | 0.48 | 0.49 | 0.18 | 0.39 | 0.35 | 0.35 | 0.29 | 0.29 |
| (B + Na − P)/ (Al + Li) | 0.66 | 0.63 | 0.57 | 0.61 | 0.43 | 0.53 | 0.50 | 0.50 | 0.46 | 0.46 |
| Si + 1.2P − 3Al − 2Li − 1.5Na − K − B | −13.92 | −7.62 | −18.12 | −17.53 | −5.46 | 11.17 | −11.76 | −10.76 | −12.01 | −11.01 |
| $\rho$ (g/cm³) | 2.458 | 2.442 | 2.454 | 2.438 | 2.414 | 2.511 | N.A. | N.A. | N.A. | N.A. |
| $\alpha_{30\text{-}380°\,C.}$ ($\times 10^{-7}$/° C.) | 94.4 | 93.8 | 84.8 | 93.3 | 88.7 | 92.8 | 87.8 | 88.7 | 87.7 | 87.9 |
| Ts (° C.) | 828 | N.A. | 937 | 865 | N.A. | N.A. | 883 | 899 | 877 | 893 |
| $10^{2.5}$ dPa · s (° C.) | 1,582 | 1,567 | 1,613 | 1,611 | 1,486 | 1,527 | 1,609 | 1,639 | 1,605 | 1,634 |
| TL (° C.) | N.A. | N.A. | N.A. | 943 | N.A. | N.A. | 961 | 965 | 1,016 | 1,005 |
| logη at TL (dPa · s) | N.A. | N.A. | N.A. | 6.69 | N.A. | N.A. | N.A. | N.A. | N.A. | N.A. |
| Acid resistance (HCl 5 wt % 80° C. 24 h) | N.A. | 2.4 | N.A. | 33.3< | 0.1 | 0 | 43.2 | 48.0 | 34.1 | 31.4 |
| Alkali resistance (NaOH 5 wt % 80° C. 6 h) | N.A. | 0.2 | N.A. | 0.6 | 0.6 | 0.6 | 0.5 | 0.6 | 0.5 | 0.5 |
| E (GPa) | 76 | 73 | 77 | 76 | 76 | 74 | 77 | 76 | 77 | 76 |
| $K_{IC}$ (MPa · m^0.5) | N.A. | N.A. | N.A. | N.A. | N.A. | N.A. | N.A. | N.A. | N.A. | N.A. |
| $CS_K$ (MPa) | N.A. | N.A. | N.A. | N.A. | N.A. | N.A. | 1,073 | 1,020 | 1,058 | 1,024 |
| DOL_ZERO_K (μm) | N.A. | N.A. | N.A. | N.A. | N.A. | N.A. | 30.5 | 32.1 | 26.1 | 30.3 |
| $CS_{Na}$ (MPa) | N.A. | N.A. | N.A. | N.A. | N.A. | N.A. | 229 | 213 | 235 | 236 |
| DOL_ZERO_Na (μm) | N.A. | N.A. | N.A. | N.A. | N.A. | N.A. | 108.0 | 117.5 | 115.9 | 115.1 |

TABLE 9

| (mol %) | No. 81 | No. 82 | No. 83 | No. 84 | No. 85 | No. 86 | No. 87 | No. 88 | No. 89 | No. 90 |
|---|---|---|---|---|---|---|---|---|---|---|
| $SiO_2$ | 64.24 | 64.61 | 64.61 | 62.99 | 63.58 | 63.58 | 63.58 | 62.58 | 66.26 | 66.26 |
| $Al_2O_3$ | 17.81 | 17.81 | 18.81 | 17.81 | 16.55 | 16.55 | 15.55 | 17.55 | 16.25 | 16.25 |
| $B_2O_3$ | 0.00 | 0.10 | 0.10 | 0.10 | 0.00 | 0.00 | 0.00 | 0.00 | 0.10 | 0.10 |
| $Li_2O$ | 6.34 | 6.34 | 7.34 | 8.90 | 9.19 | 7.19 | 8.69 | 8.19 | 5.20 | 5.70 |
| $Na_2O$ | 11.10 | 9.85 | 7.85 | 8.90 | 7.09 | 9.09 | 8.59 | 8.09 | 10.50 | 10.00 |
| $K_2O$ | 0.00 | 1.25 | 1.25 | 1.25 | 0.52 | 0.52 | 0.52 | 0.52 | 1.25 | 1.25 |
| MgO | 0.00 | 0.00 | 0.00 | 0.00 | 0.33 | 0.33 | 0.33 | 0.33 | 0.00 | 0.00 |
| CaO | 0.00 | 0.00 | 0.00 | 0.00 | 0.00 | 0.00 | 0.00 | 0.00 | 0.00 | 0.00 |
| SrO | 0.00 | 0.00 | 0.00 | 0.00 | 0.00 | 0.00 | 0.00 | 0.00 | 0.00 | 0.00 |
| BaO | 0.00 | 0.00 | 0.00 | 0.00 | 0.00 | 0.00 | 0.00 | 0.00 | 0.00 | 0.00 |
| $ZrO_2$ | 0.00 | 0.00 | 0.00 | 0.00 | 0.00 | 0.00 | 0.00 | 0.00 | 0.00 | 0.00 |
| $Y_2O_3$ | 0.00 | 0.00 | 0.00 | 0.00 | 0.00 | 0.00 | 0.00 | 0.00 | 0.00 | 0.00 |
| ZnO | 0.00 | 0.00 | 0.00 | 0.00 | 0.00 | 0.00 | 0.00 | 0.00 | 0.00 | 0.00 |
| $P_2O_5$ | 0.47 | 0.00 | 0.00 | 0.00 | 2.70 | 2.70 | 2.70 | 2.70 | 0.40 | 0.40 |
| $SnO_2$ | 0.04 | 0.04 | 0.04 | 0.04 | 0.04 | 0.04 | 0.04 | 0.04 | 0.04 | 0.04 |
| $Fe_2O_3$ | 0.01 | 0.01 | 0.01 | 0.01 | 0.01 | 0.01 | 0.01 | 0.01 | 0.01 | 0.01 |
| $TiO_2$ | 0.00 | 0.00 | 0.00 | 0.00 | 0.00 | 0.00 | 0.00 | 0.00 | 0.00 | 0.00 |
| Cl | 0.01 | 0.01 | 0.01 | 0.01 | 0.01 | 0.01 | 0.01 | 0.01 | 0.01 | 0.01 |
| Li/(Na + K) | 0.57 | 0.57 | 0.81 | 0.88 | 1.21 | 0.75 | 0.95 | 0.95 | 0.44 | 0.51 |
| (Na + K)/Li | 1.75 | 1.75 | 1.24 | 1.14 | 0.83 | 1.34 | 1.05 | 1.05 | 2.26 | 1.97 |
| Li + Na + K | 17.44 | 17.44 | 16.44 | 19.06 | 16.80 | 16.80 | 17.80 | 16.80 | 16.95 | 16.95 |
| Li/P | 13.48 | — | — | — | 3.40 | 2.66 | 3.22 | 3.03 | 13.00 | 14.25 |
| P/Li | 0.07 | 0.00 | 0.00 | 0.00 | 0.29 | 0.38 | 0.31 | 0.33 | 0.08 | 0.07 |
| (Na − Li)/ | 0.26 | 0.20 | 0.03 | 0.00 | −0.11 | 0.10 | −0.01 | 0.00 | 0.32 | 0.26 |

TABLE 9-continued

| (mol %) | No. 81 | No. 82 | No. 83 | No. 84 | No. 85 | No. 86 | No. 87 | No. 88 | No. 89 | No. 90 |
|---|---|---|---|---|---|---|---|---|---|---|
| (Al + B + P) | | | | | | | | | | |
| (B + Na – P)/ (Al + Li) | 0.44 | 0.41 | 0.30 | 0.34 | 0.17 | 0.27 | 0.24 | 0.21 | 0.48 | 0.44 |
| Si + 1.2P – 3Al – 2Li – 1.5Na – K – B | −17.96 | −17.63 | −19.63 | −22.95 | −12.37 | −11.37 | −10.62 | −15.87 | −9.51 | −9.76 |
| $\rho$ (g/cm³) | 2.424 | 2.425 | 2.424 | N.A. | 2.402 | 2.407 | 2.408 | 2.409 | 2.416 | 2.414 |
| $\alpha_{30\text{-}380°\,C.}$ (×10⁻⁷/° C.) | 84.8 | 86.6 | 77.5 | 88.4 | 79.0 | 82.0 | 84.0 | 79.7 | 87.4 | 86.4 |
| Ts (° C.) | 949 | 936 | 954 | N.A. | N.A. | 915 | N.A. | 915 | 917 | 913 |
| $10^{2.5}$ dPa · s (° C.) | 1,617 | 1,616 | 1,602 | 1,556 | 1,589 | 1,610 | 1,575 | N.A. | 1,644 | 1,648 |
| TL (° C.) | 1,087 | 1,080 | 1,270< | N.A. | 1,180 | 1,092 | 1,107 | 1,136 | 990 | 1,034 |
| logη at TL (dPa · s) | N.A. | 5.91 | N.A. | N.A. | N.A. | 5.60 | N.A. | N.A. | N.A. | 6.24 |
| Acid resistance (HCl 5 wt % 80° C. 24 h) | 31.9 | 34.4 | 34.9 | >100 | 4.1 | 4.3 | 2.2 | 16.6 | 12.0 | 8.4 |
| Alkali resistance (NaOH 5 wt % 80° C. 6 h) | N.A. | 0.6 | 1.4 | 0.0 | 0.8 | 0.7 | 0.7 | 0.9 | 0.6 | 0.6 |
| E (GPa) | 78 | 78 | 80 | N.A. | 77 | 76 | 77 | 77 | 76 | 76 |
| $K_{1C}$ (MPa · m^{0.5}) | N.A. | N.A. | N.A. | N.A. | N.A. | N.A. | N.A. | N.A. | N.A. | N.A. |
| $CS_K$ (MPa) | 1,315 | 1,273 | 1,319 | 1,071 | 1,059 | 1,074 | 967 | 1,138 | 1,045 | 1,039 |
| DOL_ZERO$_K$ (μm) | 26.9 | 31.1 | 22.6 | 17.3 | 23.4 | 30.1 | 24.9 | 25.0 | 38.8 | 37.0 |
| $CS_{Na}$ (MPa) | 281 | 294 | 352 | 401 | 388 | 280 | 288 | 339 | 240 | 260 |
| DOL_ZERO$_{Na}$ (μm) | 134.0 | 116.0 | 108.4 | 87.0 | 113.8 | 122.3 | 120.5 | 111.5 | 121.2 | 129.4 |

TABLE 10

| (mol %) | No. 91 | No. 92 | No. 93 | No. 94 | No. 95 | No. 96 | No. 97 | No. 98 | No. 99 | No. 100 |
|---|---|---|---|---|---|---|---|---|---|---|
| $SiO_2$ | 66.26 | 65.76 | 63.36 | 64.36 | 63.36 | 63.36 | 63.50 | 63.50 | 63.50 | 63.50 |
| $Al_2O_3$ | 16.25 | 16.25 | 17.81 | 17.81 | 17.81 | 17.81 | 15.56 | 17.56 | 15.56 | 14.56 |
| $B_2O_3$ | 0.10 | 0.10 | 0.10 | 0.10 | 0.10 | 0.10 | 0.10 | 0.10 | 0.10 | 0.10 |
| $Li_2O$ | 4.70 | 4.70 | 8.34 | 8.34 | 8.84 | 8.34 | 8.10 | 6.10 | 6.10 | 6.10 |
| $Na_2O$ | 11.00 | 11.50 | 9.10 | 8.10 | 8.60 | 8.60 | 8.00 | 8.00 | 10.00 | 11.00 |
| $K_2O$ | 1.25 | 1.25 | 1.25 | 1.25 | 1.25 | 1.75 | 2.15 | 2.15 | 2.15 | 2.15 |
| MgO | 0.00 | 0.00 | 0.00 | 0.00 | 0.00 | 0.00 | 0.00 | 0.00 | 0.00 | 0.00 |
| CaO | 0.00 | 0.00 | 0.00 | 0.00 | 0.00 | 0.00 | 0.00 | 0.00 | 0.00 | 0.00 |
| SrO | 0.00 | 0.00 | 0.00 | 0.00 | 0.00 | 0.00 | 0.00 | 0.00 | 0.00 | 0.00 |
| BaO | 0.00 | 0.00 | 0.00 | 0.00 | 0.00 | 0.00 | 0.00 | 0.00 | 0.00 | 0.00 |
| $ZrO_2$ | 0.00 | 0.00 | 0.00 | 0.00 | 0.00 | 0.00 | 0.00 | 0.00 | 0.00 | 0.00 |
| $Y_2O_3$ | 0.00 | 0.00 | 0.00 | 0.00 | 0.00 | 0.00 | 0.00 | 0.00 | 0.00 | 0.00 |
| ZnO | 0.00 | 0.00 | 0.00 | 0.00 | 0.00 | 0.00 | 0.00 | 0.00 | 0.00 | 0.00 |
| $P_2O_5$ | 0.40 | 0.40 | 0.00 | 0.00 | 0.00 | 0.00 | 2.55 | 2.55 | 2.55 | 2.55 |
| $SnO_2$ | 0.04 | 0.04 | 0.04 | 0.04 | 0.04 | 0.04 | 0.04 | 0.04 | 0.04 | 0.04 |
| $Fe_2O_3$ | 0.01 | 0.01 | 0.01 | 0.01 | 0.01 | 0.01 | 0.01 | 0.01 | 0.01 | 0.01 |
| $TiO_2$ | 0.00 | 0.00 | 0.00 | 0.00 | 0.00 | 0.00 | 0.00 | 0.00 | 0.00 | 0.00 |
| Cl | 0.01 | 0.01 | 0.01 | 0.01 | 0.01 | 0.01 | 0.01 | 0.01 | 0.01 | 0.01 |
| Li/(Na + K) | 0.38 | 0.37 | 0.81 | 0.89 | 0.90 | 0.81 | 0.80 | 0.60 | 0.50 | 0.46 |
| (Na + K)/Li | 2.61 | 2.71 | 1.24 | 1.12 | 1.11 | 1.24 | 1.25 | 1.66 | 1.99 | 2.16 |
| Li + Na + K | 16.95 | 17.45 | 18.69 | 17.69 | 18.69 | 18.69 | 18.25 | 16.25 | 18.25 | 19.25 |
| Li/P | 11.75 | 11.75 | — | — | — | — | 3.18 | 2.39 | 2.39 | 2.39 |
| P/Li | 0.09 | 0.09 | 0.00 | 0.00 | 0.00 | 0.00 | 0.31 | 0.42 | 0.42 | 0.42 |
| (Na – Li)/ (Al + B + P) | 0.38 | 0.41 | 0.04 | −0.01 | −0.01 | 0.01 | −0.01 | 0.09 | 0.21 | 0.28 |
| (B + Na – P)/ (Al + Li) | 0.51 | 0.53 | 0.35 | 0.31 | 0.33 | 0.33 | 0.23 | 0.23 | 0.35 | 0.41 |
| Si + 1.2P – 3Al – 2Li – 1.5Na – K – B | −9.26 | −10.51 | −21.75 | −19.25 | −22.00 | −21.50 | −10.57 | −12.57 | −9.57 | −8.07 |
| $\rho$ (g/cm³) | 2.413 | 2.418 | 2.431 | 2.422 | 2.429 | 2.431 | 2.409 | 2.404 | 2.414 | 2.418 |
| $\alpha_{30\text{-}380°\,C.}$ (×10⁻⁷/° C.) | 87.9 | 89.5 | 86.3 | 84.1 | 86.9 | 87.9 | 87.9 | 82.6 | 91.4 | 93.7 |
| Ts (° C.) | 923 | 902 | N.A. | N.A. | N.A. | N.A. | N.A. | 938 | 860 | 880 |
| $10^{2.5}$ dPa · s (° C.) | 1,658 | 1,656 | 1,572 | 1,595 | 1,570 | 1,578 | 1,579 | 1,630 | 1,606 | 1,574 |

TABLE 10-continued

| (mol %) | No. 91 | No. 92 | No. 93 | No. 94 | No. 95 | No. 96 | No. 97 | No. 98 | No. 99 | No. 100 |
|---|---|---|---|---|---|---|---|---|---|---|
| TL (° C.) | 939 | 916 | 1,092 | 1,137 | 1,113 | 1,084 | 1,020 | 1,036 | 1,014> | 1,014> |
| logη at TL (dPa · s) | N.A. | N.A. | N.A. | 5.20 | N.A. | N.A. | N.A. | 6.41 | N.A. | N.A. |
| Acid resistance (HCl 5 wt % 80° C. 24 h) | 16.7 | 78.6< | 76.4< | 74.7< | 78.2< | 78.3< | 4.8 | 16.2 | 8.0 | 1.2 |
| Alkali resistance (NaOH 5 wt % 80° C. 6 h) | 0.6 | 0.6 | 0.6 | 0.6 | 0.6 | 0.5 | 0.8 | 0.9 | 0.8 | 0.6 |
| E (GPa) | 75 | 75 | 80 | 80 | 80 | 79 | 76 | 75 | 74 | 74 |
| $K_{1C}$ (MPa · m$^{0.5}$) | N.A. | N.A. | N.A. | N.A. | N.A. | N.A. | N.A. | N.A. | N.A. | N.A. |
| $CS_K$ (MPa) | 1,075 | 1,021 | 1,033 | 1,142 | 1,020 | 1,023 | 843 | 1,046 | 895 | N.A. |
| DOL_ZERO$_K$ (μm) | 39.2 | 37.5 | 25.3 | 27.3 | 24.7 | 27.4 | 40.7 | 44.4 | 46.9 | N.A. |
| $CS_{Na}$ (MPa) | 234 | 235 | 354 | 401 | 383 | 360 | 287 | 282 | 218 | N.A. |
| DOL_ZERO$_{Na}$ (μm) | 114.9 | 113.2 | 119.5 | 113.8 | 100.6 | 104.9 | 113.8 | 113.0 | 108.3 | N.A. |

TABLE 11

| (mol %) | No. 101 | No. 102 | No. 103 | No. 104 | No. 105 | No. 106 | No. 107 | No. 108 | No. 109 | No. 110 |
|---|---|---|---|---|---|---|---|---|---|---|
| $SiO_2$ | 62.89 | 62.89 | 62.89 | 62.89 | 62.96 | 63.36 | 62.96 | 62.96 | 65.65 | 64.10 |
| $Al_2O_3$ | 17.81 | 18.81 | 17.81 | 16.81 | 18.81 | 18.81 | 18.81 | 18.10 | 17.56 | 18.10 |
| $B_2O_3$ | 0.10 | 0.10 | 0.10 | 0.10 | 0.10 | 0.10 | 0.10 | 0.10 | 0.10 | 0.10 |
| $Li_2O$ | 8.34 | 7.34 | 7.34 | 8.34 | 7.34 | 7.34 | 7.34 | 8.72 | 6.10 | 6.33 |
| $Na_2O$ | 9.10 | 9.10 | 10.10 | 10.10 | 8.60 | 8.60 | 8.60 | 7.93 | 8.00 | 8.24 |
| $K_2O$ | 1.25 | 1.25 | 1.25 | 1.25 | 0.75 | 0.75 | 0.75 | 0.75 | 2.15 | 1.69 |
| MgO | 0.00 | 0.00 | 0.00 | 0.00 | 1.00 | 1.00 | 0.00 | 0.00 | 0.00 | 0.00 |
| CaO | 0.00 | 0.00 | 0.00 | 0.00 | 0.00 | 0.00 | 0.00 | 0.00 | 0.00 | 0.00 |
| SrO | 0.00 | 0.00 | 0.00 | 0.00 | 0.00 | 0.00 | 0.00 | 0.00 | 0.00 | 0.00 |
| BaO | 0.00 | 0.00 | 0.00 | 0.00 | 0.00 | 0.00 | 0.00 | 0.00 | 0.00 | 0.00 |
| $ZrO_2$ | 0.00 | 0.00 | 0.00 | 0.00 | 0.00 | 0.00 | 0.00 | 0.00 | 0.00 | 0.00 |
| $Y_2O_3$ | 0.00 | 0.00 | 0.00 | 0.00 | 0.00 | 0.00 | 0.00 | 0.00 | 0.00 | 0.00 |
| ZnO | 0.00 | 0.00 | 0.00 | 0.00 | 0.00 | 0.00 | 0.00 | 0.00 | 0.00 | 0.00 |
| $P_2O_5$ | 0.47 | 0.47 | 0.47 | 0.47 | 0.40 | 0.00 | 1.40 | 1.40 | 0.40 | 1.40 |
| $SnO_2$ | 0.04 | 0.04 | 0.04 | 0.04 | 0.04 | 0.04 | 0.04 | 0.04 | 0.04 | 0.04 |
| $Fe_2O_3$ | 0.01 | 0.01 | 0.01 | 0.01 | 0.01 | 0.01 | 0.01 | 0.01 | 0.01 | 0.01 |
| $TiO_2$ | 0.00 | 0.00 | 0.00 | 0.00 | 0.00 | 0.00 | 0.00 | 0.00 | 0.00 | 0.00 |
| Cl | 0.01 | 0.01 | 0.01 | 0.01 | 0.01 | 0.01 | 0.01 | 0.01 | 0.01 | 0.01 |
| Li/(Na + K) | 0.81 | 0.71 | 0.65 | 0.73 | 0.79 | 0.79 | 0.79 | 1.00 | 0.60 | 0.64 |
| (Na + K)/Li | 1.24 | 1.41 | 1.55 | 1.36 | 1.27 | 1.27 | 1.27 | 1.00 | 1.66 | 1.57 |
| Li + Na + K | 18.69 | 17.69 | 18.69 | 19.69 | 16.69 | 16.69 | 16.69 | 17.40 | 16.25 | 16.26 |
| Li/P | 17.74 | 15.62 | 15.62 | 17.74 | 18.35 | — | 5.24 | 6.23 | 15.25 | 4.52 |
| P/Li | 0.06 | 0.06 | 0.06 | 0.06 | 0.05 | 0.00 | 0.19 | 0.16 | 0.07 | 0.22 |
| (Na − Li)/(Al + B + P) | 0.04 | 0.09 | 0.15 | 0.10 | 0.07 | 0.07 | 0.06 | −0.04 | 0.11 | 0.10 |
| (B + Na − P)/(Al + Li) | 0.33 | 0.33 | 0.39 | 0.39 | 0.32 | 0.33 | 0.28 | 0.25 | 0.33 | 0.28 |
| Si + 1.2P − 3Al − 2Li − 1.5Na − K − B | −21.65 | −22.65 | −21.15 | −20.15 | −21.42 | −21.50 | −20.22 | −19.84 | −13.00 | −15.33 |
| ρ (g/cm$^3$) | 2.427 | 2.426 | 2.430 | 2.434 | 2.430 | 2.433 | 2.417 | 2.413 | 2.417 | 2.414 |
| $\alpha_{30-380° C.}$ (×10$^{-7}$/° C.) | 87.9 | 82.6 | 91.4 | 93.7 | 78.1 | 79.0 | 79.0 | 81.4 | 81.9 | 80.2 |
| Ts (° C.) | N.A. | 930 | 887 | N.A. | 921 | 927 | 937 | 915 | 974 | 963 |
| 10$^{2.5}$ dPa · s (° C.) | 1,569 | 1,584 | 1,584 | 1,556 | 1,571 | 1,573 | 1,594 | 1,574 | 1,653 | 1,636 |
| TL (° C.) | 1,110 | 1,086 | 1,059 | 1,032 | N.A. | N.A. | N.A. | N.A. | 1,173 | 1,204 |
| logη at TL (dPa · s) | N.A. | 5.71 | N.A. | N.A. | N.A. | N.A. | N.A. | N.A. | 5.40 | 5.00 |
| Acid resistance (HCl 5 wt % 80° C. 24 h) | 67.5 | 77.1 | 76.6 | 61.0 | 55.7 | 51.8 | 38.4 | 36.0 | 35.9 | 33.8 |
| Alkali resistance (NaOH 5 wt % 80° C. 6 h) | 0.5 | 0.7 | 0.5 | 0.5 | 0.8 | 0.7 | 1.0 | 0.8 | 0.7 | 0.9 |
| E (GPa) | 79 | 79 | 78 | 79 | 80 | 81 | 78 | 78 | 78 | 77 |
| $K_{1C}$ (MPa · m$^{0.5}$) | N.A. | N.A. | N.A. | N.A. | N.A. | N.A. | N.A. | N.A. | N.A. | N.A. |
| $CS_K$ (MPa) | 1,055 | 1,176 | 1,056 | 894 | 1,301 | 1,345 | 1,227 | 1,160 | 1,195 | 1,171 |
| DOL_ZERO$_K$ (μm) | 29.0 | 29.4 | 29.6 | 25.3 | 18.7 | 18.1 | 21.3 | 21.8 | 31.5 | 32.7 |

TABLE 11-continued

| (mol %) | No. 101 | No. 102 | No. 103 | No. 104 | No. 105 | No. 106 | No. 107 | No. 108 | No. 109 | No. 110 |
|---|---|---|---|---|---|---|---|---|---|---|
| $CS_{Na}$ (MPa) | 354 | 313 | 295 | 330 | 345 | 362 | 324 | 351 | 290 | 303 |
| $DOL\_ZERO_{Na}$ (μm) | 108.5 | 121.7 | 124.0 | 102.4 | 108.4 | 97.4 | 108.6 | 123.7 | 108.7 | 104.6 |

TABLE 12

| (mol %) | No. 111 | No. 112 | No. 113 | No. 114 | No. 115 | No. 116 | No. 117 | No. 118 | No. 119 | No. 120 |
|---|---|---|---|---|---|---|---|---|---|---|
| $SiO_2$ | 64.10 | 62.60 | 64.50 | 64.50 | 64.50 | 64.50 | 64.50 | 64.50 | 64.50 | 64.50 |
| $Al_2O_3$ | 18.10 | 18.10 | 18.50 | 18.50 | 18.50 | 18.50 | 18.50 | 18.50 | 18.50 | 18.50 |
| $B_2O_3$ | 0.10 | 0.10 | 0.10 | 0.10 | 0.10 | 0.10 | 0.10 | 0.10 | 0.10 | 0.10 |
| $Li_2O$ | 6.33 | 6.33 | 6.00 | 7.00 | 8.00 | 6.00 | 7.00 | 8.00 | 6.00 | 7.00 |
| $Na_2O$ | 8.24 | 8.94 | 6.00 | 5.00 | 4.00 | 7.00 | 6.00 | 5.00 | 8.00 | 7.00 |
| $K_2O$ | 0.04 | 0.84 | 0.76 | 0.76 | 0.76 | 0.76 | 0.76 | 0.76 | 0.76 | 0.76 |
| $MgO$ | 0.00 | 0.00 | 0.10 | 0.10 | 0.10 | 0.10 | 0.10 | 0.10 | 0.10 | 0.10 |
| $CaO$ | 0.00 | 0.00 | 0.00 | 0.00 | 0.00 | 0.00 | 0.00 | 0.00 | 0.00 | 0.00 |
| $SrO$ | 0.00 | 0.00 | 0.00 | 0.00 | 0.00 | 0.00 | 0.00 | 0.00 | 0.00 | 0.00 |
| $BaO$ | 0.00 | 0.00 | 0.00 | 0.00 | 0.00 | 0.00 | 0.00 | 0.00 | 0.00 | 0.00 |
| $ZrO_2$ | 0.00 | 0.00 | 0.00 | 0.00 | 0.00 | 0.00 | 0.00 | 0.00 | 0.00 | 0.00 |
| $Y_2O_3$ | 0.00 | 0.00 | 0.00 | 0.00 | 0.00 | 0.00 | 0.00 | 0.00 | 0.00 | 0.00 |
| $ZnO$ | 0.00 | 0.00 | 0.00 | 0.00 | 0.00 | 0.00 | 0.00 | 0.00 | 0.00 | 0.00 |
| $P_2O_5$ | 3.05 | 3.05 | 4.00 | 4.00 | 4.00 | 3.00 | 3.00 | 3.00 | 2.00 | 2.00 |
| $SnO_2$ | 0.04 | 0.04 | 0.04 | 0.04 | 0.04 | 0.04 | 0.04 | 0.04 | 0.04 | 0.04 |
| $Fe_2O_3$ | 0.01 | 0.01 | 0.01 | 0.01 | 0.01 | 0.01 | 0.01 | 0.01 | 0.01 | 0.01 |
| $TiO_2$ | 0.00 | 0.00 | 0.00 | 0.00 | 0.00 | 0.00 | 0.00 | 0.00 | 0.00 | 0.00 |
| $Cl$ | 0.01 | 0.01 | 0.01 | 0.01 | 0.01 | 0.01 | 0.01 | 0.01 | 0.01 | 0.01 |
| $Li/(Na + K)$ | 0.76 | 0.65 | 0.89 | 1.22 | 1.68 | 0.77 | 1.04 | 1.39 | 0.68 | 0.90 |
| $(Na + K)/Li$ | 1.31 | 1.55 | 1.13 | 0.82 | 0.60 | 1.29 | 0.97 | 0.72 | 1.46 | 1.11 |
| $Li + Na + K$ | 14.61 | 16.11 | 12.76 | 12.76 | 12.76 | 13.76 | 13.76 | 13.76 | 14.76 | 14.76 |
| $Li/P$ | 2.08 | 2.08 | 1.50 | 1.75 | 2.00 | 2.00 | 2.33 | 2.67 | 3.00 | 3.50 |
| $P/Li$ | 0.48 | 0.48 | 0.67 | 0.57 | 0.50 | 0.50 | 0.43 | 0.38 | 0.33 | 0.29 |
| $(Na - Li)/(Al + B + P)$ | 0.09 | 0.12 | 0.00 | −0.09 | −0.18 | 0.05 | −0.05 | −0.14 | 0.10 | 0.00 |
| $(B + Na - P)/(Al + Li)$ | 0.22 | 0.25 | 0.09 | 0.04 | 0.00 | 0.17 | 0.12 | 0.08 | 0.25 | 0.20 |
| $Si + 1.2P - 3Al - 2Li - 1.5Na - K - B$ | −11.70 | −15.05 | −8.06 | −8.56 | −9.06 | −10.76 | −11.26 | −11.76 | −13.46 | −13.96 |
| $\rho$ (g/cm³) | 2.396 | 2.405 | 2.381 | 2.379 | 2.377 | 2.395 | 2.393 | 2.391 | 2.407 | 2.405 |
| $\alpha_{30\text{-}380°\ C.}$ ($\times 10^{-7}/°$ C.) | 71.2 | 78.7 | 61.7 | 60.2 | 59.5 | 66.8 | 65.2 | 64.0 | 71.9 | 70.2 |
| Ts (° C.) | 966 | 947 | 981 | 972 | 966 | 976 | 968 | 961 | 974 | 965 |
| $10^{2.5}$ dPa · s (° C.) | 1,635 | 1,642 | 1,644 | 1,632 | 1,618 | 1,636 | 1,623 | 1,612 | 1,630 | 1,618 |
| TL (° C.) | 1,261 | 1,086 | N.A. | N.A. | N.A. | N.A. | N.A. | N.A. | N.A. | N.A. |
| logη at TL (dPa · s) | 4.60 | 5.93 | N.A. | N.A. | N.A. | N.A. | N.A. | N.A. | N.A. | N.A. |
| Acid resistance (HCl 5 wt % 80° C. 24 h) | 3.9 | 14.1 | 1.6 | 1.9 | 1.5 | 3.0 | 2.5 | 2.3 | 5.2 | 4.3 |
| Alkali resistance (NaOH 5 wt % 80° C. 6 h) | 1.2 | 1.1 | N.A. | N.A. | N.A. | N.A. | N.A. | N.A. | N.A. | N.A. |
| E (GPa) | 76 | 75 | 76 | 77 | 77 | 77 | 77 | 78 | 77 | 78 |
| $K_{1C}$ (MPa · m⁰·⁵) | N.A. | N.A. | N.A. | N.A. | N.A. | N.A. | N.A. | N.A. | N.A. | N.A. |
| $CS_K$ (MPa) | 1,128 | 1,106 | 963 | 962 | 963 | 1,047 | 1,049 | 1,055 | 1,149 | 1,141 |
| $DOL\_ZERO_K$ (μm) | 21.8 | 28.9 | 20.5 | 21.1 | 18.6 | 24.2 | 21.9 | 18.6 | 24.6 | 22.0 |
| $CS_{Na}$ (MPa) | 276 | 262 | 202 | 287 | 286 | 223 | 276 | 286 | 234 | 276 |
| $DOL\_ZERO_{Na}$ (μm) | 132.6 | 122.6 | 134.4 | 119.2 | 125.3 | 132.8 | 124.9 | 123.6 | 128.1 | 123.7 |

TABLE 13

| (mol %) | No. 121 | No. 122 | No. 123 | No. 124 | No. 125 | No. 126 | No. 127 | No. 128 | No. 129 | No. 130 |
|---|---|---|---|---|---|---|---|---|---|---|
| $SiO_2$ | 64.50 | 64.50 | 64.50 | 64.50 | 64.50 | 64.50 | 64.50 | 64.50 | 64.50 | 64.50 |
| $Al_2O_3$ | 18.50 | 18.50 | 18.50 | 18.50 | 18.50 | 18.50 | 18.50 | 18.50 | 18.50 | 18.50 |
| $B_2O_3$ | 0.10 | 0.10 | 0.10 | 0.10 | 0.10 | 0.10 | 0.10 | 0.10 | 0.10 | 0.10 |
| $Li_2O$ | 8.00 | 6.38 | 7.38 | 8.38 | 6.38 | 7.38 | 8.38 | 6.38 | 7.38 | 8.38 |
| $Na_2O$ | 6.00 | 6.38 | 5.38 | 4.38 | 7.38 | 6.38 | 5.38 | 8.38 | 7.38 | 6.38 |
| $K_2O$ | 0.76 | 0.00 | 0.00 | 0.00 | 0.00 | 0.00 | 0.00 | 0.00 | 0.00 | 0.00 |
| $MgO$ | 0.10 | 0.10 | 0.10 | 0.10 | 0.10 | 0.10 | 0.10 | 0.10 | 0.10 | 0.10 |

TABLE 13-continued

| (mol %) | No. 121 | No. 122 | No. 123 | No. 124 | No. 125 | No. 126 | No. 127 | No. 128 | No. 129 | No. 130 |
|---|---|---|---|---|---|---|---|---|---|---|
| CaO | 0.00 | 0.00 | 0.00 | 0.00 | 0.00 | 0.00 | 0.00 | 0.00 | 0.00 | 0.00 |
| SrO | 0.00 | 0.00 | 0.00 | 0.00 | 0.00 | 0.00 | 0.00 | 0.00 | 0.00 | 0.00 |
| BaO | 0.00 | 0.00 | 0.00 | 0.00 | 0.00 | 0.00 | 0.00 | 0.00 | 0.00 | 0.00 |
| $ZrO_2$ | 0.00 | 0.00 | 0.00 | 0.00 | 0.00 | 0.00 | 0.00 | 0.00 | 0.00 | 0.00 |
| $Y_2O_3$ | 0.00 | 0.00 | 0.00 | 0.00 | 0.00 | 0.00 | 0.00 | 0.00 | 0.00 | 0.00 |
| ZnO | 0.00 | 0.00 | 0.00 | 0.00 | 0.00 | 0.00 | 0.00 | 0.00 | 0.00 | 0.00 |
| $P_2O_5$ | 2.00 | 4.00 | 4.00 | 4.00 | 3.00 | 3.00 | 3.00 | 2.00 | 2.00 | 2.00 |
| $SnO_2$ | 0.04 | 0.04 | 0.04 | 0.04 | 0.04 | 0.04 | 0.04 | 0.04 | 0.04 | 0.04 |
| $Fe_2O_3$ | 0.01 | 0.01 | 0.01 | 0.01 | 0.01 | 0.01 | 0.01 | 0.01 | 0.01 | 0.01 |
| $TiO_2$ | 0.00 | 0.00 | 0.00 | 0.00 | 0.00 | 0.00 | 0.00 | 0.00 | 0.00 | 0.00 |
| Cl | 0.01 | 0.01 | 0.01 | 0.01 | 0.01 | 0.01 | 0.01 | 0.01 | 0.01 | 0.01 |
| Li/(Na + K) | 1.18 | 1.00 | 1.37 | 1.91 | 0.86 | 1.16 | 1.56 | 0.76 | 1.00 | 1.31 |
| (Na + K)/Li | 0.85 | 1.00 | 0.73 | 0.52 | 1.16 | 0.86 | 0.64 | 1.31 | 1.00 | 0.76 |
| Li + Na + K | 14.76 | 12.76 | 12.76 | 12.76 | 13.76 | 13.76 | 13.76 | 14.76 | 14.76 | 14.76 |
| Li/P | 4.00 | 1.60 | 1.85 | 2.10 | 2.13 | 2.46 | 2.79 | 3.19 | 3.69 | 4.19 |
| P/Li | 0.25 | 0.63 | 0.54 | 0.48 | 0.47 | 0.41 | 0.36 | 0.31 | 0.27 | 0.24 |
| (Na − Li)/ (Al + B + P) | −0.10 | 0.00 | −0.09 | −0.18 | 0.05 | −0.05 | −0.14 | 0.10 | 0.00 | −0.10 |
| (B + Na − P)/ (Al + Li) | 0.15 | 0.10 | 0.06 | 0.02 | 0.18 | 0.13 | 0.09 | 0.26 | 0.21 | 0.17 |
| Si + 1.2P − 3Al − 2Li − 1.5Na − K − B | −14.46 | −8.63 | −9.13 | −9.63 | −11.33 | −11.83 | −12.33 | −14.03 | −14.53 | −15.03 |
| ρ (g/cm³) | 2.402 | N.A. | N.A. | N.A. | N.A. | N.A. | N.A. | N.A. | N.A. | N.A. |
| $\alpha_{30\text{-}380°\,C.}$ (×10⁻⁷/° C.) | 69 | N.A. | N.A. | N.A. | N.A. | N.A. | N.A. | N.A. | N.A. | N.A. |
| Ts (° C.) | 957 | N.A. | N.A. | N.A. | N.A. | N.A. | N.A. | N.A. | N.A. | N.A. |
| $10^{2.5}$ dPa · s (° C.) | 1,609 | N.A. | N.A. | N.A. | N.A. | N.A. | N.A. | N.A. | N.A. | N.A. |
| TL (° C.) | N.A. | N.A. | N.A. | N.A. | N.A. | N.A. | N.A. | N.A. | N.A. | N.A. |
| logη at TL (dPa · s) | N.A. | N.A. | N.A. | N.A. | N.A. | N.A. | N.A. | N.A. | N.A. | N.A. |
| Acid resistance (HCl 5 wt % 80° C. 24 h) | N.A. | N.A. | N.A. | N.A. | N.A. | N.A. | N.A. | N.A. | N.A. | N.A. |
| Alkali resistance (NaOH 5 wt % 80° C. 6 h) | N.A. | N.A. | N.A. | N.A. | N.A. | N.A. | N.A. | N.A. | N.A. | N.A. |
| E (GPa) | N.A. | N.A. | N.A. | N.A. | N.A. | N.A. | N.A. | N.A. | N.A. | N.A. |
| $K_{1C}$ (MPa · m⁰·⁵) | N.A. | N.A. | N.A. | N.A. | N.A. | N.A. | N.A. | N.A. | N.A. | N.A. |
| $CS_K$ (MPa) | 1,129 | N.A. | N.A. | N.A. | N.A. | N.A. | N.A. | N.A. | N.A. | N.A. |
| $DOL\_ZERO_K$ (µm) | 20.4 | N.A. | N.A. | N.A. | N.A. | N.A. | N.A. | N.A. | N.A. | N.A. |
| $CS_{Na}$ (MPa) | N.A. | N.A. | N.A. | N.A. | N.A. | N.A. | N.A. | N.A. | N.A. | N.A. |
| $DOL\_ZERO_{Na}$ (µm) | N.A. | N.A. | N.A. | N.A. | N.A. | N.A. | N.A. | N.A. | N.A. | N.A. |

TABLE 14

| (mol %) | No. 131 | No. 132 | No. 133 | No. 134 | No. 135 | No. 136 | No. 137 | No. 138 | No. 139 | No. 140 |
|---|---|---|---|---|---|---|---|---|---|---|
| $SiO_2$ | 61.30 | 61.00 | 60.20 | 59.80 | 59.80 | 60.50 | 61.00 | 60.50 | 61.00 | 60.50 |
| $Al_2O_3$ | 15.40 | 15.00 | 15.40 | 16.50 | 15.40 | 15.00 | 15.00 | 15.00 | 15.00 | 15.00 |
| $B_2O_3$ | 0.10 | 0.10 | 0.10 | 0.10 | 0.10 | 0.10 | 0.10 | 0.10 | 0.10 | 0.10 |
| $Li_2O$ | 7.80 | 8.00 | 8.00 | 7.80 | 7.80 | 8.00 | 9.00 | 9.00 | 7.00 | 7.00 |
| $Na_2O$ | 7.00 | 7.80 | 7.80 | 7.00 | 7.00 | 7.80 | 6.80 | 6.80 | 8.80 | 8.80 |
| $K_2O$ | 2.50 | 1.50 | 1.50 | 2.50 | 2.50 | 1.50 | 1.50 | 1.50 | 1.50 | 1.50 |
| MgO | 2.36 | 2.06 | 2.46 | 3.46 | 2.36 | 2.06 | 2.06 | 2.06 | 2.06 | 2.06 |
| CaO | 0.00 | 0.00 | 0.00 | 0.00 | 0.00 | 0.00 | 0.00 | 0.00 | 0.00 | 0.00 |
| SrO | 0.00 | 0.00 | 0.00 | 0.00 | 0.00 | 0.00 | 0.00 | 0.00 | 0.00 | 0.00 |
| BaO | 0.00 | 0.00 | 0.00 | 0.00 | 0.00 | 0.00 | 0.00 | 0.00 | 0.00 | 0.00 |
| $ZrO_2$ | 0.00 | 0.00 | 0.00 | 0.00 | 0.00 | 0.00 | 0.00 | 0.00 | 0.00 | 0.00 |
| $Y_2O_3$ | 0.00 | 0.00 | 0.00 | 0.00 | 0.00 | 0.00 | 0.00 | 0.00 | 0.00 | 0.00 |
| ZnO | 0.00 | 0.00 | 0.00 | 0.00 | 0.00 | 0.00 | 0.00 | 0.00 | 0.00 | 0.00 |
| $P_2O_5$ | 3.50 | 4.50 | 4.50 | 2.80 | 4.00 | 5.00 | 4.50 | 5.00 | 4.50 | 5.00 |
| $SnO_2$ | 0.04 | 0.04 | 0.04 | 0.04 | 0.04 | 0.04 | 0.04 | 0.04 | 0.04 | 0.04 |
| $Fe_2O_3$ | 0.01 | 0.01 | 0.01 | 0.01 | 0.01 | 0.01 | 0.01 | 0.01 | 0.01 | 0.01 |
| $TiO_2$ | 0.00 | 0.00 | 0.00 | 0.00 | 0.00 | 0.00 | 0.00 | 0.00 | 0.00 | 0.00 |
| Cl | 0.01 | 0.01 | 0.01 | 0.01 | 0.01 | 0.01 | 0.01 | 0.01 | 0.01 | 0.01 |
| Li/(Na + K) | 0.82 | 0.86 | 0.86 | 0.82 | 0.82 | 0.86 | 1.08 | 1.08 | 0.68 | 0.68 |
| (Na + K)/Li | 1.22 | 1.16 | 1.16 | 1.22 | 1.22 | 1.16 | 0.92 | 0.92 | 1.47 | 1.47 |
| Li + Na + K | 17.30 | 17.30 | 17.30 | 17.30 | 17.30 | 17.30 | 17.30 | 17.30 | 17.30 | 17.30 |

TABLE 14-continued

| (mol %) | No. 131 | No. 132 | No. 133 | No. 134 | No. 135 | No. 136 | No. 137 | No. 138 | No. 139 | No. 140 |
|---|---|---|---|---|---|---|---|---|---|---|
| Li/P | 2.23 | 1.78 | 1.78 | 2.79 | 1.95 | 1.60 | 2.00 | 1.80 | 1.56 | 1.40 |
| P/Li | 0.45 | 0.56 | 0.56 | 0.36 | 0.51 | 0.63 | 0.50 | 0.56 | 0.64 | 0.71 |
| (Na − Li)/ (Al + B + P) | −0.04 | −0.01 | −0.01 | −0.04 | −0.04 | −0.01 | −0.11 | −0.11 | 0.09 | 0.09 |
| (B + Na − P)/ (Al + Li) | 0.16 | 0.15 | 0.15 | 0.18 | 0.13 | 0.13 | 0.10 | 0.08 | 0.20 | 0.18 |
| Si + 1.2P − 3Al − 2Li − 1.5Na − K − B | −9.40 | −7.90 | −9.90 | −15.04 | −10.30 | −7.80 | −8.40 | −8.30 | −7.40 | −7.30 |
| ρ (g/cm$^3$) | 2.418 | 2.410 | 2.415 | 2.435 | 2.417 | 2.408 | 2.408 | 2.405 | 2.413 | 2.411 |
| $\alpha_{30\text{-}380°\,C.}$ (×10$^{-7}$/° C.) | 86.5 | 86.2 | 86.5 | 86.3 | 87.4 | 86.4 | 84.6 | 84.9 | 88.1 | 88.5 |
| Ts (° C.) | 883 | 875 | 873 | N.A. | 879 | 872 | 870 | 864 | 881 | 876 |
| 10$^{2.5}$ dPa · s (° C.) | 1,560 | 1,554 | 1,545 | 1,524 | 1,553 | 1,554 | 1,546 | 1,543 | 1,566 | 1,565 |
| TL (° C.) | 1,034 | 1,022 | N.A. | 1,040 | N.A. | 1,012 | 1,080 | 1,069 | 992 | 989 |
| logη at TL (dPa · s) | 5.56 | 5.47 | N.A. | 5.53 | N.A. | 5.46 | N.A. | N.A. | N.A. | N.A. |
| Acid resistance (HCl 5 wt % 80° C. 24 h) | 4.6 | 2.2 | 0.4 | 38.8 | N.A. | 2.3 | 1.8 | 2.1 | 2.2 | 2.4 |
| Alkali resistance (NaOH 5 wt % 80° C. 6 h) | N.A. | N.A. | 1.1 | N.A. | N.A. | N.A. | 1.0 | 1.1 | 1.2 | 1.2 |
| E (GPa) | 76 | 75 | N.A. | 79 | N.A. | 77 | 76 | 75 | 75 | 74 |
| K$_{1C}$ (MPa · m$^{0.5}$) | N.A. | N.A. | N.A. | N.A. | N.A. | N.A. | N.A. | N.A. | N.A. | N.A. |
| CS$_K$ (MPa) | 919 | 878 | 920 | 1,015 | 916 | 873 | 912 | 886 | 923 | 897 |
| DOL_ZERO$_K$ (μm) | 35.8 | 36.5 | 36.1 | 29.9 | 38.0 | 34.6 | 29.5 | 31.8 | 36.2 | 36.7 |
| CS$_{Na}$ (MPa) | 228 | 223 | N.A. | 257 | N.A. | 173 | 283 | 291 | 228 | 228 |
| DOL_ZERO$_{Na}$ (μm) | 108.5 | 123.2 | N.A. | 95.5 | N.A. | 123.5 | 122.0 | 119.1 | 117.8 | 111.7 |

TABLE 15

| (mol %) | No. 141 | No. 142 | No. 143 | No. 144 | No. 145 | No. 146 | No. 147 | No. 148 | No. 149 | No. 150 |
|---|---|---|---|---|---|---|---|---|---|---|
| SiO$_2$ | 58.44 | 61.24 | 68.18 | 68.18 | 61.28 | 60.38 | 68.18 | 70.18 | 61.38 | 60.28 |
| Al$_2$O$_3$ | 16.15 | 15.40 | 9.50 | 9.50 | 15.40 | 16.15 | 9.50 | 9.50 | 18.50 | 18.80 |
| B$_2$O$_3$ | 0.10 | 0.10 | 0.10 | 0.10 | 0.10 | 0.10 | 0.10 | 0.10 | 0.10 | 0.10 |
| Li$_2$O | 9.25 | 8.64 | 9.00 | 8.00 | 7.80 | 9.25 | 9.00 | 9.00 | 6.80 | 7.20 |
| Na$_2$O | 6.75 | 6.46 | 8.16 | 8.16 | 7.00 | 6.75 | 6.16 | 6.16 | 8.40 | 8.10 |
| K$_2$O | 0.75 | 2.50 | 3.00 | 3.00 | 2.50 | 0.75 | 3.00 | 3.00 | 0.30 | 0.45 |
| MgO | 4.00 | 2.40 | 2.00 | 3.00 | 2.36 | 2.06 | 4.00 | 2.00 | 0.50 | 0.50 |
| CaO | 0.00 | 0.00 | 0.00 | 0.00 | 0.00 | 0.00 | 0.00 | 0.00 | 0.00 | 0.00 |
| SrO | 0.00 | 0.00 | 0.00 | 0.00 | 0.00 | 0.00 | 0.00 | 0.00 | 0.00 | 0.00 |
| BaO | 0.00 | 0.00 | 0.00 | 0.00 | 0.00 | 0.00 | 0.00 | 0.00 | 0.00 | 0.00 |
| ZrO$_2$ | 0.00 | 0.00 | 0.00 | 0.00 | 0.00 | 0.00 | 0.00 | 0.00 | 0.00 | 0.00 |
| Y$_2$O$_3$ | 0.00 | 0.00 | 0.00 | 0.00 | 0.00 | 0.00 | 0.00 | 0.00 | 0.00 | 0.00 |
| ZnO | 0.00 | 0.00 | 0.00 | 0.00 | 0.00 | 0.00 | 0.00 | 0.00 | 0.00 | 0.00 |
| P$_2$O$_5$ | 4.50 | 3.20 | 0.00 | 0.00 | 3.50 | 4.50 | 0.00 | 0.00 | 3.96 | 4.30 |
| SnO$_2$ | 0.04 | 0.04 | 0.04 | 0.04 | 0.04 | 0.04 | 0.04 | 0.04 | 0.04 | 0.16 |
| Fe$_2$O$_3$ | 0.01 | 0.01 | 0.01 | 0.01 | 0.01 | 0.01 | 0.01 | 0.01 | 0.01 | 0.01 |
| TiO$_2$ | 0.00 | 0.00 | 0.00 | 0.00 | 0.00 | 0.00 | 0.00 | 0.00 | 0.00 | 0.00 |
| Cl | 0.01 | 0.01 | 0.01 | 0.01 | 0.01 | 0.01 | 0.01 | 0.01 | 0.01 | 0.10 |
| Li/(Na + K) | 1.23 | 0.96 | 0.81 | 0.72 | 0.82 | 1.23 | 0.98 | 0.98 | 0.78 | 0.84 |
| (Na + K)/Li | 0.81 | 1.04 | 1.24 | 1.40 | 1.22 | 0.81 | 1.02 | 1.02 | 1.28 | 1.19 |
| Li + Na + K | 16.75 | 17.60 | 20.16 | 19.16 | 17.30 | 16.75 | 18.16 | 18.16 | 15.50 | 15.75 |
| Li/P | 2.06 | 2.70 | — | — | 2.23 | 2.06 | — | — | 1.72 | 1.67 |
| P/Li | 0.49 | 0.37 | 0.00 | 0.00 | 0.45 | 0.49 | 0.00 | 0.00 | 0.58 | 0.60 |
| (Na − Li)/ (Al + B + P) | −0.12 | −0.12 | −0.09 | 0.02 | −0.04 | −0.12 | −0.30 | −0.30 | 0.07 | 0.04 |
| (B + Na − P)/ (Al + Li) | 0.09 | 0.14 | 0.45 | 0.47 | 0.16 | 0.09 | 0.34 | 0.34 | 0.18 | 0.15 |
| Si + 1.2P − 3Al − 2Li − 1.5Na − K − B | −14.09 | −10.69 | 6.34 | 8.34 | −9.42 | −12.15 | 9.34 | 11.34 | −15.97 | −18.06 |
| ρ (g/cm$^3$) | 2.425 | 2.420 | 2.428 | 2.426 | 2.418 | 2.409 | 2.424 | 2.410 | 2.402 | N.A. |
| $\alpha_{30\text{-}380°\,C.}$ (×10$^{-7}$/° C.) | 80.6 | 87.4 | 94.3 | 95.9 | 87.5 | 79.5 | 88.8 | 86.7 | 74.9 | N.A. |
| Ts (° C.) | N.A. | N.A. | 701 | 685 | 884 | N.A. | 713 | 713 | 931 | N.A. |
| 10$^{2.5}$ dPa · s (° C.) | 1,492 | 1,537 | 1,427 | 1,435 | 1,556 | 1,534 | 1,445 | 1,479 | 1,596 | N.A. |

TABLE 15-continued

| (mol %) | No. 141 | No. 142 | No. 143 | No. 144 | No. 145 | No. 146 | No. 147 | No. 148 | No. 149 | No. 150 |
|---|---|---|---|---|---|---|---|---|---|---|
| TL (° C.) | 1,117 | 1,055 | 879 | 884 | N.A. | N.A. | N.A. | N.A. | 1,080 | N.A. |
| logη at TL (dPa · s) | 4.46 | 5.28 | N.A. | N.A. | N.A. | N.A. | N.A. | N.A. | 5.82 | N.A. |
| Acid resistance (HCl 5 wt % 80° C. 24 h) | 8.9 | 3.9 | 0.0 | 0.0 | 3.8 | 5.4 | 0.0 | 0.0 | 1.7 | N.A. |
| Alkali resistance (NaOH 5 wt % 80° C. 6 h) | 1.3 | 1.0 | 0.6 | 0.6 | 0.9 | 1.1 | 0.5 | 0.6 | 1.2 | N.A. |
| E (GPa) | 78 | 77 | 78 | 77 | 76 | 77 | 79 | 78 | N.A. | N.A. |
| $K_{1C}$ (MPa · m$^{0.5}$) | N.A. | N.A. | N.A. | N.A. | N.A. | N.A. | N.A. | N.A. | N.A. | N.A. |
| $CS_K$ (MPa) | 1,006 | 934 | 506 | 473 | 943 | 957 | 561 | 508 | 1,067 | N.A. |
| $DOL\_ZERO_K$ (μm) | 22.0 | 36.5 | 17.3 | 19.8 | 38.3 | 25.9 | 14.7 | 19.0 | 25.0 | N.A. |
| $CS_{Na}$ (MPa) | 338 | 312 | 136 | 175 | N.A. | N.A. | N.A. | N.A. | 291 | N.A. |
| $DOL\_ZERO_{Na}$ (μm) | 116.3 | 101.3 | 78.7 | 62.3 | N.A. | N.A. | N.A. | N.A. | 132.5 | N.A. |

TABLE 16

| (mol %) | No. 151 | No. 152 | No. 153 | No. 154 | No. 155 | No. 156 | No. 157 | No. 158 | No. 159 | No. 160 |
|---|---|---|---|---|---|---|---|---|---|---|
| $SiO_2$ | 60.04 | 60.36 | 60.53 | 60.72 | 60.43 | 66.16 | 64.12 | 62.82 | 62.35 | 61.84 |
| $Al_2O_3$ | 18.94 | 18.57 | 18.51 | 18.51 | 18.76 | 11.85 | 14.09 | 15.44 | 15.95 | 16.51 |
| $B_2O_3$ | 0.10 | 0.12 | 0.11 | 0.11 | 0.10 | 0.36 | 0.31 | 0.33 | 0.31 | 0.21 |
| $Li_2O$ | 7.50 | 7.13 | 6.91 | 6.82 | 7.22 | 0.52 | 2.61 | 3.81 | 4.24 | 4.81 |
| $Na_2O$ | 7.85 | 8.21 | 8.38 | 8.48 | 8.08 | 14.66 | 12.79 | 11.74 | 11.34 | 10.87 |
| $K_2O$ | 0.30 | 0.35 | 0.49 | 0.49 | 0.44 | 1.29 | 1.03 | 0.87 | 0.81 | 0.74 |
| MgO | 0.50 | 0.72 | 0.67 | 0.67 | 0.52 | 4.64 | 3.40 | 2.62 | 2.35 | 2.06 |
| CaO | 0.00 | 0.00 | 0.00 | 0.00 | 0.00 | 0.03 | 0.03 | 0.03 | 0.03 | 0.03 |
| SrO | 0.00 | 0.00 | 0.00 | 0.00 | 0.00 | 0.00 | 0.00 | 0.00 | 0.00 | 0.00 |
| BaO | 0.00 | 0.00 | 0.00 | 0.00 | 0.00 | 0.00 | 0.00 | 0.00 | 0.00 | 0.00 |
| $ZrO_2$ | 0.00 | 0.00 | 0.00 | 0.00 | 0.00 | 0.00 | 0.00 | 0.00 | 0.00 | 0.00 |
| $Y_2O_3$ | 0.00 | 0.00 | 0.00 | 0.00 | 0.00 | 0.00 | 0.00 | 0.00 | 0.00 | 0.00 |
| ZnO | 0.00 | 0.00 | 0.00 | 0.00 | 0.00 | 0.00 | 0.00 | 0.00 | 0.00 | 0.00 |
| $P_2O_5$ | 4.50 | 4.28 | 4.13 | 3.94 | 4.31 | 0.23 | 1.43 | 2.16 | 2.45 | 2.77 |
| $SnO_2$ | 0.16 | 0.16 | 0.16 | 0.16 | 0.05 | 0.15 | 0.12 | 0.09 | 0.09 | 0.08 |
| $Fe_2O_3$ | 0.01 | 0.01 | 0.01 | 0.01 | 0.00 | 0.00 | 0.00 | 0.00 | 0.00 | 0.00 |
| $TiO_2$ | 0.00 | 0.00 | 0.00 | 0.00 | 0.00 | 0.01 | 0.01 | 0.01 | 0.01 | 0.01 |
| Cl | 0.10 | 0.10 | 0.10 | 0.10 | 0.10 | 0.10 | 0.08 | 0.07 | 0.07 | 0.07 |
| Li/(Na + K) | 0.92 | 0.83 | 0.78 | 0.76 | 0.85 | 0.03 | 0.19 | 0.30 | 0.35 | 0.41 |
| (Na + K)/Li | 1.09 | 1.20 | 1.28 | 1.32 | 1.18 | 30.48 | 5.30 | 3.31 | 2.87 | 2.42 |
| Li + Na + K | 15.65 | 15.69 | 15.78 | 15.78 | 15.74 | 16.47 | 16.42 | 16.41 | 16.39 | 16.42 |
| Li/P | 1.67 | 1.67 | 1.67 | 1.73 | 1.67 | 2.29 | 1.82 | 1.76 | 1.73 | 1.74 |
| P/Li | 0.60 | 0.60 | 0.60 | 0.58 | 0.60 | 0.44 | 0.55 | 0.57 | 0.58 | 0.58 |
| (Na − Li)/ (Al + B + P) | 0.01 | 0.05 | 0.06 | 0.07 | 0.04 | 1.14 | 0.64 | 0.44 | 0.38 | 0.31 |
| (B + Na − P)/ (Al + Li) | 0.13 | 0.16 | 0.17 | 0.18 | 0.15 | 1.20 | 0.70 | 0.51 | 0.46 | 0.39 |
| Si + 1.2P − 3Al − 2Li − 1.5Na − K − B | −18.55 | −17.25 | −17.04 | −17.03 | −17.78 | 6.19 | −2.16 | −7.33 | −9.16 | −11.24 |
| ρ (g/cm$^3$) | N.A. | N.A. | N.A. | N.A. | N.A. | 2.448 | 2.439 | 2.433 | 2.429 | 2.426 |
| $α_{30\text{-}380° C.}$ (×10$^{-7}$/° C.) | N.A. | N.A. | N.A. | N.A. | N.A. | N.A. | N.A. | N.A. | N.A. | N.A. |
| Ts (° C.) | N.A. | N.A. | N.A. | N.A. | N.A. | N.A. | N.A. | N.A. | N.A. | N.A. |
| 10$^{2.5}$ dPa · s (° C.) | N.A. | N.A. | N.A. | N.A. | N.A. | N.A. | N.A. | N.A. | N.A. | N.A. |
| TL (° C.) | N.A. | N.A. | N.A. | N.A. | N.A. | N.A. | N.A. | N.A. | N.A. | N.A. |
| logη at TL (dPa · s) | N.A. | N.A. | N.A. | N.A. | N.A. | N.A. | N.A. | N.A. | N.A. | N.A. |
| Acid resistance (HCl 5 wt % 80° C. 24 h) | N.A. | N.A. | N.A. | N.A. | N.A. | N.A. | N.A. | N.A. | N.A. | N.A. |
| Alkali resistance (NaOH 5 wt % 80° C. 6 h) | N.A. | N.A. | N.A. | N.A. | N.A. | N.A. | N.A. | N.A. | N.A. | N.A. |
| E (GPa) | N.A. | N.A. | N.A. | N.A. | N.A. | N.A. | N.A. | N.A. | N.A. | N.A. |
| $K_{1C}$ (MPa · m$^{0.5}$) | N.A. | N.A. | N.A. | N.A. | N.A. | N.A. | N.A. | N.A. | N.A. | N.A. |
| $CS_K$ (MPa) | N.A. | N.A. | N.A. | N.A. | N.A. | N.A. | N.A. | N.A. | 1,164 | 1,151 |
| $DOL\_ZERO_K$ (μm) | N.A. | N.A. | N.A. | N.A. | N.A. | N.A. | N.A. | N.A. | 31.6 | 29 |

TABLE 16-continued

| (mol %) | No. 151 | No. 152 | No. 153 | No. 154 | No. 155 | No. 156 | No. 157 | No. 158 | No. 159 | No. 160 |
|---|---|---|---|---|---|---|---|---|---|---|
| $CS_{Na}$ (MPa) | N.A. | N.A. | N.A. | N.A. | N.A. | N.A. | N.A. | N.A. | 168 | 198 |
| $DOL\_ZERO_{Na}$ (μm) | N.A. | N.A. | N.A. | N.A. | N.A. | N.A. | N.A. | N.A. | 92.8 | 89.6 |

TABLE 17

| (mol %) | No. 161 | No. 162 | No. 163 | No. 164 | No. 165 | No. 166 | No. 167 | No. 168 | No. 169 | No. 170 |
|---|---|---|---|---|---|---|---|---|---|---|
| $SiO_2$ | 61.42 | 61.13 | 60.80 | 60.45 | 60.27 | 60.09 | 59.88 | 59.76 | 59.64 | 59.64 |
| $Al_2O_3$ | 16.87 | 17.24 | 17.62 | 17.85 | 18.12 | 18.35 | 18.55 | 18.73 | 18.81 | 18.91 |
| $B_2O_3$ | 0.26 | 0.24 | 0.22 | 0.27 | 0.26 | 0.20 | 0.23 | 0.22 | 0.17 | 0.20 |
| $Li_2O$ | 5.23 | 5.55 | 5.91 | 6.31 | 6.51 | 6.74 | 7.02 | 7.17 | 7.41 | 7.41 |
| $Na_2O$ | 10.52 | 10.19 | 9.85 | 9.57 | 9.34 | 9.13 | 8.91 | 8.74 | 8.64 | 8.53 |
| $K_2O$ | 0.70 | 0.66 | 0.62 | 0.59 | 0.56 | 0.53 | 0.51 | 0.49 | 0.48 | 0.47 |
| MgO | 1.85 | 1.65 | 1.44 | 1.29 | 1.16 | 1.04 | 0.90 | 0.79 | 0.71 | 0.65 |
| CaO | 0.00 | 0.00 | 0.00 | 0.00 | 0.00 | 0.00 | 0.00 | 0.00 | 0.00 | 0.00 |
| SrO | 0.00 | 0.00 | 0.00 | 0.00 | 0.00 | 0.00 | 0.00 | 0.00 | 0.00 | 0.00 |
| BaO | 0.00 | 0.00 | 0.00 | 0.00 | 0.00 | 0.00 | 0.00 | 0.00 | 0.00 | 0.00 |
| $ZrO_2$ | 0.00 | 0.00 | 0.00 | 0.00 | 0.00 | 0.00 | 0.00 | 0.00 | 0.00 | 0.00 |
| $Y_2O_3$ | 0.00 | 0.00 | 0.00 | 0.00 | 0.00 | 0.00 | 0.00 | 0.00 | 0.00 | 0.00 |
| ZnO | 0.00 | 0.00 | 0.00 | 0.00 | 0.00 | 0.00 | 0.00 | 0.00 | 0.00 | 0.00 |
| $P_2O_5$ | 2.97 | 3.17 | 3.37 | 3.50 | 3.64 | 3.76 | 3.86 | 3.95 | 4.00 | 4.05 |
| $SnO_2$ | 0.08 | 0.07 | 0.07 | 0.06 | 0.06 | 0.06 | 0.05 | 0.05 | 0.05 | 0.05 |
| $Fe_2O_3$ | 0.03 | 0.03 | 0.03 | 0.03 | 0.03 | 0.03 | 0.03 | 0.03 | 0.03 | 0.03 |
| $TiO_2$ | 0.01 | 0.01 | 0.01 | 0.01 | 0.01 | 0.01 | 0.01 | 0.01 | 0.01 | 0.01 |
| Cl | 0.07 | 0.07 | 0.06 | 0.06 | 0.06 | 0.06 | 0.06 | 0.06 | 0.06 | 0.06 |
| Li/(Na + K) | 0.47 | 0.51 | 0.56 | 0.62 | 0.66 | 0.70 | 0.74 | 0.78 | 0.81 | 0.82 |
| (Na + K)/Li | 2.14 | 1.96 | 1.77 | 1.61 | 1.52 | 1.43 | 1.34 | 1.29 | 1.23 | 1.22 |
| Li + Na + K | 16.45 | 16.40 | 16.38 | 16.46 | 16.41 | 16.40 | 16.44 | 16.41 | 16.52 | 16.41 |
| Li/P | 1.76 | 1.75 | 1.76 | 1.80 | 1.79 | 1.79 | 1.82 | 1.81 | 1.85 | 1.83 |
| P/Li | 0.57 | 0.57 | 0.57 | 0.56 | 0.56 | 0.56 | 0.55 | 0.55 | 0.54 | 0.55 |
| (Na − Li)/(Al + B + P) | 0.26 | 0.23 | 0.19 | 0.15 | 0.13 | 0.11 | 0.08 | 0.07 | 0.05 | 0.05 |
| (B + Na − P)/(Al + Li) | 0.35 | 0.32 | 0.28 | 0.26 | 0.24 | 0.22 | 0.21 | 0.19 | 0.18 | 0.18 |
| Si + 1.2P − 3Al − 2Li − 1.5Na − K − B | −12.82 | −14.08 | −15.46 | −16.74 | −17.57 | −18.34 | −19.28 | −19.86 | −20.40 | −20.51 |
| ρ (g/cm³) | 2.423 | 2.420 | 2.418 | 2.416 | 2.415 | 2.413 | 2.412 | 2.411 | 2.410 | 2.409 |
| $α_{30-380°\ C.}$ (×10⁻⁷/° C.) | N.A. | N.A. | N.A. | N.A. | N.A. | N.A. | N.A. | N.A. | N.A. | N.A. |
| Ts (° C.) | N.A. | N.A. | N.A. | N.A. | N.A. | N.A. | N.A. | N.A. | N.A. | N.A. |
| 10^2.5 dPa · s (° C.) | N.A. | N.A. | N.A. | N.A. | N.A. | N.A. | N.A. | N.A. | N.A. | N.A. |
| TL (° C.) | N.A. | N.A. | N.A. | N.A. | N.A. | N.A. | N.A. | N.A. | N.A. | N.A. |
| logη at TL (dPa · s) | N.A. | N.A. | N.A. | N.A. | N.A. | N.A. | N.A. | N.A. | N.A. | N.A. |
| Acid resistance (HCl 5 wt % 80° C. 24 h) | N.A. | N.A. | N.A. | N.A. | N.A. | N.A. | N.A. | N.A. | N.A. | N.A. |
| Alkali resistance (NaOH 5 wt % 80° C. 6 h) | N.A. | N.A. | N.A. | N.A. | N.A. | N.A. | N.A. | N.A. | N.A. | N.A. |
| E (GPa) | N.A. | N.A. | N.A. | N.A. | N.A. | N.A. | N.A. | N.A. | N.A. | N.A. |
| $K_{1C}$ (MPa · m⁰·⁵) | N.A. | N.A. | N.A. | N.A. | N.A. | N.A. | N.A. | N.A. | N.A. | N.A. |
| $CS_K$ (MPa) | 1,138 | 1,133 | 1,126 | 1,122 | 1,122 | 1,112 | 1,114 | 1,114 | 1,117 | 1,100 |
| $DOL\_ZERO_K$ (μm) | 26.1 | 24.8 | 24.1 | 23.4 | 22.8 | 22.3 | 22.4 | 22.3 | 21.4 | 22.2 |
| $CS_{Na}$ (MPa) | 214 | 216 | 218 | 235 | 236 | 253 | 259 | 260 | 249 | 268 |
| $DOL\_ZERO_{Na}$ (μm) | 90.4 | 96.7 | 102.8 | 95 | 96.5 | 97.5 | 101.5 | 98.4 | 107 | 99.7 |

TABLE 18

| (mol %) | No. 171 | No. 172 | No. 173 | No. 174 | No. 175 | No. 176 | No. 177 | No. 178 | No. 179 | No. 180 |
|---|---|---|---|---|---|---|---|---|---|---|
| $SiO_2$ | 59.63 | 59.52 | 59.57 | 59.69 | 59.77 | 59.89 | 59.97 | 59.86 | 59.91 | 59.97 |
| $Al_2O_3$ | 18.99 | 19.00 | 18.99 | 18.99 | 18.94 | 18.94 | 18.97 | 18.97 | 18.98 | 18.93 |
| $B_2O_3$ | 0.16 | 0.19 | 0.21 | 0.23 | 0.20 | 0.12 | 0.10 | 0.13 | 0.18 | 0.19 |
| $Li_2O$ | 7.49 | 7.65 | 7.65 | 7.54 | 7.57 | 7.55 | 7.51 | 7.66 | 7.57 | 7.53 |
| $Na_2O$ | 8.45 | 8.38 | 8.34 | 8.30 | 8.27 | 8.27 | 8.24 | 8.22 | 8.21 | 8.22 |
| $K_2O$ | 0.47 | 0.47 | 0.46 | 0.46 | 0.46 | 0.46 | 0.45 | 0.45 | 0.45 | 0.45 |
| MgO | 0.58 | 0.53 | 0.48 | 0.45 | 0.43 | 0.40 | 0.37 | 0.33 | 0.31 | 0.34 |

TABLE 18-continued

| (mol %) | No. 171 | No. 172 | No. 173 | No. 174 | No. 175 | No. 176 | No. 177 | No. 178 | No. 179 | No. 180 |
|---|---|---|---|---|---|---|---|---|---|---|
| CaO | 0.00 | 0.00 | 0.03 | 0.00 | 0.00 | 0.00 | 0.00 | 0.00 | 0.00 | 0.02 |
| SrO | 0.00 | 0.00 | 0.00 | 0.03 | 0.00 | 0.00 | 0.00 | 0.00 | 0.00 | 0.01 |
| BaO | 0.03 | 0.00 | 0.00 | 0.00 | 0.03 | 0.03 | 0.00 | 0.00 | 0.00 | 0.00 |
| $ZrO_2$ | 0.00 | 0.00 | 0.00 | 0.00 | 0.00 | 0.00 | 0.03 | 0.03 | 0.03 | 0.00 |
| $Y_2O_3$ | 0.00 | 0.00 | 0.00 | 0.00 | 0.00 | 0.00 | 0.00 | 0.00 | 0.00 | 0.00 |
| ZnO | 0.00 | 0.00 | 0.00 | 0.00 | 0.00 | 0.00 | 0.00 | 0.00 | 0.00 | 0.00 |
| $P_2O_5$ | 4.10 | 4.12 | 4.15 | 4.18 | 4.20 | 4.22 | 4.24 | 4.24 | 4.23 | 4.22 |
| $SnO_2$ | 0.05 | 0.05 | 0.05 | 0.05 | 0.05 | 0.05 | 0.05 | 0.05 | 0.04 | 0.05 |
| $Fe_2O_3$ | 0.00 | 0.03 | 0.00 | 0.00 | 0.00 | 0.00 | 0.00 | 0.00 | 0.00 | 0.00 |
| $TiO_2$ | 0.01 | 0.01 | 0.01 | 0.01 | 0.01 | 0.01 | 0.01 | 0.01 | 0.01 | 0.01 |
| Cl | 0.06 | 0.06 | 0.06 | 0.06 | 0.06 | 0.06 | 0.06 | 0.06 | 0.07 | 0.06 |
| Li/(Na + K) | 0.84 | 0.86 | 0.87 | 0.86 | 0.87 | 0.87 | 0.86 | 0.88 | 0.88 | 0.87 |
| (Na + K)/Li | 1.19 | 1.16 | 1.15 | 1.16 | 1.15 | 1.16 | 1.16 | 1.13 | 1.14 | 1.15 |
| Li + Na + K | 16.41 | 16.49 | 16.45 | 16.30 | 16.31 | 16.27 | 16.20 | 16.32 | 16.23 | 16.20 |
| Li/P | 1.83 | 1.86 | 1.84 | 1.80 | 1.80 | 1.79 | 1.77 | 1.81 | 1.79 | 1.79 |
| P/Li | 0.55 | 0.54 | 0.54 | 0.55 | 0.55 | 0.56 | 0.56 | 0.55 | 0.56 | 0.56 |
| (Na − Li)/ (Al + B + P) | 0.04 | 0.03 | 0.03 | 0.03 | 0.03 | 0.03 | 0.03 | 0.02 | 0.03 | 0.03 |
| (B + Na − P)/ (Al + Li) | 0.17 | 0.17 | 0.16 | 0.16 | 0.16 | 0.16 | 0.15 | 0.15 | 0.16 | 0.16 |
| Si + 1.2P − 3Al − 2Li − 1.5Na − K − B | −20.70 | −21.06 | −20.91 | −20.50 | −20.23 | −19.96 | −19.80 | −20.17 | −20.04 | −19.78 |
| $\rho$ (g/cm³) | 2.408 | 2.408 | 2.407 | 2.406 | 2.405 | 2.404 | 2.403 | 2.403 | 2.403 | 2.403 |
| $\alpha_{30\text{-}380° C.}$ (×10⁻⁷/° C.) | N.A. | N.A. | N.A. | N.A. | N.A. | N.A. | N.A. | N.A. | N.A. | N.A. |
| Ts (° C.) | N.A. | N.A. | N.A. | N.A. | N.A. | N.A. | N.A. | N.A. | N.A. | N.A. |
| $10^{2.5}$ dPa · s (° C.) | N.A. | N.A. | N.A. | N.A. | N.A. | N.A. | N.A. | N.A. | N.A. | N.A. |
| TL (° C.) | N.A. | N.A. | N.A. | N.A. | N.A. | N.A. | N.A. | N.A. | N.A. | N.A. |
| logη at TL (dPa · s) | N.A. | N.A. | N.A. | N.A. | N.A. | N.A. | N.A. | N.A. | N.A. | N.A. |
| Acid resistance (HCl 5 wt % 80° C. 24 h) | N.A. | N.A. | N.A. | N.A. | N.A. | N.A. | N.A. | N.A. | N.A. | N.A. |
| Alkali resistance (NaOH 5 wt % 80° C. 6 h) | N.A. | N.A. | N.A. | N.A. | N.A. | N.A. | N.A. | N.A. | N.A. | N.A. |
| E (GPa) | N.A. | N.A. | N.A. | N.A. | N.A. | N.A. | N.A. | N.A. | N.A. | N.A. |
| $K_{1C}$ (MPa · m⁰·⁵) | N.A. | N.A. | N.A. | N.A. | N.A. | N.A. | N.A. | N.A. | N.A. | N.A. |
| $CS_K$ (MPa) | 1,103 | 1,103 | 1,102 | 1,108 | 1,108 | 1,108 | 1,112 | 1,104 | 1,109 | 1,108 |
| DOL_ZERO$_K$ (μm) | 21.7 | 21.3 | 21.3 | 22 | 23.4 | 23.6 | 23.7 | 23.5 | 23.3 | 24.4 |
| $CS_{Na}$ (MPa) | 273 | 274 | 264 | 276 | 258 | 251 | 262 | 271 | 269 | 264 |
| DOL_ZERO$_{Na}$ (μm) | 100.7 | 94.9 | 100.5 | 106.5 | 106.7 | 91.2 | 101.7 | 98.4 | 106.3 | 99.6 |

TABLE 19

| (mol %) | No. 181 | No. 182 | No. 183 | No. 184 | No. 185 | No. 18 6 | No. 187 | No. 188 | No. 189 | No. 190 |
|---|---|---|---|---|---|---|---|---|---|---|
| $SiO_2$ | 60.13 | 60.16 | 60.18 | 60.28 | 60.15 | 60.20 | 60.14 | 60.38 | 60.38 | 60.38 |
| $Al_2O_3$ | 18.91 | 18.92 | 18.91 | 18.95 | 18.93 | 18.95 | 18.95 | 18.57 | 18.57 | 18.57 |
| $B_2O_3$ | 0.18 | 0.19 | 0.22 | 0.20 | 0.22 | 0.17 | 0.18 | 0.10 | 0.10 | 0.10 |
| $Li_2O$ | 7.42 | 7.38 | 7.37 | 7.22 | 7.40 | 7.39 | 7.45 | 7.13 | 7.63 | 7.13 |
| $Na_2O$ | 8.20 | 8.18 | 8.18 | 8.20 | 8.17 | 8.17 | 8.17 | 8.21 | 8.21 | 8.21 |
| $K_2O$ | 0.45 | 0.45 | 0.44 | 0.44 | 0.44 | 0.43 | 0.43 | 0.35 | 0.35 | 0.85 |
| MgO | 0.32 | 0.29 | 0.27 | 0.26 | 0.23 | 0.22 | 0.20 | 0.72 | 0.72 | 0.72 |
| CaO | 0.01 | 0.02 | 0.02 | 0.03 | 0.01 | 0.01 | 0.00 | 0.00 | 0.00 | 0.00 |
| SrO | 0.00 | 0.00 | 0.00 | 0.00 | 0.00 | 0.00 | 0.00 | 0.00 | 0.00 | 0.00 |
| BaO | 0.01 | 0.00 | 0.00 | 0.00 | 0.00 | 0.00 | 0.00 | 0.00 | 0.00 | 0.00 |
| $ZrO_2$ | 0.01 | 0.01 | 0.01 | 0.00 | 0.02 | 0.02 | 0.02 | 0.00 | 0.00 | 0.00 |
| $Y_2O_3$ | 0.00 | 0.00 | 0.00 | 0.00 | 0.00 | 0.00 | 0.00 | 0.00 | 0.00 | 0.00 |
| ZnO | 0.00 | 0.00 | 0.00 | 0.00 | 0.00 | 0.00 | 0.00 | 0.00 | 0.00 | 0.00 |
| $P_2O_5$ | 4.24 | 4.27 | 4.27 | 4.28 | 4.29 | 4.30 | 4.30 | 4.28 | 3.78 | 3.78 |
| $SnO_2$ | 0.04 | 0.04 | 0.04 | 0.05 | 0.05 | 0.05 | 0.05 | 0.16 | 0.16 | 0.16 |
| $Fe_2O_3$ | 0.00 | 0.00 | 0.00 | 0.01 | 0.01 | 0.01 | 0.02 | 0.00 | 0.00 | 0.00 |
| $TiO_2$ | 0.01 | 0.01 | 0.01 | 0.01 | 0.01 | 0.01 | 0.01 | 0.01 | 0.00 | 0.00 |
| Cl | 0.07 | 0.07 | 0.07 | 0.07 | 0.08 | 0.08 | 0.08 | 0.10 | 0.10 | 0.10 |
| Li/(Na + K) | 0.86 | 0.86 | 0.85 | 0.84 | 0.86 | 0.86 | 0.87 | 0.83 | 0.89 | 0.79 |
| (Na + K)/Li | 1.16 | 1.17 | 1.17 | 1.20 | 1.16 | 1.17 | 1.15 | 1.20 | 1.12 | 1.27 |
| Li + Na + K | 16.06 | 16.01 | 16.00 | 15.87 | 16.01 | 16.00 | 16.05 | 15.69 | 16.19 | 16.19 |

TABLE 19-continued

| (mol %) | No. 181 | No. 182 | No. 183 | No. 184 | No. 185 | No. 18 6 | No. 187 | No. 188 | No. 189 | No. 190 |
|---|---|---|---|---|---|---|---|---|---|---|
| Li/P | 1.75 | 1.73 | 1.73 | 1.69 | 1.73 | 1.72 | 1.73 | 1.67 | 2.02 | 1.89 |
| P/Li | 0.57 | 0.58 | 0.58 | 0.59 | 0.58 | 0.58 | 0.58 | 0.60 | 0.50 | 0.53 |
| (Na − Li)/ (Al + B + P) | 0.03 | 0.03 | 0.03 | 0.04 | 0.03 | 0.03 | 0.03 | 0.05 | 0.03 | 0.05 |
| (B + Na − P)/ (Al + Li) | 0.16 | 0.16 | 0.16 | 0.16 | 0.16 | 0.15 | 0.15 | 0.16 | 0.17 | 0.18 |
| Si + 1.2P − 3Al − 2Li − 1.5Na − K − B | −19.28 | −19.14 | −19.09 | −18.83 | −19.22 | −19.12 | −19.32 | −17.22 | −18.82 | −18.32 |
| ρ (g/cm$^3$) | 2.402 | 2.402 | 2.402 | 2.401 | N.A. | N.A. | 2.401 | 2.407 | 2.411 | 2.413 |
| α$_{30-380°\ C.}$ (×10$^{-7}$/° C.) | N.A. | N.A. | N.A. | N.A. | N.A. | N.A. | N.A. | N.A. | N.A. | N.A. |
| Ts (° C.) | N.A. | N.A. | N.A. | N.A. | N.A. | N.A. | N.A. | N.A. | N.A. | N.A. |
| 10$^{2.5}$ dPa · s (° C.) | N.A. | N.A. | N.A. | N.A. | N.A. | N.A. | N.A. | N.A. | N.A. | N.A. |
| TL (° C.) | N.A. | N.A. | N.A. | N.A. | N.A. | N.A. | N.A. | N.A. | N.A. | N.A. |
| logη at TL (dPa · s) | N.A. | N.A. | N.A. | N.A. | N.A. | N.A. | N.A. | N.A. | N.A. | N.A. |
| Acid resistance (HCl 5 wt % 80° C. 24 h) | N.A. | N.A. | N.A. | N.A. | N.A. | N.A. | N.A. | N.A. | N.A. | N.A. |
| Alkali resistance (NaOH 5 wt % 80° C. 6 h) | N.A. | N.A. | N.A. | N.A. | N.A. | N.A. | N.A. | N.A. | N.A. | N.A. |
| E (GPa) | N.A. | N.A. | N.A. | N.A. | N.A. | N.A. | N.A. | N.A. | N.A. | N.A. |
| K$_{1C}$ (MPa · m$^{0.5}$) | N.A. | N.A. | N.A. | N.A. | N.A. | N.A. | N.A. | N.A. | N.A. | N.A. |
| CS$_K$ (MPa) | 1,101 | 1,094 | 1,100 | 1,093 | 1,096 | N.A. | N.A. | 1,064 | 1,086 | 1,067 |
| DOL_ZERO$_K$ (μm) | 24.8 | 24.5 | 23.6 | 24.3 | 23.7 | N.A. | N.A. | 27 | 23 | 28 |
| CS$_{Na}$ (MPa) | 272 | 269 | 249 | 246 | 244 | N.A. | N.A. | 271 | 294 | 263 |
| DOL_ZERO$_{Na}$ (μm) | 110.8 | 103.2 | 111.7 | 103.1 | 105 | N.A. | N.A. | 132 | 127 | 131 |

TABLE 20

| (mol %) | No. 191 | No. 192 | No. 193 | No. 194 | No. 195 | No. 196 | No. 197 | No. 198 | No. 199 | No. 200 |
|---|---|---|---|---|---|---|---|---|---|---|
| SiO$_2$ | 60.28 | 60.28 | 60.28 | 59.88 | 59.88 | 59.78 | 59.78 | 60.33 | 60.36 | 60.38 |
| Al$_2$O$_3$ | 18.67 | 18.67 | 18.67 | 18.57 | 18.57 | 18.67 | 18.67 | 18.8 | 18.8 | 18.8 |
| B$_2$O$_3$ | 0.10 | 0.10 | 0.10 | 0.10 | 0.10 | 0.10 | 0.10 | 0.10 | 0.10 | 0.10 |
| Li$_2$O | 7.13 | 7.63 | 7.13 | 7.63 | 7.13 | 7.63 | 7.13 | 7.20 | 7.20 | 7.20 |
| Na$_2$O | 8.21 | 8.21 | 8.21 | 8.21 | 8.21 | 8.21 | 8.21 | 8.10 | 8.10 | 8.10 |
| K$_2$O | 0.35 | 0.35 | 0.85 | 0.35 | 0.85 | 0.35 | 0.85 | 0.45 | 0.45 | 0.45 |
| MgO | 0.72 | 0.72 | 0.72 | 0.72 | 0.72 | 0.72 | 0.72 | 0.50 | 0.50 | 0.50 |
| CaO | 0.00 | 0.00 | 0.00 | 0.00 | 0.00 | 0.00 | 0.00 | 0.00 | 0.00 | 0.00 |
| SrO | 0.00 | 0.00 | 0.00 | 0.00 | 0.00 | 0.00 | 0.00 | 0.00 | 0.00 | 0.00 |
| BaO | 0.00 | 0.00 | 0.00 | 0.00 | 0.00 | 0.00 | 0.00 | 0.00 | 0.00 | 0.00 |
| ZrO$_2$ | 0.00 | 0.00 | 0.00 | 0.00 | 0.00 | 0.00 | 0.00 | 0.00 | 0.00 | 0.00 |
| Y$_2$O$_3$ | 0.00 | 0.00 | 0.00 | 0.00 | 0.00 | 0.00 | 0.00 | 0.00 | 0.00 | 0.00 |
| ZnO | 0.00 | 0.00 | 0.00 | 0.00 | 0.00 | 0.00 | 0.00 | 0.00 | 0.00 | 0.00 |
| P$_2$O$_5$ | 4.28 | 3.78 | 3.78 | 4.28 | 4.28 | 4.28 | 4.28 | 4.30 | 4.30 | 4.30 |
| SnO$_2$ | 0.16 | 0.16 | 0.16 | 0.16 | 0.16 | 0.16 | 0.16 | 0.116 | 0.093 | 0.07 |
| Fe$_2$O$_3$ | 0.00 | 0.00 | 0.00 | 0.00 | 0.00 | 0.00 | 0.00 | 0.00 | 0.00 | 0.00 |
| TiO$_2$ | 0.00 | 0.00 | 0.00 | 0.00 | 0.00 | 0.00 | 0.00 | 0.00 | 0.00 | 0.00 |
| Cl | 0.10 | 0.10 | 0.10 | 0.10 | 0.10 | 0.10 | 0.10 | 0.10 | 0.10 | 0.10 |
| Li/(Na + K) | 0.83 | 0.89 | 0.79 | 0.89 | 0.79 | 0.89 | 0.79 | 0.84 | 0.84 | 0.84 |
| (Na + K)/Li | 1.20 | 1.12 | 1.27 | 1.12 | 1.27 | 1.12 | 1.27 | 1.19 | 1.19 | 1.19 |
| Li + Na + K | 15.69 | 16.19 | 16.19 | 16.19 | 16.19 | 16.19 | 16.19 | 15.75 | 15.75 | 15.75 |
| Li/P | 1.67 | 2.02 | 1.89 | 1.78 | 1.67 | 1.78 | 1.67 | 1.67 | 1.67 | 1.67 |
| P/Li | 0.60 | 0.50 | 0.53 | 0.56 | 0.60 | 0.56 | 0.60 | 0.60 | 0.60 | 0.60 |
| (Na − Li)/ (Al + B + P) | 0.05 | 0.03 | 0.05 | 0.03 | 0.05 | 0.03 | 0.05 | 0.04 | 0.04 | 0.04 |
| (B + Na − P)/ (Al + Li) | 0.16 | 0.17 | 0.18 | 0.15 | 0.16 | 0.15 | 0.16 | 0.15 | 0.15 | 0.15 |
| Si + 1.2P − 3Al − 2Li − 1.5Na − K − B | −17.62 | −19.22 | −18.72 | −18.72 | −18.22 | −19.12 | −18.62 | −18.01 | −17.98 | −17.96 |
| ρ (g/cm$^3$) | 2.408 | 2.412 | 2.413 | 2.410 | 2.410 | 2.410 | 2.411 | 2.405 | 2.405 | 2.404 |
| α$_{30-380°\ C.}$ (×10$^{-7}$/° C.) | N.A. | N.A. | N.A. | N.A. | N.A. | N.A. | N.A. | N.A. | N.A. | N.A. |
| Ts (° C.) | N.A. | N.A. | N.A. | N.A. | N.A. | N.A. | N.A. | N.A. | N.A. | N.A. |
| 10$^{2.5}$ dPa · s (° C.) | N.A. | N.A. | N.A. | N.A. | N.A. | N.A. | N.A. | N.A. | N.A. | N.A. |

TABLE 20-continued

| (mol %) | No. 191 | No. 192 | No. 193 | No. 194 | No. 195 | No. 196 | No. 197 | No. 198 | No. 199 | No. 200 |
|---|---|---|---|---|---|---|---|---|---|---|
| TL (° C.) | N.A. | N.A. | N.A. | N.A. | N.A. | N.A. | N.A. | N.A. | N.A. | N.A. |
| logη at TL (dPa · s) | N.A. | N.A. | N.A. | N.A. | N.A. | N.A. | N.A. | N.A. | N.A. | N.A. |
| Acid resistance (HCl 5 wt % 80° C. 24 h) | N.A. | N.A. | N.A. | N.A. | N.A. | N.A. | N.A. | N.A. | N.A. | N.A. |
| Alkali resistance (NaOH 5 wt % 80° C. 6 h) | N.A. | N.A. | N.A. | N.A. | N.A. | N.A. | N.A. | N.A. | N.A. | N.A. |
| E (GPa) | N.A. | N.A. | N.A. | N.A. | N.A. | N.A. | N.A. | N.A. | N.A. | N.A. |
| $K_{1C}$ (MPa · m$^{0.5}$) | N.A. | N.A. | N.A. | N.A. | N.A. | N.A. | N.A. | N.A. | N.A. | N.A. |
| $CS_K$ (MPa) | 1,055 | 1,088 | 1,071 | 1,062 | 1,038 | 1,054 | 1,044 | N.A. | N.A. | N.A. |
| $DOL\_ZERO_K$ (μm) | 25 | 23 | 24 | 24 | 27 | 23 | 27 | N.A. | N.A. | N.A. |
| $CS_{Na}$ (MPa) | 253 | 265 | 260 | 265 | 257 | 297 | 268 | N.A. | N.A. | N.A. |
| $DOL\_ZERO_{Na}$ (μm) | 129 | 140 | 131 | 134 | 130 | 129 | 129 | N.A. | N.A. | N.A. |

TABLE 21

| (mol %) | No. 201 | No. 202 | No. 203 | No. 204 | No. 205 | No. 206 | No. 207 | No. 208 | No. 209 | No. 210 |
|---|---|---|---|---|---|---|---|---|---|---|
| $SiO_2$ | 63.42 | 60.41 | 60.3713 | 60.367 | 61.96 | 60.63 | 60.96 | 60.00 | 61.74 | 61.53 |
| $Al_2O_3$ | 15.12 | 18.8 | 18.8 | 18.8 | 10.52 | 10.30 | 10.35 | 10.19 | 10.48 | 10.45 |
| $B_2O_3$ | 0.28 | 0.10 | 0.10 | 0.10 | 0.00 | 0.00 | 0.00 | 0.00 | 1.37 | 0.00 |
| $Li_2O$ | 3.61 | 7.20 | 7.20 | 7.20 | 10.47 | 10.25 | 8.20 | 10.14 | 10.43 | 10.40 |
| $Na_2O$ | 11.63 | 8.10 | 8.10 | 8.10 | 12.98 | 11.19 | 11.25 | 11.08 | 12.94 | 12.89 |
| $K_2O$ | 0.91 | 0.45 | 0.45 | 0.45 | 1.02 | 0.00 | 0.00 | 0.00 | 0.00 | 0.00 |
| MgO | 2.66 | 0.50 | 0.50 | 0.50 | 0.00 | 4.65 | 6.23 | 6.14 | 0.00 | 0.00 |
| CaO | 0.00 | 0.00 | 0.00 | 0.00 | 0.00 | 0.00 | 0.00 | 0.00 | 0.00 | 1.70 |
| SrO | 0.00 | 0.00 | 0.00 | 0.00 | 0.00 | 0.00 | 0.00 | 0.00 | 0.00 | 0.00 |
| BaO | 0.00 | 0.00 | 0.00 | 0.00 | 0.00 | 0.00 | 0.00 | 0.00 | 0.00 | 0.00 |
| $ZrO_2$ | 0.00 | 0.00 | 0.00 | 0.00 | 3.01 | 2.94 | 2.96 | 2.41 | 3.00 | 2.99 |
| $Y_2O_3$ | 0.00 | 0.00 | 0.00 | 0.00 | 0.00 | 0.00 | 0.00 | 0.00 | 0.00 | 0.00 |
| ZnO | 0.00 | 0.00 | 0.00 | 0.00 | 0.00 | 0.00 | 0.00 | 0.00 | 0.00 | 0.00 |
| $P_2O_5$ | 2.15 | 4.30 | 4.30 | 4.30 | 0.00 | 0.00 | 0.00 | 0.00 | 0.00 | 0.00 |
| $SnO_2$ | 0.11 | 0.04 | 0.08 | 0.08 | 0.04 | 0.04 | 0.04 | 0.04 | 0.04 | 0.04 |
| $Fe_2O_3$ | 0.00 | 0.00 | 0.00 | 0.00 | 0.00 | 0.00 | 0.00 | 0.00 | 0.00 | 0.00 |
| $TiO_2$ | 0.00 | 0.00 | 0.00 | 0.00 | 0.00 | 0.00 | 0.00 | 0.00 | 0.00 | 0.00 |
| Cl | 0.10 | 0.10 | 0.10 | 0.10 | 0.00 | 0.00 | 0.00 | 0.00 | 0.00 | 0.00 |
| Li/(Na + K) | 0.29 | 0.84 | 0.84 | 0.84 | 0.75 | 0.92 | 0.73 | 0.92 | 0.81 | 0.81 |
| (Na + K)/Li | 3.47 | 1.19 | 1.19 | 1.19 | 1.34 | 1.09 | 1.37 | 1.09 | 1.24 | 1.24 |
| Li + Na + K | 16.16 | 15.75 | 15.75 | 15.75 | 24.47 | 21.44 | 19.45 | 21.22 | 23.37 | 23.29 |
| Li/P | 1.68 | 1.67 | 1.67 | 1.67 | — | — | — | — | — | — |
| P/Li | 0.60 | 0.60 | 0.60 | 0.60 | 0.00 | 0.00 | 0.00 | 0.00 | 0.00 | 0.00 |
| (Na − Li)/ (Al + B + P) | 0.46 | 0.04 | 0.04 | 0.04 | 0.24 | 0.09 | 0.29 | 0.09 | 0.21 | 0.24 |
| (B + Na − P)/ (Al + Li) | 0.52 | 0.15 | 0.15 | 0.15 | 0.62 | 0.54 | 0.61 | 0.54 | 0.68 | 0.62 |
| Si + 1.2P − 3Al − 2Li − 1.5Na − K − B | −5.23 | −17.93 | −17.97 | −17.97 | −11.04 | −7.54 | −3.38 | −7.47 | −11.36 | −9.96 |
| ρ (g/cm$^3$) | 2.430 | N.A. | 2.403 | 2.403 | 2.530 | 2.542 | 2.547 | 2.536 | 2.527 | 2.546 |
| $α_{30\text{-}380° C.}$ ($×10^{-7}$/° C.) | N.A. | N.A. | N.A. | N.A. | N.A. | N.A. | N.A. | N.A. | N.A. | N.A. |
| Ts (° C.) | N.A. | N.A. | N.A. | N.A. | 704 | 730 | 762 | 721 | 692 | 704 |
| $10^{2.5}$ dPa · s (° C.) | N.A. | N.A. | N.A. | N.A. | 1,331 | 1,317 | 1,350 | 1,308 | 1,308 | 1,311 |
| TL (° C.) | N.A. | N.A. | N.A. | N.A. | 858 | N.A. | N.A. | N.A. | N.A. | 864 |
| logη at TL (dPa · s) | N.A. | N.A. | N.A. | N.A. | 5.50 | N.A. | N.A. | N.A. | N.A. | 5.37 |
| Acid resistance (HCl 5 wt % 80° C. 24 h) | N.A. | N.A. | N.A. | N.A. | N.A. | N.A. | N.A. | N.A. | N.A. | N.A. |
| Alkali resistance (NaOH 5 wt % 80° C. 6 h) | N.A. | N.A. | N.A. | N.A. | N.A. | N.A. | N.A. | N.A. | N.A. | N.A. |
| E (GPa) | N.A. | N.A. | N.A. | N.A. | 83 | 86 | 86 | 86 | 83 | 84 |
| $K_{1C}$ (MPa · m$^{0.5}$) | N.A. | N.A. | N.A. | N.A. | N.A. | N.A. | N.A. | N.A. | N.A. | N.A. |
| $CS_K$ (MPa) | N.A. | N.A. | N.A. | N.A. | N.A. | N.A. | N.A. | N.A. | N.A. | N.A. |
| $DOL\_ZERO_K$ (μm) | N.A. | N.A. | N.A. | N.A. | N.A. | N.A. | N.A. | N.A. | N.A. | N.A. |

TABLE 21-continued

| (mol %) | No. 201 | No. 202 | No. 203 | No. 204 | No. 205 | No. 206 | No. 207 | No. 208 | No. 209 | No. 210 |
|---|---|---|---|---|---|---|---|---|---|---|
| $CS_{Na}$ (MPa) | N.A. | N.A. | N.A. | N.A. | N.A. | N.A. | N.A. | N.A. | N.A. | N.A. |
| $DOL\_ZERO_{Na}$ (μm) | N.A. | N.A. | N.A. | N.A. | N.A. | N.A. | N.A. | N.A. | N.A. | N.A. |

TABLE 22

| (mol %) | No. 211 | No. 212 | No. 213 | No. 214 | No. 215 | No. 216 | No. 217 | No. 218 | No. 219 | No. 220 |
|---|---|---|---|---|---|---|---|---|---|---|
| $SiO_2$ | 62.20 | 62.01 | 62.15 | 61.32 | 61.25 | 62.66 | 63.05 | 62.95 | 62.92 | 62.65 |
| $Al_2O_3$ | 10.56 | 11.47 | 10.55 | 10.41 | 10.40 | 10.64 | 10.71 | 10.69 | 10.69 | 10.64 |
| $B_2O_3$ | 0.00 | 0.00 | 0.00 | 0.00 | 0.00 | 0.00 | 0.00 | 0.00 | 0.00 | 0.00 |
| $Li_2O$ | 10.51 | 10.48 | 8.36 | 8.25 | 8.24 | 8.43 | 8.48 | 8.47 | 8.46 | 8.43 |
| $Na_2O$ | 13.03 | 12.99 | 13.02 | 11.83 | 10.80 | 12.09 | 11.11 | 12.14 | 12.14 | 11.88 |
| $K_2O$ | 0.00 | 0.00 | 0.00 | 0.00 | 0.00 | 0.00 | 0.00 | 0.00 | 0.00 | 0.00 |
| MgO | 0.00 | 0.00 | 0.00 | 0.00 | 0.00 | 0.00 | 0.00 | 0.00 | 0.00 | 0.00 |
| CaO | 0.00 | 0.00 | 2.86 | 6.20 | 7.32 | 2.88 | 2.90 | 2.89 | 2.89 | 3.11 |
| SrO | 0.00 | 0.00 | 0.00 | 0.00 | 0.00 | 0.00 | 0.00 | 0.00 | 0.00 | 0.00 |
| BaO | 0.63 | 0.00 | 0.00 | 0.00 | 0.00 | 1.26 | 1.70 | 1.27 | 0.00 | 1.26 |
| $ZrO_2$ | 3.02 | 3.01 | 3.02 | 1.95 | 1.95 | 1.99 | 2.00 | 1.00 | 2.00 | 1.99 |
| $Y_2O_3$ | 0.00 | 0.00 | 0.00 | 0.00 | 0.00 | 0.00 | 0.00 | 0.55 | 0.86 | 0.00 |
| ZnO | 0.00 | 0.00 | 0.00 | 0.00 | 0.00 | 0.00 | 0.00 | 0.00 | 0.00 | 0.00 |
| $P_2O_5$ | 0.00 | 0.00 | 0.00 | 0.00 | 0.00 | 0.00 | 0.00 | 0.00 | 0.00 | 0.00 |
| $SnO_2$ | 0.04 | 0.04 | 0.04 | 0.04 | 0.04 | 0.04 | 0.04 | 0.04 | 0.04 | 0.04 |
| $Fe_2O_3$ | 0.00 | 0.00 | 0.00 | 0.00 | 0.00 | 0.00 | 0.00 | 0.00 | 0.00 | 0.00 |
| $TiO_2$ | 0.00 | 0.00 | 0.00 | 0.00 | 0.00 | 0.00 | 0.00 | 0.00 | 0.00 | 0.00 |
| Cl | 0.00 | 0.00 | 0.00 | 0.00 | 0.00 | 0.00 | 0.00 | 0.00 | 0.00 | 0.00 |
| Li/(Na + K) | 0.81 | 0.81 | 0.64 | 0.70 | 0.76 | 0.70 | 0.76 | 0.70 | 0.70 | 0.71 |
| (Na + K)/Li | 1.24 | 1.24 | 1.56 | 1.43 | 1.31 | 1.43 | 1.31 | 1.43 | 1.43 | 1.41 |
| Li + Na + K | 23.55 | 23.47 | 21.38 | 20.08 | 19.04 | 20.52 | 19.60 | 20.61 | 20.60 | 20.30 |
| Li/P | — | — | — | — | — | — | — | — | — | — |
| P/Li | 0.00 | 0.00 | 0.00 | 0.00 | 0.00 | 0.00 | 0.00 | 0.00 | 0.00 | 0.00 |
| (Na − Li)/ (Al + B + P) | 0.24 | 0.22 | 0.44 | 0.34 | 0.25 | 0.34 | 0.25 | 0.34 | 0.34 | 0.32 |
| (B + Na − P)/ (Al + Li) | 0.62 | 0.59 | 0.69 | 0.63 | 0.58 | 0.63 | 0.58 | 0.63 | 0.63 | 0.62 |
| Si + 1.2P − 3Al − 2Li − 1.5Na − K − B | −10.07 | −12.86 | −5.77 | −4.16 | −2.63 | −4.25 | −2.71 | −4.27 | −4.27 | −3.94 |
| ρ (g/cm³) | 2.556 | 2.529 | 2.556 | 2.552 | 2.560 | 2.574 | 2.588 | 2.577 | 2.576 | 2.575 |
| $\alpha_{30-380° C.}$ (×10⁻⁷/° C.) | N.A. | N.A. | N.A. | N.A. | N.A. | N.A. | N.A. | N.A. | N.A. | N.A. |
| Ts (° C.) | 708 | 726 | 729 | 714 | 718 | 713 | 719 | 708 | 743 | 715 |
| $10^{2.5}$ dPa · s (° C.) | 1,327 | 1,352 | 1,380 | 1,323 | 1,310 | 1,352 | 1,351 | 1,332 | 1,356 | 1,341 |
| TL (° C.) | 867 | N.A. | N.A. | N.A. | N.A. | 883.2 | N.A. | N.A. | N.A. | N.A. |
| logη at TL (dPa · s) | 5.41 | N.A. | N.A. | N.A. | N.A. | 5.32 | N.A. | N.A. | N.A. | N.A. |
| Acid resistance (HCl 5 wt % 80° C. 24 h) | N.A. | N.A. | N.A. | N.A. | N.A. | N.A. | N.A. | N.A. | N.A. | N.A. |
| Alkali resistance (NaOH 5 wt % 80° C. 6 h) | N.A. | N.A. | N.A. | N.A. | N.A. | N.A. | N.A. | N.A. | N.A. | N.A. |
| E (GPa) | 83 | 83 | 84 | N.A. | 85 | 84 | 84 | 84 | 84 | 83 |
| $K_{1C}$ (MPa · m⁰·⁵) | N.A. | N.A. | N.A. | N.A. | N.A. | N.A. | N.A. | N.A. | N.A. | N.A. |
| $CS_K$ (MPa) | N.A. | N.A. | N.A. | N.A. | N.A. | N.A. | N.A. | N.A. | N.A. | N.A. |
| $DOL\_ZERO_K$ (μm) | N.A. | N.A. | N.A. | N.A. | N.A. | N.A. | N.A. | N.A. | N.A. | N.A. |
| $CS_{Na}$ (MPa) | N.A. | N.A. | N.A. | N.A. | N.A. | N.A. | N.A. | N.A. | N.A. | N.A. |
| $DOL\_ZERO_{Na}$ (μm) | N.A. | N.A. | N.A. | N.A. | N.A. | N.A. | N.A. | N.A. | N.A. | N.A. |

TABLE 23

| (mol %) | No. 221 | No. 222 | No. 223 | No. 224 | No. 225 | No. 226 | No. 227 | No. 228 | No. 229 | No. 230 |
|---|---|---|---|---|---|---|---|---|---|---|
| $SiO_2$ | 62.84 | 62.76 | 63.11 | 57.51 | 57.51 | 56.93 | 60.07 | 63.08 | 61.08 | 61.08 |
| $Al_2O_3$ | 10.67 | 10.66 | 10.72 | 9.77 | 9.77 | 9.67 | 15.81 | 13.81 | 15.81 | 13.81 |
| $B_2O_3$ | 0.00 | 0.00 | 0.00 | 0.00 | 0.00 | 0.00 | 0.00 | 0.00 | 0.00 | 0.00 |
| $Li_2O$ | 7.80 | 8.44 | 7.84 | 23.61 | 21.62 | 23.37 | 8.34 | 6.34 | 6.34 | 6.34 |
| $Na_2O$ | 11.91 | 11.90 | 11.96 | 3.44 | 2.49 | 1.51 | 12.10 | 11.10 | 11.10 | 11.10 |
| $K_2O$ | 0.00 | 0.00 | 0.00 | 0.00 | 0.00 | 0.00 | 0.00 | 0.00 | 0.00 | 0.00 |
| MgO | 0.00 | 0.00 | 0.00 | 0.00 | 2.94 | 2.91 | 0.00 | 0.00 | 0.00 | 0.00 |

TABLE 23-continued

| (mol %) | No. 221 | No. 222 | No. 223 | No. 224 | No. 225 | No. 226 | No. 227 | No. 228 | No. 229 | No. 230 |
|---|---|---|---|---|---|---|---|---|---|---|
| CaO | 3.46 | 2.88 | 2.90 | 2.64 | 2.64 | 2.62 | 0.00 | 0.00 | 0.00 | 0.00 |
| SrO | 0.00 | 0.00 | 0.00 | 0.00 | 0.00 | 0.00 | 0.00 | 0.00 | 0.00 | 0.00 |
| BaO | 1.27 | 1.27 | 1.27 | 1.16 | 1.16 | 1.15 | 0.00 | 0.00 | 0.00 | 0.00 |
| $ZrO_2$ | 2.00 | 1.99 | 2.01 | 1.83 | 1.83 | 1.81 | 0.00 | 0.00 | 0.00 | 0.00 |
| $Y_2O_3$ | 0.00 | 0.06 | 0.14 | 0.00 | 0.00 | 0.00 | 0.00 | 0.00 | 0.00 | 0.00 |
| ZnO | 0.00 | 0.00 | 0.00 | 0.00 | 0.00 | 0.00 | 1.16 | 1.16 | 1.16 | 1.16 |
| $P_2O_5$ | 0.00 | 0.00 | 0.00 | 0.00 | 0.00 | 0.00 | 2.47 | 4.47 | 4.47 | 6.47 |
| $SnO_2$ | 0.04 | 0.04 | 0.04 | 0.04 | 0.04 | 0.04 | 0.04 | 0.04 | 0.04 | 0.04 |
| $Fe_2O_3$ | 0.00 | 0.00 | 0.00 | 0.00 | 0.00 | 0.00 | 0.00 | 0.00 | 0.00 | 0.00 |
| $TiO_2$ | 0.00 | 0.00 | 0.00 | 0.00 | 0.00 | 0.00 | 0.00 | 0.00 | 0.00 | 0.00 |
| Cl | 0.00 | 0.00 | 0.00 | 0.00 | 0.00 | 0.00 | 0.00 | 0.00 | 0.00 | 0.00 |
| Li/(Na + K) | 0.66 | 0.71 | 0.66 | 6.86 | 8.70 | 15.43 | 0.69 | 0.57 | 0.57 | 0.57 |
| (Na + K)/Li | 1.53 | 1.41 | 1.53 | 0.15 | 0.11 | 0.06 | 1.45 | 1.75 | 1.75 | 1.75 |
| Li + Na + K | 19.72 | 20.34 | 19.80 | 27.48 | 24.11 | 24.88 | 20.44 | 17.44 | 17.44 | 17.44 |
| Li/P | — | — | — | — | — | — | 3.38 | 1.42 | 1.42 | 0.98 |
| P/Li | 0.00 | 0.00 | 0.00 | 0.00 | 0.00 | 0.00 | 0.30 | 0.71 | 0.71 | 0.02 |
| (Na − Li)/ (Al + B + P) | 0.39 | 0.32 | 0.39 | −2.06 | −1.96 | −2.26 | 0.21 | 0.26 | 0.23 | 0.23 |
| (B + Na − P)/ (Al + Li) | 0.64 | 0.62 | 0.64 | 0.10 | 0.08 | 0.05 | 0.40 | 0.33 | 0.30 | 0.23 |
| Si + 1.2P − 3Al − 2Li − 1.5Na − K − B | −2.65 | −3.95 | −2.66 | −24.17 | −18.77 | −21.08 | −19.22 | −2.32 | −10.32 | −1.92 |
| $\rho$ (g/cm$^3$) | 2.577 | 2.576 | 2.579 | N.A. | N.A. | N.A. | 2.451 | 2.415 | 2.425 | 2.404 |
| $\alpha_{30-380°\,C.}$ (×10$^{-7}$/° C.) | N.A. | N.A. | N.A. | 96.6 | 91.2 | 92.2 | 91.2 | 82.8 | 82.7 | 82.4 |
| Ts (° C.) | 722 | 716 | 727 | N.A. | 652 | N.A. | N.A. | N.A. | 866 | 846 |
| 10$^{2.5}$ dPa · s (° C.) | 1,354 | 1,344 | 1,362 | N.A. | 1,141 | N.A. | 1,504 | 1,580 | 1,576 | 1,572 |
| TL (° C.) | N.A. | N.A. | N.A. | N.A. | 1,033 | N.A. | 973 | 930 | 956 | N.A. |
| logη at TL (dPa · s) | N.A. | N.A. | N.A. | N.A. | 3.10 | N.A. | 5.9 | 6.4 | 6.5 | N.A. |
| Acid resistance (HCl 5 wt % 80° C. 24 h) | N.A. | N.A. | N.A. | N.A. | N.A. | N.A. | N.A. | N.A. | N.A. | N.A. |
| Alkali resistance (NaOH 5 wt % 80° C. 6 h) | N.A. | N.A. | N.A. | N.A. | N.A. | N.A. | N.A. | N.A. | N.A. | N.A. |
| E (GPa) | 83 | 83 | 83 | 90 | 91 | 92 | N.A. | 73 | 73 | 70 |
| $K_{1C}$ (MPa · m$^{0.5}$) | N.A. | N.A. | N.A. | N.A. | 0.91 | N.A. | N.A. | N.A. | N.A. | N.A. |
| $CS_K$ (MPa) | N.A. | N.A. | N.A. | N.A. | N.A. | N.A. | 1,142 | N.A. | N.A. | N.A. |
| DOL_ZERO$_K$ (μm) | N.A. | N.A. | N.A. | N.A. | N.A. | N.A. | 24 | N.A. | N.A. | N.A. |
| $CS_{Na}$ (MPa) | N.A. | N.A. | N.A. | N.A. | N.A. | N.A. | 208 | N.A. | N.A. | N.A. |
| DOL_ZERO$_{Na}$ (μm) | N.A. | N.A. | N.A. | N.A. | N.A. | N.A. | 123 | N.A. | N.A. | N.A. |

TABLE 24

| (mol %) | No. 231 | No. 232 | No. 233 | No. 234 | No. 235 | No. 236 | No. 237 | No. 238 | No. 239 | No. 240 |
|---|---|---|---|---|---|---|---|---|---|---|
| $SiO_2$ | 59.07 | 59.07 | 64.31 | 64.66 | 64.43 | 74.34 | 74.20 | 74.87 | 64.86 | 64.33 |
| $Al_2O_3$ | 19.81 | 17.81 | 14.92 | 14.94 | 15.02 | 4.85 | 4.99 | 5.00 | 4.96 | 4.89 |
| $B_2O_3$ | 0.00 | 2.00 | 5.03 | 4.97 | 5.00 | 5.38 | 4.84 | 5.06 | 15.24 | 15.55 |
| $Li_2O$ | 6.34 | 8.34 | 5.00 | 10.00 | 10.01 | 4.98 | 5.01 | 13.76 | 13.71 | 1.00 |
| $Na_2O$ | 11.10 | 11.10 | 5.33 | 5.30 | 0.10 | 10.31 | 0.26 | 1.20 | 0.08 | 14.08 |
| $K_2O$ | 0.00 | 0.00 | 5.31 | 0.02 | 5.33 | 0.03 | 10.59 | 0.01 | 1.05 | 0.04 |
| MgO | 0.00 | 0.00 | 0.00 | 0.00 | 0.00 | 0.00 | 0.00 | 0.00 | 0.00 | 0.00 |
| CaO | 0.00 | 0.00 | 0.00 | 0.00 | 0.00 | 0.00 | 0.00 | 0.00 | 0.00 | 0.00 |
| SrO | 0.00 | 0.00 | 0.00 | 0.00 | 0.00 | 0.00 | 0.00 | 0.00 | 0.00 | 0.00 |
| BaO | 0.00 | 0.00 | 0.00 | 0.00 | 0.00 | 0.00 | 0.00 | 0.00 | 0.00 | 0.00 |
| $ZrO_2$ | 0.00 | 0.00 | 0.002 | 0.003 | 0.002 | 0.002 | 0.003 | 0.002 | 0.002 | 0.003 |
| $Y_2O_3$ | 0.00 | 0.00 | 0.00 | 0.00 | 0.00 | 0.00 | 0.00 | 0.00 | 0.00 | 0.00 |
| ZnO | 1.16 | 1.16 | 0.00 | 0.00 | 0.00 | 0.00 | 0.00 | 0.00 | 0.00 | 0.00 |
| $P_2O_5$ | 2.47 | 0.47 | 0.00 | 0.00 | 0.00 | 0.00 | 0.00 | 0.00 | 0.00 | 0.00 |
| $SnO_2$ | 0.04 | 0.04 | 0.09 | 0.10 | 0.10 | 0.10 | 0.09 | 0.10 | 0.10 | 0.10 |
| $Fe_2O_3$ | 0.00 | 0.00 | 0.002 | 0.002 | 0.002 | 0.002 | 0.002 | 0.001 | 0.002 | 0.002 |
| $TiO_2$ | 0.00 | 0.00 | 0.003 | 0.004 | 0.003 | 0.004 | 0.004 | 0.003 | 0.004 | 0.004 |
| Cl | 0.00 | 0.00 | 0.003 | 0.003 | 0.003 | 0.003 | 0.003 | 0.003 | 0.003 | 0.003 |
| Li/(Na + K) | 0.57 | 0.75 | 0.47 | 1.88 | 1.84 | 0.48 | 0.46 | 11.39 | 12.15 | 0.07 |
| (Na + K)/Li | 1.75 | 1.33 | 2.13 | 0.53 | 0.54 | 2.08 | 2.17 | 0.09 | 0.08 | 4.09 |
| Li + Na + K | 17.44 | 19.44 | 15.64 | 15.32 | 15.44 | 15.31 | 15.87 | 14.97 | 14.83 | 15.12 |
| Li/P | 2.57 | 17.73 | — | — | — | — | — | — | — | — |

TABLE 24-continued

| (mol %) | No. 231 | No. 232 | No. 233 | No. 234 | No. 235 | No. 236 | No. 237 | No. 238 | No. 239 | No. 240 |
|---|---|---|---|---|---|---|---|---|---|---|
| P/Li | 0.39 | 0.06 | 0.00 | 0.00 | 0.00 | 0.00 | 0.00 | 0.00 | 0.00 | 0.00 |
| (Na − Li)/(Al + B + P) | 0.21 | 0.14 | 0.02 | −0.24 | −0.50 | 0.52 | −0.48 | −1.25 | −0.67 | 0.64 |
| (B + Na − P)/(Al + Li) | 0.33 | 0.48 | 0.52 | 0.41 | 0.20 | 1.60 | 0.51 | 0.33 | 0.82 | 5.03 |
| Si + 1.2P − 3Al − 2Li − 1.5Na − K − B | −26.72 | −29.12 | −8.80 | −13.11 | −11.13 | 28.96 | 33.38 | 25.49 | 6.15 | 10.95 |
| $\rho$ (g/cm³) | 2.453 | 2.450 | 2.386 | 2.370 | 2.360 | 2.410 | 2.400 | 2.332 | 2.326 | 2.443 |
| $\alpha_{30\text{-}380°\,C.}$ (×10⁻⁷/°C.) | N.A. | 86.0 | 82.6 | 68.7 | 68.9 | 75.7 | 77.6 | 58.8 | 58.5 | 80.1 |
| Ts (°C.) | 913 | 816 | 823 | 817 | 828 | 685 | 737 | N.A. | 640 | 685 |
| $10^{2.5}$ dPa · s (°C.) | 1,547 | 1,487 | 1,610 | 1,516 | 1,556 | 1,362 | 1,448 | 1,382 | 1,146 | 1,149 |
| TL (°C.) | N.A. | 1,055 | 988.8 or less | 1,149.55 | 1,143 | 855.74 | 817.8 | 1,070.7 or more | 894.56 | 647.6 or less |
| logη at TL (dPa · s) | N.A. | 5.0 | 5.94 or more | 4.4 | 4.6 | 5.4 | 6.6 | 3.76 or less | 3.9 | 8.72 or more |
| Acid resistance (HCl 5 wt % 80° C. 24 h) | N.A. | N.A. | N.A. | N.A. | N.A. | N.A. | N.A. | N.A. | N.A. | N.A. |
| Alkali resistance (NaOH 5 wt % 80° C. 6 h) | N.A. | N.A. | N.A. | N.A. | N.A. | N.A. | N.A. | N.A. | N.A. | N.A. |
| E (GPa) | N.A. | 78 | 71 | 76 | 72 | 79 | 72 | 80 | 79 | 77 |
| $K_{1C}$ (MPa · m⁰·⁵) | N.A. | N.A. | N.A. | N.A. | N.A. | N.A. | N.A. | N.A. | N.A. | N.A. |
| $CS_K$ (MPa) | 1,453 | 1,228 | N.A. | N.A. | N.A. | N.A. | N.A. | N.A. | N.A. | N.A. |
| DOL_ZERO$_K$ (μm) | 18 | 14 | N.A. | N.A. | N.A. | N.A. | N.A. | N.A. | N.A. | N.A. |
| $CS_{Na}$ (MPa) | 254 | 321 | N.A. | N.A. | N.A. | N.A. | N.A. | N.A. | N.A. | N.A. |
| DOL_ZERO$_{Na}$ (μm) | 134 | 104 | N.A. | N.A. | N.A. | N.A. | N.A. | N.A. | N.A. | N.A. |

TABLE 25

| (mol %) | No. 241 | No. 242 | No. 243 | No. 244 | No. 245 | No. 246 | No. 247 | No. 248 | No. 249 | No. 250 |
|---|---|---|---|---|---|---|---|---|---|---|
| $SiO_2$ | 64.23 | 64.43 | 64.26 | 64.41 | 64.48 | 74.52 | 74.26 | 74.87 | 74.57 | 65.28 |
| $Al_2O_3$ | 4.93 | 14.92 | 14.89 | 14.82 | 14.77 | 4.95 | 4.94 | 4.95 | 4.92 | 4.99 |
| $B_2O_3$ | 14.45 | 5.11 | 5.26 | 5.15 | 5.02 | 5.20 | 5.36 | 4.65 | 4.93 | 14.56 |
| $Li_2O$ | 1.03 | 0.99 | 1.00 | 0.99 | 1.00 | 5.01 | 4.99 | 5.00 | 4.99 | 8.99 |
| $Na_2O$ | 0.29 | 9.50 | 9.46 | 9.43 | 9.64 | 5.28 | 5.29 | 5.28 | 5.41 | 1.03 |
| $K_2O$ | 14.97 | 0.00 | 0.00 | 0.00 | 0.01 | 0.00 | 0.00 | 0.00 | 0.00 | 0.00 |
| MgO | 0.00 | 4.90 | 0.07 | 0.00 | 0.00 | 4.90 | 0.09 | 0.00 | 0.00 | 4.98 |
| CaO | 0.00 | 0.05 | 4.94 | 0.02 | 0.01 | 0.04 | 4.96 | 0.02 | 0.00 | 0.05 |
| SrO | 0.00 | 0.00 | 0.01 | 5.01 | 0.00 | 0.00 | 0.01 | 5.11 | 0.08 | 0.00 |
| BaO | 0.00 | 0.00 | 0.00 | 0.05 | 4.98 | 0.00 | 0.00 | 0.00 | 4.99 | 0.00 |
| $ZrO_2$ | 0.002 | 0.002 | 0.002 | 0.003 | 0.003 | 0.002 | 0.002 | 0.003 | 0.002 | 0.002 |
| $Y_2O_3$ | 0.00 | 0.00 | 0.00 | 0.00 | 0.00 | 0.00 | 0.00 | 0.00 | 0.00 | 0.00 |
| ZnO | 0.00 | 0.00 | 0.00 | 0.00 | 0.00 | 0.00 | 0.00 | 0.00 | 0.00 | 0.00 |
| $P_2O_5$ | 0.00 | 0.00 | 0.00 | 0.00 | 0.00 | 0.00 | 0.00 | 0.00 | 0.00 | 0.00 |
| $SnO_2$ | 0.09 | 0.10 | 0.10 | 0.11 | 0.09 | 0.10 | 0.10 | 0.10 | 0.10 | 0.10 |
| $Fe_2O_3$ | 0.002 | 0.002 | 0.002 | 0.002 | 0.002 | 0.002 | 0.002 | 0.002 | 0.002 | 0.002 |
| $TiO_2$ | 0.003 | 0.003 | 0.003 | 0.004 | 0.004 | 0.003 | 0.004 | 0.004 | 0.003 | 0.004 |
| Cl | 0.003 | 0.003 | 0.003 | 0.003 | 0.003 | 0.003 | 0.003 | 0.003 | 0.003 | 0.003 |
| Li/(Na + K) | 0.07 | 0.10 | 0.11 | 0.11 | 0.10 | 0.95 | 0.94 | 0.95 | 0.92 | 8.77 |
| (Na + K)/Li | 14.80 | 9.58 | 9.44 | 9.50 | 9.61 | 1.05 | 1.06 | 1.06 | 1.08 | 0.11 |
| Li + Na + K | 16.28 | 10.49 | 10.47 | 10.42 | 10.65 | 10.29 | 10.28 | 10.28 | 10.40 | 10.02 |
| Li/P | — | — | — | — | — | — | — | — | — | — |
| P/Li | 0.00 | 0.00 | 0.00 | 0.00 | 0.00 | 0.00 | 0.00 | 0.00 | 0.00 | 0.00 |
| (Na − Li)/(Al + B + P) | −0.04 | 0.42 | 0.42 | 0.42 | 0.44 | 0.03 | 0.03 | 0.03 | 0.04 | −0.41 |
| (B + Na − P)/(Al + Li) | 2.47 | 0.92 | 0.93 | 0.92 | 0.93 | 1.05 | 1.07 | 1.00 | 1.04 | 1.11 |
| Si + 1.2P − 3Al − 2Li − 1.5Na − K − B | 17.53 | −1.66 | −1.86 | −1.33 | −1.31 | 36.54 | 36.17 | 37.43 | 36.79 | 16.21 |
| $\rho$ (g/cm³) | 2.426 | 2.403 | 2.421 | 2.496 | 2.562 | 2.352 | 2.393 | 2.489 | 2.572 | 2.312 |
| $\alpha_{30\text{-}380°\,C.}$ (×10⁻⁷/°C.) | 84.1 | 59.8 | 65.4 | 68.2 | 70.1 | 56.5 | 60.4 | 62.3 | 63.6 | 49.6 |
| Ts (°C.) | 730 | 904 | 899 | 897 | 896 | 741 | 721 | 714 | 708 | 682 |
| $10^{2.5}$ dPa · s (°C.) | 1,222 | 1,572 | 1,583 | 1,600 | 1,616 | 1,527 | 1,451 | 1,428 | 1,411 | 1,279 |
| TL (°C.) | 1,032.5 | 1,146.02 | 1,196.47 | 1,288.2 or more | 1,282.9 or more | 1,035.2 | 1,059.4 or more | 1,038.4 | 1,018.84 | 921.5 |

TABLE 25-continued

| (mol %) | No. 241 | No. 242 | No. 243 | No. 244 | No. 245 | No. 246 | No. 247 | No. 248 | No. 249 | No. 250 |
|---|---|---|---|---|---|---|---|---|---|---|
| $\log\eta$ at TL (dPa · s) | 3.6 | 5.0 | 4.6 | 4.04 or less | 4.16 or less | 4.6 | 4.17 or less | 4.2 | 4.2 | 4.4 |
| Acid resistance (HCl 5 wt % 80° C. 24 h) | N.A. | N.A. | N.A. | N.A. | N.A. | N.A. | N.A. | N.A. | N.A. | N.A. |
| Alkali resistance (NaOH 5 wt % 80° C. 6 h) | N.A. | N.A. | N.A. | N.A. | N.A. | N.A. | N.A. | N.A. | N.A. | N.A. |
| E (GPa) | 69 | 74 | 73 | 72 | 71 | 77 | 79 | 80 | 79 | 76 |
| $K_{1C}$ (MPa · m$^{0.5}$) | N.A. | N.A. | N.A. | N.A. | N.A. | N.A. | N.A. | N.A. | N.A. | N.A. |
| $CS_K$ (MPa) | N.A. | N.A. | N.A. | N.A. | N.A. | N.A. | N.A. | N.A. | N.A. | N.A. |
| $DOL\_ZERO_K$ (µm) | N.A. | N.A. | N.A. | N.A. | N.A. | N.A. | N.A. | N.A. | N.A. | N.A. |
| $CS_{Na}$ (MPa) | N.A. | N.A. | N.A. | N.A. | N.A. | N.A. | N.A. | N.A. | N.A. | N.A. |
| $DOL\_ZERO_{Na}$ (µm) | N.A. | N.A. | N.A. | N.A. | N.A. | N.A. | N.A. | N.A. | N.A. | N.A. |

TABLE 26

| (mol %) | No. 251 | No. 252 | No. 253 | No. 254 | No. 255 | No. 256 | No. 257 | No. 258 | No. 259 | No. 260 |
|---|---|---|---|---|---|---|---|---|---|---|
| $SiO_2$ | 65.00 | 64.38 | 65.27 | 64.83 | 64.61 | 65.04 | 64.95 | 64.73 | 64.52 | 64.61 |
| $Al_2O_3$ | 4.97 | 4.98 | 4.96 | 14.92 | 14.92 | 15.01 | 15.03 | 14.81 | 14.91 | 14.89 |
| $B_2O_3$ | 14.75 | 15.35 | 15.03 | 5.09 | 5.24 | 4.87 | 4.89 | 5.18 | 5.33 | 5.23 |
| $Li_2O$ | 8.99 | 9.01 | 8.57 | 5.00 | 5.00 | 14.00 | 13.99 | 1.01 | 1.00 | 0.99 |
| $Na_2O$ | 1.05 | 1.16 | 1.04 | 10.02 | 0.11 | 0.97 | 0.09 | 14.13 | 0.12 | 0.08 |
| $K_2O$ | 0.00 | 0.00 | 0.00 | 0.03 | 10.01 | 0.01 | 0.94 | 0.04 | 14.02 | 9.12 |
| MgO | 0.09 | 0.00 | 0.00 | 0.00 | 0.00 | 0.00 | 0.00 | 0.00 | 0.00 | 4.98 |
| CaO | 5.04 | 0.02 | 0.01 | 0.00 | 0.00 | 0.00 | 0.00 | 0.00 | 0.00 | 0.00 |
| SrO | 0.01 | 4.92 | 0.00 | 0.00 | 0.00 | 0.00 | 0.00 | 0.00 | 0.00 | 0.00 |
| BaO | 0.00 | 0.06 | 5.02 | 0.00 | 0.00 | 0.00 | 0.00 | 0.00 | 0.00 | 0.00 |
| $ZrO_2$ | 0.002 | 0.003 | 0.002 | 0.002 | 0.003 | 0.003 | 0.002 | 0.002 | 0.002 | 0.002 |
| $Y_2O_3$ | 0.00 | 0.00 | 0.00 | 0.00 | 0.00 | 0.00 | 0.00 | 0.00 | 0.00 | 0.00 |
| ZnO | 0.00 | 0.00 | 0.00 | 0.00 | 0.00 | 0.00 | 0.00 | 0.00 | 0.00 | 0.00 |
| $P_2O_5$ | 0.00 | 0.00 | 0.00 | 0.00 | 0.00 | 0.00 | 0.00 | 0.00 | 0.00 | 0.00 |
| $SnO_2$ | 0.10 | 0.10 | 0.10 | 0.10 | 0.09 | 0.10 | 0.10 | 0.10 | 0.09 | 0.09 |
| $Fe_2O_3$ | 0.002 | 0.002 | 0.002 | 0.002 | 0.002 | 0.002 | 0.002 | 0.002 | 0.002 | 0.002 |
| $TiO_2$ | 0.003 | 0.004 | 0.003 | 0.003 | 0.004 | 0.004 | 0.003 | 0.003 | 0.004 | 0.003 |
| Cl | 0.003 | 0.003 | 0.003 | 0.003 | 0.003 | 0.003 | 0.003 | 0.003 | 0.003 | 0.003 |
| Li/(Na + K) | 8.57 | 7.75 | 8.23 | 0.50 | 0.49 | 14.31 | 13.51 | 0.07 | 0.07 | 0.11 |
| (Na + K)/Li | 0.12 | 0.13 | 0.12 | 2.01 | 2.02 | 0.07 | 0.07 | 14.07 | 14.09 | 9.30 |
| Li + Na + K | 10.03 | 10.18 | 9.61 | 15.05 | 15.12 | 14.98 | 15.03 | 15.17 | 15.14 | 10.19 |
| Li/P | — | — | — | — | — | — | — | — | — | — |
| P/Li | 0.00 | 0.00 | 0.00 | 0.00 | 0.00 | 0.00 | 0.00 | 0.00 | 0.00 | 0.00 |
| (Na − Li)/ (Al + B + P) | −0.40 | −0.39 | −0.38 | 0.25 | −0.24 | −0.66 | −0.70 | 0.66 | −0.04 | −0.05 |
| (B + Na − P)/ (Al + Li) | 1.13 | 1.18 | 1.19 | 0.76 | 0.27 | 0.20 | 0.17 | 1.22 | 0.34 | 0.33 |
| Si + 1.2P − 3Al − 2Li − 1.5Na − K − B | 15.81 | 14.31 | 16.67 | −10.09 | −5.57 | −14.33 | −14.08 | −8.13 | −1.76 | 3.48 |
| $\rho$ (g/cm$^3$) | 2.355 | 2.446 | 2.527 | 2.383 | 2.369 | 2.353 | 2.351 | 2.397 | N.A. | 2.382 |
| $\alpha_{30-380°\,C.}$ (×10$^{-7}$/° C.) | 52.4 | 53.7 | 54.9 | 75.7 | 78.0 | 60.9 | 60.5 | 82.1 | N.A. | 61.0 |
| Ts (° C.) | 699 | 697 | 683 | 843 | 880 | N.A. | N.A. | 872 | N.A. | 966 |
| 10$^{2.5}$ dPa · s (° C.) | 1,222 | 1,210 | 1,194 | 1,586 | 1,672 | 1,478 | 1,481 | 1,663 | 1,788 | 1,656 |
| TL (° C.) | 972.78 | 974.8 | 951.02 | 1,052.8 or more | 1,120.3 or more | 1,277.92 | 1,305.6 | 746.6 or less | N.A. | 1,253 or more |
| $\log\eta$ at TL (dPa · s) | 3.7 | 3.7 | 3.8 | 5.42 or less | 5.40 or less | 3.4 | 3.3 | 9.57 or more | N.A. | 4.68 or less |
| Acid resistance (HCl 5 wt % 80° C. 24 h) | N.A. | N.A. | N.A. | N.A. | N.A. | N.A. | N.A. | N.A. | N.A. | N.A. |
| Alkali resistance (NaOH 5 wt % 80° C. 6 h) | N.A. | N.A. | N.A. | N.A. | N.A. | N.A. | N.A. | N.A. | N.A. | N.A. |
| E (GPa) | 79 | 79 | 79 | 72 | 66 | 77 | 76 | 68 | N.A. | 68 |
| $K_{1C}$ (MPa · m$^{0.5}$) | N.A. | N.A. | N.A. | N.A. | N.A. | N.A. | N.A. | N.A. | N.A. | N.A. |
| $CS_K$ (MPa) | N.A. | N.A. | N.A. | N.A. | N.A. | N.A. | N.A. | N.A. | N.A. | N.A. |
| $DOL\_ZERO_K$ (µm) | N.A. | N.A. | N.A. | N.A. | N.A. | N.A. | N.A. | N.A. | N.A. | N.A. |

TABLE 26-continued

| (mol %) | No. 251 | No. 252 | No. 253 | No. 254 | No. 255 | No. 256 | No. 257 | No. 258 | No. 259 | No. 260 |
|---|---|---|---|---|---|---|---|---|---|---|
| $CS_{Na}$ (MPa) | N.A. | N.A. | N.A. | N.A. | N.A. | N.A. | N.A. | N.A. | N.A. | N.A. |
| $DOL\_ZERO_{Na}$ (μm) | N.A. | N.A. | N.A. | N.A. | N.A. | N.A. | N.A. | N.A. | N.A. | N.A. |

TABLE 27

| (mol %) | No. 261 | No. 262 | No. 263 | No. 264 | No. 265 | No. 266 | No. 267 | No. 268 | No. 269 | No. 270 |
|---|---|---|---|---|---|---|---|---|---|---|
| $SiO_2$ | 64.56 | 64.63 | 64.55 | 64.64 | 64.56 | 64.27 | 64.23 | 64.66 | 64.55 | 64.74 |
| $Al_2O_3$ | 14.96 | 14.88 | 14.80 | 14.94 | 14.93 | 14.89 | 14.87 | 14.93 | 14.97 | 15.03 |
| $B_2O_3$ | 5.20 | 5.16 | 5.34 | 5.00 | 5.07 | 5.35 | 5.34 | 5.13 | 5.21 | 5.08 |
| $Li_2O$ | 1.00 | 1.01 | 0.99 | 5.01 | 5.01 | 5.01 | 5.00 | 5.01 | 5.02 | 5.01 |
| $Na_2O$ | 0.09 | 0.13 | 0.12 | 5.29 | 5.28 | 5.31 | 5.45 | 0.06 | 0.08 | 0.12 |
| $K_2O$ | 9.09 | 9.08 | 9.15 | 0.01 | 0.01 | 0.01 | 0.01 | 5.12 | 5.11 | 4.95 |
| $MgO$ | 0.05 | 0.00 | 0.00 | 4.96 | 0.05 | 0.00 | 0.00 | 4.98 | 0.05 | 0.00 |
| $CaO$ | 4.93 | 0.00 | 0.00 | 0.05 | 5.00 | 0.02 | 0.00 | 0.00 | 4.91 | 0.00 |
| $SrO$ | 0.00 | 4.95 | 0.00 | 0.00 | 0.00 | 4.98 | 0.00 | 0.00 | 0.00 | 4.92 |
| $BaO$ | 0.00 | 0.05 | 4.94 | 0.00 | 0.00 | 0.05 | 4.99 | 0.00 | 0.00 | 0.05 |
| $ZrO_2$ | 0.003 | 0.002 | 0.003 | 0.003 | 0.002 | 0.002 | 0.002 | 0.002 | 0.003 | 0.002 |
| $Y_2O_3$ | 0.00 | 0.00 | 0.00 | 0.00 | 0.00 | 0.00 | 0.00 | 0.00 | 0.00 | 0.00 |
| $ZnO$ | 0.00 | 0.00 | 0.00 | 0.00 | 0.00 | 0.00 | 0.00 | 0.00 | 0.00 | 0.00 |
| $P_2O_5$ | 0.00 | 0.00 | 0.00 | 0.00 | 0.00 | 0.00 | 0.00 | 0.00 | 0.00 | 0.00 |
| $SnO_2$ | 0.09 | 0.10 | 0.09 | 0.09 | 0.10 | 0.09 | 0.10 | 0.10 | 0.10 | 0.09 |
| $Fe_2O_3$ | 0.002 | 0.002 | 0.002 | 0.002 | 0.002 | 0.002 | 0.002 | 0.002 | 0.002 | 0.002 |
| $TiO_2$ | 0.004 | 0.004 | 0.005 | 0.004 | 0.003 | 0.003 | 0.004 | 0.003 | 0.004 | 0.003 |
| Cl | 0.003 | 0.003 | 0.003 | 0.003 | 0.003 | 0.003 | 0.003 | 0.003 | 0.003 | 0.003 |
| Li/(Na + K) | 0.11 | 0.11 | 0.11 | 0.95 | 0.95 | 0.94 | 0.92 | 0.97 | 0.97 | 0.99 |
| (Na + K)/Li | 9.16 | 9.11 | 9.32 | 1.06 | 1.06 | 1.06 | 1.09 | 1.04 | 1.03 | 1.01 |
| Li + Na + K | 10.19 | 10.22 | 10.27 | 10.31 | 10.30 | 10.33 | 10.46 | 10.19 | 10.20 | 10.08 |
| Li/P | — | — | — | — | — | — | — | — | — | — |
| P/Li | 0.00 | 0.00 | 0.00 | 0.00 | 0.00 | 0.00 | 0.00 | 0.00 | 0.00 | 0.00 |
| (Na − Li)/ (Al + B + P) | −0.05 | −0.04 | −0.04 | 0.01 | 0.01 | 0.01 | 0.02 | −0.25 | −0.24 | −0.24 |
| (B + Na − P)/ (Al + Li) | 0.33 | 0.33 | 0.35 | 0.52 | 0.52 | 0.54 | 0.54 | 0.26 | 0.26 | 0.26 |
| Si + 1.2P − 3Al − 2Li − 1.5Na − K − B | 3.25 | 3.52 | 3.51 | −3.13 | −3.22 | −3.74 | −3.90 | −0.50 | −0.82 | −0.59 |
| ρ (g/cm³) | 2.394 | 2.471 | 2.533 | 2.396 | 2.413 | 2.487 | 2.552 | 2.384 | 2.400 | 2.472 |
| $\alpha_{30-380° C.}$ (×10⁻⁷/° C.) | 66.6 | 69.2 | 71.3 | 54.2 | 59.4 | 61.7 | 63.6 | 54.4 | 59.5 | 61.2 |
| Ts (° C.) | 961 | 966 | N.A. | 870 | 864 | 861 | 861 | 888 | 884 | 888 |
| $10^{2.5}$ dPa · s (° C.) | 1,685 | 1,705 | 1,725 | 1,523 | 1,530 | 1,553 | 1,561 | 1,562 | 1,571 | 1,585 |
| TL (° C.) | 1,169.38 | 1,231.2 or more | 1,228.1 or more | 1,147.04 | 1,166.49 | 1,226.86 | 1,178.64 | 1,163.92 | 1,179.1 or less | 1,231.2 or more |
| logη at TL (dPa · s) | 5.4 | 5.07 or less | 5.29 or less | 4.6 | 4.4 | 4.1 | 4.5 | 4.7 | 4.58 or more | 4.33 or less |
| Acid resistance (HCl 5 wt % 80° C. 24 h) | N.A. | N.A. | N.A. | N.A. | N.A. | N.A. | N.A. | N.A. | N.A. | N.A. |
| Alkali resistance (NaOH 5 wt % 80° C. 6 h) | N.A. | N.A. | N.A. | N.A. | N.A. | N.A. | N.A. | N.A. | N.A. | N.A. |
| E (GPa) | 67 | 66 | 65 | 78 | 77 | 76 | 74 | 74 | 73 | 72 |
| $K_{1C}$ (MPa · m⁰·⁵) | N.A. | N.A. | N.A. | N.A. | N.A. | N.A. | N.A. | N.A. | N.A. | N.A. |
| $CS_K$ (MPa) | N.A. | N.A. | N.A. | N.A. | N.A. | N.A. | N.A. | N.A. | N.A. | N.A. |
| $DOL\_ZERO_K$ (μm) | N.A. | N.A. | N.A. | N.A. | N.A. | N.A. | N.A. | N.A. | N.A. | N.A. |
| $CS_{Na}$ (MPa) | N.A. | N.A. | N.A. | N.A. | N.A. | N.A. | N.A. | N.A. | N.A. | N.A. |
| $DOL\_ZERO_{Na}$ (μm) | N.A. | N.A. | N.A. | N.A. | N.A. | N.A. | N.A. | N.A. | N.A. | N.A. |

TABLE 28

| (mol %) | No. 271 | No. 272 | No. 273 | No. 274 | No. 275 | No. 276 | No. 277 | No. 278 | No. 279 | No. 280 |
|---|---|---|---|---|---|---|---|---|---|---|
| $SiO_2$ | 64.68 | 64.70 | 64.71 | 65.64 | 64.86 | 64.69 | 64.72 | 64.87 | 64.54 | 64.46 |
| $Al_2O_3$ | 14.91 | 15.09 | 15.08 | 14.82 | 14.92 | 15.04 | 15.03 | 14.99 | 14.94 | 15.02 |
| $B_2O_3$ | 5.25 | 5.09 | 5.06 | 4.57 | 5.14 | 5.12 | 5.09 | 4.89 | 5.27 | 5.26 |
| $Li_2O$ | 4.99 | 9.01 | 9.00 | 8.99 | 8.99 | 9.01 | 9.01 | 9.00 | 8.99 | 5.01 |
| $Na_2O$ | 0.10 | 0.96 | 0.97 | 0.94 | 1.00 | 0.06 | 0.07 | 0.11 | 0.09 | 0.05 |
| $K_2O$ | 4.99 | 0.00 | 0.00 | 0.00 | 0.00 | 0.97 | 0.97 | 0.96 | 0.98 | 0.00 |

TABLE 28-continued

| (mol %) | No. 271 | No. 272 | No. 273 | No. 274 | No. 275 | No. 276 | No. 277 | No. 278 | No. 279 | No. 280 |
|---|---|---|---|---|---|---|---|---|---|---|
| MgO | 0.00 | 5.00 | 0.05 | 0.00 | 0.00 | 4.99 | 0.00 | 0.00 | 0.00 | 7.01 |
| CaO | 0.00 | 0.05 | 5.03 | 0.02 | 0.00 | 0.03 | 5.02 | 0.01 | 0.00 | 1.04 |
| SrO | 0.00 | 0.00 | 0.00 | 4.87 | 0.00 | 0.00 | 0.00 | 5.01 | 0.00 | 1.02 |
| BaO | 4.96 | 0.00 | 0.00 | 0.06 | 4.98 | 0.00 | 0.00 | 0.06 | 5.06 | 1.02 |
| $ZrO_2$ | 0.003 | 0.003 | 0.000 | 0.002 | 0.001 | 0.001 | 0.002 | 0.004 | 0.006 | 0.004 |
| $Y_2O_3$ | 0.00 | 0.00 | 0.00 | 0.00 | 0.00 | 0.00 | 0.00 | 0.00 | 0.00 | 0.00 |
| ZnO | 0.00 | 0.00 | 0.00 | 0.00 | 0.00 | 0.00 | 0.00 | 0.00 | 0.00 | 0.00 |
| $P_2O_5$ | 0.00 | 0.00 | 0.00 | 0.00 | 0.00 | 0.00 | 0.00 | 0.00 | 0.00 | 0.00 |
| $SnO_2$ | 0.10 | 0.10 | 0.10 | 0.09 | 0.10 | 0.10 | 0.09 | 0.09 | 0.10 | 0.10 |
| $Fe_2O_3$ | 0.002 | 0.002 | 0.000 | 0.001 | 0.001 | 0.000 | 0.002 | 0.003 | 0.004 | 0.003 |
| $TiO_2$ | 0.004 | 0.004 | 0.000 | 0.002 | 0.002 | 0.001 | 0.003 | 0.006 | 0.009 | 0.007 |
| Cl | 0.003 | 0.003 | 0.003 | 0.003 | 0.003 | 0.003 | 0.003 | 0.003 | 0.003 | 0.003 |
| Li/(Na + K) | 0.98 | 9.38 | 9.27 | 9.55 | 8.99 | 8.71 | 8.63 | 8.46 | 8.43 | ∞ |
| (Na + K)/Li | 1.02 | 0.11 | 0.11 | 0.10 | 0.11 | 0.11 | 0.12 | 0.12 | 0.12 | 0.01 |
| Li + Na + K | 10.09 | 9.97 | 9.98 | 9.93 | 9.99 | 10.04 | 10.05 | 10.07 | 10.06 | 5.07 |
| Li/P | — | — | — | — | — | — | — | — | — | — |
| P/Li | 0.00 | 0.00 | 0.00 | 0.00 | 0.00 | 0.00 | 0.00 | 0.00 | 0.00 | 0.00 |
| (Na − Li)/(Al + B + P) | −0.24 | −0.40 | −0.40 | −0.41 | −0.40 | −0.44 | −0.44 | −0.45 | −0.44 | −0.24 |
| (B + Na − P)/(Al + Li) | 0.27 | 0.25 | 0.25 | 0.23 | 0.26 | 0.22 | 0.21 | 0.21 | 0.22 | 0.27 |
| Si + 1.2P − 3Al − 2Li − 1.5Na − K − B | −0.44 | −5.12 | −5.05 | −2.78 | −4.53 | −4.62 | −4.55 | −4.12 | −4.66 | 4.04 |
| ρ (g/cm³) | 2.534 | 2.386 | 2.403 | 2.477 | 2.542 | 2.383 | 2.400 | 2.474 | 2.539 | 2.471 |
| $\alpha_{30\text{-}380°\,C.}$ (×10⁻⁷/° C.) | 62.7 | 48.6 | 52.5 | 55.1 | 56.8 | 48.6 | 53.5 | 55.3 | 55.2 | 39.6 |
| Ts (° C.) | 904 | 860 | 849 | 847 | 850 | 865 | 848 | 845 | N.A. | 897 |
| $10^{2.5}$ dPa · s (° C.) | 1,605 | 1,466 | 1,477 | 1,490 | 1,503 | 1,477 | 1,484 | 1,500 | 1,509 | 1,485 |
| TL (° C.) | 1,228.1 or more | 1,192.11 | 1,191.16 | 1,195.44 | 1,189.28 | 1,216.08 | 1,189.28 | 1,201.32 | 1,181.12 | 1,264.8 |
| logη at TL (dPa · s) | 4.49 or less | 4.0 | 4.0 | 4.0 | 4.1 | 3.9 | 4.1 | 4.0 | 4.2 | 3.7 |
| Acid resistance (HCl 5 wt % 80° C. 24 h) | N.A. | N.A. | N.A. | N.A. | N.A. | N.A. | N.A. | N.A. | N.A. | N.A. |
| Alkali resistance (NaOH 5 wt % 80° C. 6 h) | N.A. | N.A. | N.A. | N.A. | N.A. | N.A. | N.A. | N.A. | N.A. | N.A. |
| E (GPa) | 70 | 81 | 79 | 78 | 76 | 80 | 78 | 77 | 76 | 83 |
| $K_{1C}$ (MPa · m⁰·⁵) | N.A. | N.A. | N.A. | N.A. | N.A. | N.A. | N.A. | N.A. | N.A. | N.A. |
| $CS_K$ (MPa) | N.A. | N.A. | N.A. | N.A. | N.A. | N.A. | N.A. | N.A. | N.A. | N.A. |
| DOL__ZERO$_K$ (μm) | N.A. | N.A. | N.A. | N.A. | N.A. | N.A. | N.A. | N.A. | N.A. | N.A. |
| $CS_{Na}$ (MPa) | N.A. | N.A. | N.A. | N.A. | N.A. | N.A. | N.A. | N.A. | N.A. | N.A. |
| DOL__ZERO$_{Na}$ (μm) | N.A. | N.A. | N.A. | N.A. | N.A. | N.A. | N.A. | N.A. | N.A. | N.A. |

TABLE 29

| (mol %) | No. 281 | No. 282 | No. 283 | No. 284 | No. 285 | No. 286 | No. 287 | No. 288 | No. 289 | No. 290 |
|---|---|---|---|---|---|---|---|---|---|---|
| $SiO_2$ | 64.56 | 64.70 | 64.40 | 64.53 | 64.60 | 64.46 | 64.53 | 64.36 | 64.57 | 75.33 |
| $Al_2O_3$ | 14.96 | 14.93 | 14.94 | 15.07 | 15.05 | 14.99 | 15.01 | 14.95 | 14.88 | 5.04 |
| $B_2O_3$ | 5.24 | 5.17 | 5.39 | 5.17 | 5.08 | 5.27 | 5.13 | 5.32 | 5.29 | 4.88 |
| $Li_2O$ | 4.99 | 5.00 | 5.00 | 5.01 | 5.00 | 5.00 | 5.01 | 5.01 | 5.01 | 4.99 |
| $Na_2O$ | 0.06 | 0.11 | 0.09 | 0.05 | 0.09 | 0.07 | 0.10 | 0.08 | 0.12 | 5.02 |
| $K_2O$ | 0.00 | 0.00 | 0.00 | 0.00 | 0.00 | 0.00 | 0.00 | 0.00 | 0.00 | 4.62 |
| MgO | 1.02 | 0.98 | 1.00 | 5.01 | 4.98 | 4.98 | 0.05 | 0.05 | 0.00 | 0.00 |
| CaO | 7.04 | 1.01 | 1.04 | 5.03 | 0.06 | 0.05 | 5.01 | 5.09 | 0.03 | 0.00 |
| SrO | 1.02 | 6.94 | 1.01 | 0.01 | 5.00 | 0.01 | 5.00 | 0.01 | 4.96 | 0.00 |
| BaO | 1.00 | 1.06 | 7.02 | 0.00 | 0.05 | 5.01 | 0.06 | 5.02 | 5.04 | 0.00 |
| $ZrO_2$ | 0.002 | 0.002 | 0.002 | 0.002 | 0.002 | 0.019 | 0.002 | 0.002 | 0.002 | 0.007 |
| $Y_2O_3$ | 0.00 | 0.00 | 0.00 | 0.00 | 0.00 | 0.00 | 0.00 | 0.00 | 0.00 | 0.00 |
| ZnO | 0.00 | 0.00 | 0.00 | 0.00 | 0.00 | 0.00 | 0.00 | 0.00 | 0.00 | 0.00 |
| $P_2O_5$ | 0.00 | 0.00 | 0.00 | 0.00 | 0.00 | 0.00 | 0.00 | 0.00 | 0.00 | 0.00 |
| $SnO_2$ | 0.10 | 0.10 | 0.10 | 0.09 | 0.10 | 0.10 | 0.09 | 0.10 | 0.10 | 0.10 |
| $Fe_2O_3$ | 0.001 | 0.001 | 0.001 | 0.001 | 0.002 | 0.015 | 0.002 | 0.002 | 0.001 | 0.005 |
| $TiO_2$ | 0.002 | 0.003 | 0.003 | 0.002 | 0.003 | 0.029 | 0.003 | 0.004 | 0.003 | 0.010 |
| Cl | 0.003 | 0.003 | 0.003 | 0.003 | 0.003 | 0.003 | 0.003 | 0.003 | 0.003 | 0.003 |
| Li/(Na + K) | ∞ | ∞ | ∞ | ∞ | ∞ | ∞ | ∞ | ∞ | ∞ | 0.52 |
| (Na + K)/Li | 0.01 | 0.02 | 0.02 | 0.01 | 0.02 | 0.02 | 0.02 | 0.02 | 0.02 | 1.93 |
| Li + Na + K | 5.06 | 5.11 | 5.09 | 5.07 | 5.09 | 5.07 | 5.11 | 5.09 | 5.12 | 14.63 |
| Li/P | — | — | — | — | — | — | — | — | — | — |

TABLE 29-continued

| (mol %) | No. 281 | No. 282 | No. 283 | No. 284 | No. 285 | No. 286 | No. 287 | No. 288 | No. 289 | No. 290 |
|---|---|---|---|---|---|---|---|---|---|---|
| P/Li | 0.00 | 0.00 | 0.00 | 0.00 | 0.00 | 0.00 | 0.00 | 0.00 | 0.00 | 0.00 |
| $(Na - Li)/$ $(Al + B + P)$ | -0.24 | -0.24 | -0.24 | -0.25 | -0.24 | -0.24 | -0.24 | -0.24 | -0.24 | 0.00 |
| $(B + Na - P)/$ $(Al + Li)$ | 0.27 | 0.26 | 0.28 | 0.26 | 0.26 | 0.27 | 0.26 | 0.27 | 0.27 | 0.99 |
| $Si + 1.2P - 3Al -$ $2Li - 1.5Na -$ $K - B$ | 4.36 | 4.58 | 4.04 | 4.03 | 4.26 | 4.12 | 4.19 | 4.04 | 4.45 | 33.18 |
| $\rho$ (g/cm$^3$) | 2.486 | 2.573 | 2.650 | 2.434 | 2.508 | 2.573 | 2.521 | 2.586 | 2.655 | 2.401 |
| $\alpha_{30\text{-}380^\circ\ C.}$ $(\times10^{-7}/^\circ\ C.)$ | 44.4 | 46.6 | 47.4 | 40.1 | 42.0 | 42.8 | 45.9 | 47.1 | 49.2 | 76.1 |
| Ts (° C.) | 902 | 904 | 905 | 897 | 898 | 904 | 903 | 904 | 907 | 700 |
| $10^{2.5}$ dPa · s (° C.) | 1,495 | 1,518 | 1,527 | 1,478 | 1,494 | 1,503 | 1,507 | 1,517 | 1,528 | 1,417 |
| TL (° C.) | 1,171.83 | 1,198.38 | 1,216.68 | 1,233.84 | 1,202.88 | 1,193.92 | 1,234.92 | 1,123.7 | 1,253.92 | 934.9 or less |
| log$\eta$ at TL (dPa · s) | 4.4 | 4.3 | 4.3 | 3.9 | 4.2 | 4.3 | 4.0 | 4.9 | 4.0 | 4.8 |
| Acid resistance (HCl 5 wt % 80° C. 24 h) | N.A. | N.A. | N.A. | N.A. | N.A. | N.A. | N.A. | N.A. | N.A. | N.A. |
| Alkali resistance (NaOH 5 wt % 80° C. 6 h) | N.A. | N.A. | N.A. | N.A. | N.A. | N.A. | N.A. | N.A. | N.A. | N.A. |
| E (GPa) | 81 | 79 | 77 | 83 | 82 | 80 | 80 | 78 | 77 | 76 |
| $K_{1C}$ (MPa · m$^{0.5}$) | N.A. | N.A. | N.A. | N.A. | N.A. | N.A. | N.A. | N.A. | N.A. | N.A. |
| $CS_K$ (MPa) | N.A. | N.A. | N.A. | N.A. | N.A. | N.A. | N.A. | N.A. | N.A. | N.A. |
| DOL__ZERO$_K$ (μm) | N.A. | N.A. | N.A. | N.A. | N.A. | N.A. | N.A. | N.A. | N.A. | N.A. |
| $CS_{Na}$ (MPa) | N.A. | N.A. | N.A. | N.A. | N.A. | N.A. | N.A. | N.A. | N.A. | N.A. |
| DOL__ZERO$_{Na}$ (μm) | N.A. | N.A. | N.A. | N.A. | N.A. | N.A. | N.A. | N.A. | N.A. | N.A. |

TABLE 30

| (mol %) | No. 291 | No. 292 | No. 293 | No. 294 | No. 295 | No. 296 | No. 297 | No. 298 | No. 299 | No. 300 |
|---|---|---|---|---|---|---|---|---|---|---|
| SiO$_2$ | 75.03 | 75.18 | 75.04 | 74.67 | 75.24 | 74.75 | 74.71 | 74.97 | 74.50 | 71.50 |
| Al$_2$O$_3$ | 5.01 | 5.04 | 5.02 | 4.98 | 5.07 | 4.96 | 4.97 | 4.98 | 4.94 | 4.75 |
| B$_2$O$_3$ | 4.90 | 4.94 | 4.82 | 5.32 | 5.11 | 5.13 | 5.20 | 5.12 | 5.32 | 4.87 |
| Li$_2$O | 10.00 | 9.98 | 14.01 | 1.01 | 0.99 | 0.99 | 1.00 | 1.00 | 0.99 | 0.95 |
| Na$_2$O | 4.88 | 0.05 | 0.05 | 13.87 | 0.11 | 9.06 | 8.94 | 8.74 | 9.10 | 13.03 |
| K$_2$O | 0.03 | 4.71 | 0.92 | 0.05 | 13.39 | 0.01 | 0.01 | 0.00 | 0.00 | 0.00 |
| MgO | 0.00 | 0.00 | 0.00 | 0.00 | 0.00 | 4.95 | 0.06 | 0.00 | 0.00 | 4.76 |
| CaO | 0.00 | 0.00 | 0.00 | 0.00 | 0.00 | 0.05 | 5.01 | 0.02 | 0.00 | 0.04 |
| SrO | 0.00 | 0.00 | 0.00 | 0.00 | 0.00 | 0.00 | 0.00 | 5.01 | 0.00 | 0.00 |
| BaO | 0.00 | 0.00 | 0.00 | 0.00 | 0.00 | 0.00 | 0.00 | 0.05 | 5.05 | 0.00 |
| ZrO$_2$ | 0.016 | 0.001 | 0.011 | 0.002 | 0.002 | 0.002 | 0.002 | 0.002 | 0.002 | 0.002 |
| Y$_2$O$_3$ | 0.00 | 0.00 | 0.00 | 0.00 | 0.00 | 0.00 | 0.00 | 0.00 | 0.00 | 0.00 |
| ZnO | 0.00 | 0.00 | 0.00 | 0.00 | 0.00 | 0.00 | 0.00 | 0.00 | 0.00 | 0.00 |
| P$_2$O$_5$ | 0.00 | 0.00 | 0.00 | 0.00 | 0.00 | 0.00 | 0.00 | 0.00 | 0.00 | 0.00 |
| SnO$_2$ | 0.10 | 0.10 | 0.10 | 0.10 | 0.09 | 0.09 | 0.10 | 0.09 | 0.10 | 0.09 |
| Fe$_2$O$_3$ | 0.012 | 0.001 | 0.009 | 0.002 | 0.002 | 0.002 | 0.002 | 0.002 | 0.002 | 0.002 |
| TiO$_2$ | 0.025 | 0.002 | 0.018 | 0.003 | 0.003 | 0.003 | 0.003 | 0.003 | 0.003 | 0.003 |
| Cl | 0.003 | 0.003 | 0.003 | 0.003 | 0.003 | 0.003 | 0.003 | 0.003 | 0.003 | 0.003 |
| Li/(Na + K) | 2.04 | 2.10 | 14.41 | 0.07 | 0.07 | 0.11 | 0.11 | 0.11 | 0.11 | 0.07 |
| (Na + K)/Li | 0.49 | 0.48 | 0.07 | 13.81 | 13.66 | 9.16 | 8.92 | 8.76 | 9.18 | 13.73 |
| Li + Na + K | 14.91 | 14.74 | 14.98 | 14.93 | 14.48 | 10.05 | 9.95 | 9.74 | 10.09 | 13.98 |
| Li/P | — | — | — | — | — | — | — | — | — | — |
| P/Li | 0.00 | 0.00 | 0.00 | 0.00 | 0.00 | 0.00 | 0.00 | 0.00 | 0.00 | 0.00 |
| $(Na - Li)/$ $(Al + B + P)$ | -0.52 | -1.00 | -1.42 | 1.25 | -0.09 | 0.80 | 0.78 | 0.77 | 0.79 | 1.26 |
| $(B + Na - P)/$ $(Al + Li)$ | 0.65 | 0.33 | 0.26 | 3.20 | 0.86 | 2.39 | 2.37 | 2.32 | 2.43 | 3.14 |
| $Si + 1.2P - 3Al -$ $2Li - 1.5Na -$ $K - B$ | 27.75 | 30.37 | 26.16 | 31.54 | 39.39 | 39.18 | 39.18 | 39.81 | 38.73 | 30.94 |
| $\rho$ (g/cm$^3$) | 2.368 | 2.349 | 2.334 | 2.431 | N.A. | 2.374 | 2.418 | 2.509 | 2.592 | 2.429 |
| $\alpha_{30\text{-}380^\circ\ C.}$ $(\times10^{-7}/^\circ\ C.)$ | 66.2 | 66.0 | 58.4 | 76.1 | N.A. | 61.6 | 65.2 | 66.7 | 67.4 | 78.3 |
| Ts (° C.) | 670 | 693 | N.A. | 722 | N.A. | 782 | 760 | 757 | 744 | 730 |
| $10^{2.5}$ dPa · s (° C.) | 1,372 | 1,416 | 1,384 | 1,408 | 1,522 | 1,498 | 1,576 | 1,480 | 1,453 | 1,414 |
| TL (° C.) | 954 | 908.6 or less | 1,017.8 or less | 734.7 or less | N.A. | 926.94 | 991.63 | 988.66 | 935.1 | 921 or less |

TABLE 30-continued

| (mol %) | No. 291 | No. 292 | No. 293 | No. 294 | No. 295 | No. 296 | No. 297 | No. 298 | No. 299 | No. 300 |
|---|---|---|---|---|---|---|---|---|---|---|
| logη at TL (dPa · s) | 4.4 | 5.00 or more | 4.10 or more | 7.36 or more | N.A. | 5.6 | 5.2 | 4.8 | 5.1 | 5.1 |
| Acid resistance (HCl 5 wt % 80° C. 24 h) | N.A. | N.A. | N.A. | N.A. | N.A. | N.A. | N.A. | N.A. | N.A. | N.A. |
| Alkali resistance (NaOH 5 wt % 80° C. 6 h) | N.A. | N.A. | N.A. | N.A. | N.A. | N.A. | N.A. | N.A. | N.A. | N.A. |
| E (GPa) | 80 | 75 | 79 | 75 | N.A. | 73 | 76 | 77 | 76 | 74 |
| $K_{1C}$ (MPa · m$^{0.5}$) | N.A. | N.A. | N.A. | N.A. | N.A. | N.A. | N.A. | N.A. | N.A. | N.A. |
| $CS_K$ (MPa) | N.A. | N.A. | N.A. | N.A. | N.A. | N.A. | N.A. | N.A. | N.A. | N.A. |
| DOL_ZERO$_K$ (μm) | N.A. | N.A. | N.A. | N.A. | N.A. | N.A. | N.A. | N.A. | N.A. | N.A. |
| $CS_{Na}$ (MPa) | N.A. | N.A. | N.A. | N.A. | N.A. | N.A. | N.A. | N.A. | N.A. | N.A. |
| DOL_ZERO$_{Na}$ (μm) | N.A. | N.A. | N.A. | N.A. | N.A. | N.A. | N.A. | N.A. | N.A. | N.A. |

TABLE 31

| (mol %) | No. 301 | No. 302 | No. 303 | No. 304 | No. 305 | No. 306 | No. 307 | No. 308 | No. 309 | No. 310 |
|---|---|---|---|---|---|---|---|---|---|---|
| $SiO_2$ | 71.53 | 75.17 | 74.72 | 74.75 | 74.98 | 75.33 | 75.07 | 74.83 | 74.96 | 75.01 |
| $Al_2O_3$ | 4.74 | 5.02 | 4.95 | 4.99 | 4.98 | 5.04 | 4.97 | 5.01 | 5.01 | 5.01 |
| $B_2O_3$ | 4.84 | 5.05 | 5.24 | 5.07 | 5.04 | 4.86 | 4.95 | 5.01 | 4.90 | 4.92 |
| $Li_2O$ | 0.96 | 1.00 | 1.01 | 5.00 | 4.99 | 4.98 | 4.99 | 9.00 | 8.99 | 9.00 |
| $Na_2O$ | 12.98 | 0.10 | 0.08 | 0.04 | 0.04 | 0.08 | 0.08 | 0.97 | 0.96 | 0.92 |
| $K_2O$ | 0.00 | 8.54 | 8.86 | 4.95 | 4.84 | 4.57 | 4.82 | 0.01 | 0.01 | 0.00 |
| MgO | 0.06 | 0.00 | 0.00 | 5.01 | 0.06 | 0.00 | 0.00 | 5.01 | 0.06 | 0.00 |
| CaO | 4.79 | 0.00 | 0.00 | 0.04 | 4.95 | 0.00 | 0.00 | 0.05 | 5.02 | 0.02 |
| SrO | 0.00 | 4.97 | 0.00 | 0.00 | 0.00 | 4.96 | 0.00 | 0.00 | 0.00 | 4.96 |
| BaO | 0.00 | 0.05 | 5.03 | 0.00 | 0.00 | 0.06 | 4.98 | 0.00 | 0.00 | 0.06 |
| $ZrO_2$ | 0.002 | 0.002 | 0.002 | 0.017 | 0.002 | 0.007 | 0.018 | 0.002 | 0.002 | 0.002 |
| $Y_2O_3$ | 0.00 | 0.00 | 0.00 | 0.00 | 0.00 | 0.00 | 0.00 | 0.00 | 0.00 | 0.00 |
| ZnO | 0.00 | 0.00 | 0.00 | 0.00 | 0.00 | 0.00 | 0.00 | 0.00 | 0.00 | 0.00 |
| $P_2O_5$ | 0.00 | 0.00 | 0.00 | 0.00 | 0.00 | 0.00 | 0.00 | 0.00 | 0.00 | 0.00 |
| $SnO_2$ | 0.09 | 0.09 | 0.09 | 0.09 | 0.10 | 0.09 | 0.09 | 0.10 | 0.09 | 0.10 |
| $Fe_2O_3$ | 0.002 | 0.002 | 0.002 | 0.013 | 0.002 | 0.006 | 0.014 | 0.001 | 0.001 | 0.002 |
| $TiO_2$ | 0.003 | 0.003 | 0.004 | 0.026 | 0.003 | 0.011 | 0.028 | 0.003 | 0.003 | 0.003 |
| Cl | 0.003 | 0.003 | 0.003 | 0.003 | 0.003 | 0.003 | 0.003 | 0.003 | 0.003 | 0.003 |
| Li/(Na + K) | 0.07 | 0.12 | 0.11 | 1.00 | 1.02 | 1.07 | 1.02 | 9.14 | 9.28 | 9.74 |
| (Na + K)/Li | 13.52 | 8.68 | 8.86 | 1.00 | 0.98 | 0.93 | 0.98 | 0.11 | 0.11 | 0.10 |
| Li + Na + K | 13.94 | 9.64 | 9.95 | 9.98 | 9.88 | 9.64 | 9.89 | 9.98 | 9.96 | 9.92 |
| Li/P | — | — | — | — | — | — | — | — | — | — |
| P/Li | 0.00 | 0.00 | 0.00 | 0.00 | 0.00 | 0.00 | 0.00 | 0.00 | 0.00 | 0.00 |
| (Na − Li)/ (Al + B + P) | 1.26 | −0.09 | −0.09 | −0.49 | −0.49 | −0.50 | −0.50 | −0.80 | −0.81 | −0.81 |
| (B + Na − P)/ (Al + Li) | 3.13 | 0.86 | 0.89 | 0.51 | 0.51 | 0.49 | 0.50 | 0.43 | 0.42 | 0.42 |
| Si + 1.2P − 3Al − 2Li − 1.5Na − K − B | 31.09 | 44.38 | 43.62 | 39.69 | 40.10 | 40.69 | 40.30 | 35.32 | 35.61 | 35.68 |
| ρ (g/cm$^3$) | 2.467 | 2.476 | 2.570 | 2.344 | 2.376 | 2.461 | 2.549 | 2.332 | 2.368 | 2.458 |
| $\alpha_{30-380° C.}$ (×10$^{-7}$/° C.) | 80.4 | 68.6 | 70.4 | 56.0 | 59.9 | 60.7 | 62.2 | 48.4 | 52.5 | 53.7 |
| Ts (° C.) | 718 | 822 | 810 | 776 | 759 | 755 | 743 | N.A. | N.A. | 716 |
| 10$^{2.5}$ dPa · s (° C.) | 1,350 | 1,586 | 1,557 | 1,592 | 1,535 | 1,519 | 1,499 | 1,518 | 1,449 | 1,443 |
| TL (° C.) | 846.69 | 1,017.59 | 934.5 | 1,023.26 | 1,014.27 | 941.86 | 889.37 | 1,174 | 1,170.44 | 1,180 |
| logη at TL (dPa · s) | 5.6 | 5.3 | 6.0 | 5.1 | 4.9 | 5.4 | 5.8 | 3.9 | 3.6 | 3.5 |
| Acid resistance (HCl 5 wt % 80° C. 24 h) | N.A. | N.A. | N.A. | N.A. | N.A. | N.A. | N.A. | N.A. | N.A. | N.A. |
| Alkali resistance (NaOH 5 wt % 80° C. 6 h) | N.A. | N.A. | N.A. | N.A. | N.A. | N.A. | N.A. | N.A. | N.A. | N.A. |
| E (GPa) | 77 | 71 | 71 | 73 | 74 | 74 | 75 | 79 | 80 | 80 |
| $K_{1C}$ (MPa · m$^{0.5}$) | N.A. | N.A. | N.A. | N.A. | N.A. | N.A. | N.A. | N.A. | N.A. | N.A. |
| $CS_K$ (MPa) | N.A. | N.A. | N.A. | N.A. | N.A. | N.A. | N.A. | N.A. | N.A. | N.A. |
| DOL_ZERO$_K$ (μm) | N.A. | N.A. | N.A. | N.A. | N.A. | N.A. | N.A. | N.A. | N.A. | N.A. |
| $CS_{Na}$ (MPa) | N.A. | N.A. | N.A. | N.A. | N.A. | N.A. | N.A. | N.A. | N.A. | N.A. |
| DOL_ZERO$_{Na}$ (μm) | N.A. | N.A. | N.A. | N.A. | N.A. | N.A. | N.A. | N.A. | N.A. | N.A. |

TABLE 32

| (mol %) | No. 311 | No. 312 | No. 313 | No. 314 | No. 315 | No. 316 | No. 317 | No. 318 | No. 319 | No. 320 |
|---|---|---|---|---|---|---|---|---|---|---|
| $SiO_2$ | 74.98 | 74.87 | 74.79 | 74.87 | 74.87 | 74.86 | 74.65 | 74.97 | 74.71 | 74.85 |
| $Al_2O_3$ | 4.96 | 4.99 | 5.00 | 5.00 | 4.94 | 4.99 | 4.97 | 4.97 | 4.91 | 4.99 |
| $B_2O_3$ | 4.93 | 5.03 | 5.10 | 5.03 | 5.04 | 4.92 | 5.18 | 4.86 | 5.17 | 5.00 |
| $Li_2O$ | 9.01 | 9.00 | 9.00 | 9.00 | 9.01 | 5.00 | 4.99 | 5.00 | 5.00 | 5.00 |
| $Na_2O$ | 0.99 | 0.03 | 0.04 | 0.07 | 0.05 | 0.03 | 0.03 | 0.07 | 0.05 | 0.01 |
| $K_2O$ | 0.00 | 0.94 | 0.90 | 0.88 | 0.92 | 0.00 | 0.00 | 0.00 | 0.00 | 0.00 |
| MgO | 0.00 | 4.99 | 0.06 | 0.00 | 0.00 | 7.00 | 1.03 | 1.00 | 1.01 | 5.01 |
| CaO | 0.00 | 0.04 | 5.01 | 0.00 | 0.00 | 1.05 | 7.02 | 1.02 | 1.04 | 5.03 |
| SrO | 0.00 | 0.00 | 0.00 | 4.99 | 0.01 | 1.03 | 1.03 | 6.96 | 1.00 | 0.01 |
| BaO | 5.02 | 0.00 | 0.00 | 0.06 | 5.05 | 1.02 | 1.00 | 1.05 | 7.00 | 0.00 |
| $ZrO_2$ | 0.002 | 0.005 | 0.005 | 0.000 | 0.006 | 0.007 | 0.000 | 0.001 | 0.002 | 0.001 |
| $Y_2O_3$ | 0.00 | 0.00 | 0.00 | 0.00 | 0.00 | 0.00 | 0.00 | 0.00 | 0.00 | 0.00 |
| ZnO | 0.00 | 0.00 | 0.00 | 0.00 | 0.00 | 0.00 | 0.00 | 0.00 | 0.00 | 0.00 |
| $P_2O_5$ | 0.00 | 0.00 | 0.00 | 0.00 | 0.00 | 0.00 | 0.00 | 0.00 | 0.00 | 0.00 |
| $SnO_2$ | 0.10 | 0.09 | 0.10 | 0.10 | 0.10 | 0.10 | 0.09 | 0.09 | 0.10 | 0.10 |
| $Fe_2O_3$ | 0.002 | 0.003 | 0.002 | 0.003 | 0.004 | 0.001 | 0.005 | 0.001 | 0.003 | 0.005 |
| $TiO_2$ | 0.003 | 0.001 | 0.000 | 0.002 | 0.002 | 0.004 | 0.004 | 0.004 | 0.001 | 0.000 |
| Cl | 0.003 | 0.003 | 0.003 | 0.003 | 0.003 | 0.003 | 0.003 | 0.003 | 0.002 | 0.002 |
| Li/(Na + K) | 9.08 | 9.30 | 9.58 | 9.44 | 9.28 | ∞ | ∞ | ∞ | ∞ | ∞ |
| (Na + K)/Li | 0.11 | 0.11 | 0.10 | 0.11 | 0.11 | 0.01 | 0.01 | 0.01 | 0.01 | 0.00 |
| Li + Na + K | 10.00 | 9.97 | 9.94 | 9.96 | 9.98 | 5.03 | 5.02 | 5.08 | 5.06 | 5.01 |
| Li/P | — | — | — | — | — | — | — | — | — | — |
| P/Li | 0.00 | 0.00 | 0.00 | 0.00 | 0.00 | 0.00 | 0.00 | 0.00 | 0.00 | 0.00 |
| (Na − Li)/ (Al + B + P) | −0.81 | −0.89 | −0.89 | −0.89 | −0.90 | −0.50 | −0.49 | −0.50 | −0.49 | −0.50 |
| (B + Na − P)/ (Al + Li) | 0.42 | 0.36 | 0.37 | 0.36 | 0.37 | 0.50 | 0.52 | 0.49 | 0.53 | 0.50 |
| Si + 1.2P − 3Al − 2Li − 1.5Na − K − B | 35.66 | 35.88 | 35.72 | 35.85 | 35.99 | 44.93 | 44.55 | 45.10 | 44.73 | 44.86 |
| $\rho$ (g/cm$^3$) | 2.540 | 2.331 | 2.365 | 2.456 | 2.536 | 2.395 | 2.435 | 2.541 | 2.634 | 2.359 |
| $\alpha_{30\text{-}380°\ C.}$ (×10$^{-7}$/° C.) | 55.9 | 49.0 | 52.5 | 54.1 | 55.5 | 40.0 | 44.2 | 46.1 | 47.8 | 40.7 |
| Ts (° C.) | 704 | N.A. | N.A. | 716 | 709 | 838 | 840 | 810 | 773 | N.A. |
| 10$^{2.5}$ dPa · s (° C.) | 1,419 | 1,505 | 1,445 | 1,448 | 1,417 | 1,596 | 1,528 | 1,528 | 1,517 | 1,573 |
| TL (° C.) | 1,161.88 | 1,141.3 | 1,156.04 | 1,126.6 | 1,124.32 | 1,251.8 or more | 1,252.2 or more | 1,137.7 or more | 1,135.3 or more | 1,246.24 |
| logη at TL (dPa · s) | 3.5 | 4.0 | 3.7 | 3.8 | 3.7 | 3.96 or less | 3.63 or less | 4.22 or less | 4.14 or less | 3.9 |
| Acid resistance (HCl 5 wt % 80° C. 24 h) | N.A. | N.A. | N.A. | N.A. | N.A. | N.A. | N.A. | N.A. | N.A. | N.A. |
| Alkali resistance (NaOH 5 wt % 80° C. 6 h) | N.A. | N.A. | N.A. | N.A. | N.A. | N.A. | N.A. | N.A. | N.A. | N.A. |
| E (GPa) | 80 | 78 | 80 | 80 | 79 | 78 | 79 | 79 | 78 | 78 |
| $K_{1C}$ (MPa · m$^{0.5}$) | N.A. | N.A. | N.A. | N.A. | N.A. | N.A. | N.A. | N.A. | N.A. | N.A. |
| $CS_K$ (MPa) | N.A. | N.A. | N.A. | N.A. | N.A. | N.A. | N.A. | N.A. | N.A. | N.A. |
| DOL_ZERO$_K$ (μm) | N.A. | N.A. | N.A. | N.A. | N.A. | N.A. | N.A. | N.A. | N.A. | N.A. |
| $CS_{Na}$ (MPa) | N.A. | N.A. | N.A. | N.A. | N.A. | N.A. | N.A. | N.A. | N.A. | N.A. |
| DOL_ZERO$_{Na}$ (μm) | N.A. | N.A. | N.A. | N.A. | N.A. | N.A. | N.A. | N.A. | N.A. | N.A. |

TABLE 33

| (mol %) | No. 321 | No. 322 | No. 323 | No. 324 | No. 325 | No. 326 | No. 327 | No. 328 | No. 329 | No. 330 |
|---|---|---|---|---|---|---|---|---|---|---|
| $SiO_2$ | 74.84 | 74.91 | 74.71 | 74.67 | 74.77 | 64.82 | 65.03 | 64.62 | 64.70 | 64.77 |
| $Al_2O_3$ | 4.98 | 4.94 | 4.95 | 4.92 | 4.91 | 5.01 | 4.96 | 4.88 | 4.95 | 5.03 |
| $B_2O_3$ | 4.93 | 4.94 | 5.09 | 5.10 | 5.18 | 15.34 | 14.93 | 15.58 | 15.33 | 15.43 |
| $Li_2O$ | 5.00 | 5.00 | 4.99 | 4.99 | 4.99 | 4.99 | 10.01 | 9.99 | 4.99 | 5.00 |
| $Na_2O$ | 0.05 | 0.04 | 0.06 | 0.04 | 0.08 | 5.00 | 4.96 | 0.09 | 9.92 | 0.07 |
| $K_2O$ | 0.00 | 0.00 | 0.00 | 0.00 | 0.00 | 4.74 | 0.01 | 4.73 | 0.00 | 9.60 |
| MgO | 4.97 | 4.96 | 0.06 | 0.07 | 0.00 | 0.00 | 0.00 | 0.00 | 0.00 | 0.00 |
| CaO | 0.06 | 0.05 | 5.01 | 5.08 | 0.02 | 0.00 | 0.00 | 0.00 | 0.00 | 0.00 |
| SrO | 5.02 | 0.01 | 4.97 | 0.02 | 4.92 | 0.00 | 0.00 | 0.00 | 0.00 | 0.00 |
| BaO | 0.05 | 5.04 | 0.05 | 5.01 | 5.02 | 0.00 | 0.00 | 0.00 | 0.00 | 0.00 |
| $ZrO_2$ | 0.001 | 0.000 | 0.000 | 0.001 | 0.002 | 0.003 | 0.001 | 0.005 | 0.004 | 0.003 |
| $Y_2O_3$ | 0.00 | 0.00 | 0.00 | 0.00 | 0.00 | 0.00 | 0.00 | 0.00 | 0.00 | 0.00 |
| ZnO | 0.00 | 0.00 | 0.00 | 0.00 | 0.00 | 0.00 | 0.00 | 0.00 | 0.00 | 0.00 |
| $P_2O_5$ | 0.00 | 0.00 | 0.00 | 0.00 | 0.00 | 0.00 | 0.00 | 0.00 | 0.00 | 0.00 |
| $SnO_2$ | 0.10 | 0.10 | 0.10 | 0.10 | 0.10 | 0.10 | 0.10 | 0.10 | 0.10 | 0.10 |
| $Fe_2O_3$ | 0.000 | 0.000 | 0.001 | 0.001 | 0.003 | 0.002 | 0.002 | 0.000 | 0.000 | 0.000 |

TABLE 33-continued

| (mol %) | No. 321 | No. 322 | No. 323 | No. 324 | No. 325 | No. 326 | No. 327 | No. 328 | No. 329 | No. 330 |
|---|---|---|---|---|---|---|---|---|---|---|
| TiO$_2$ | 0.002 | 0.002 | 0.000 | 0.000 | 0.000 | 0.001 | 0.000 | 0.002 | 0.002 | 0.000 |
| Cl | 0.002 | 0.002 | 0.002 | 0.002 | 0.002 | 0.002 | 0.002 | 0.001 | 0.001 | 0.001 |
| Li/(Na + K) | ∞ | ∞ | ∞ | ∞ | ∞ | 0.51 | 2.01 | 2.07 | 0.50 | 0.52 |
| (Na + K)/Li | 0.01 | 0.01 | 0.01 | 0.01 | 0.02 | 1.95 | 0.50 | 0.48 | 0.99 | 1.93 |
| Li + Na + K | 5.05 | 5.04 | 5.06 | 5.03 | 5.07 | 14.73 | 14.98 | 14.81 | 14.91 | 14.67 |
| Li/P | — | — | — | — | — | — | — | — | — | — |
| P/Li | 0.00 | 0.00 | 0.00 | 0.00 | 0.00 | 0.00 | 0.00 | 0.00 | 0.00 | 0.00 |
| (Na − Li)/(Al + B + P) | −0.50 | −0.50 | −0.49 | −0.49 | −0.49 | 0.00 | −0.25 | −0.48 | 0.24 | −0.24 |
| (B + Na − P)/(Al + Li) | 0.50 | 0.50 | 0.52 | 0.52 | 0.53 | 2.04 | 1.33 | 1.05 | 2.54 | 1.55 |
| Si + 1.2P − 3Al − 2Li − 1.5Na − K − B | 44.90 | 45.07 | 44.68 | 44.76 | 44.75 | 12.24 | 7.76 | 9.54 | 9.66 | 14.53 |
| ρ (g/cm$^3$) | 2.445 | 2.521 | 2.479 | 2.557 | 2.645 | 2.389 | 2.366 | 2.384 | 2.403 | 2.379 |
| α$_{30\text{-}380° C.}$ (×10$^{-7}$/° C.) | 42.2 | 43.3 | 45.5 | 46.7 | 48.6 | 75.0 | 66.6 | 77.5 | 73.5 | 74.1 |
| Ts (° C.) | 820 | 805 | N.A. | 791 | 777 | 651 | 633 | 612 | 648 | 669 |
| 10$^{2.5}$ dPa · s (° C.) | 1,572 | 1,563 | 1,534 | 1,516 | 1,504 | 1,181 | 1,141 | 1,041 | 1,145 | 1,228 |
| TL (° C.) | 1,240.65 | 1,206.92 | 1,261.08 | 1,251.8 or more | 1,252.2 or more | 773.95 | 847.16 | 764.56 | 811.55 | 803.12 |
| logη at TL (dPa · s) | 3.9 | 4.0 | 3.5 | 3.51 or less | 3.43 or less | 5.4 | 4.2 | 4.6 | 4.8 | 5.3 |
| Acid resistance (HCl 5 wt % 80° C. 24 h) | N.A. | N.A. | N.A. | N.A. | N.A. | N.A. | N.A. | N.A. | N.A. | N.A. |
| Alkali resistance (NaOH 5 wt % 80° C. 6 h) | N.A. | N.A. | N.A. | N.A. | N.A. | N.A. | N.A. | N.A. | N.A. | N.A. |
| E (GPa) | 78 | 77 | 80 | 79 | 79 | 76 | 80 | 80 | 79 | 71 |
| K$_{1C}$ (MPa · m$^{0.5}$) | N.A. | N.A. | N.A. | N.A. | N.A. | N.A. | N.A. | N.A. | N.A. | N.A. |
| CS$_K$ (MPa) | N.A. | N.A. | N.A. | N.A. | N.A. | N.A. | N.A. | N.A. | N.A. | N.A. |
| DOL_ZERO$_K$ (µm) | N.A. | N.A. | N.A. | N.A. | N.A. | N.A. | N.A. | N.A. | N.A. | N.A. |
| CS$_{Na}$ (MPa) | N.A. | N.A. | N.A. | N.A. | N.A. | N.A. | N.A. | N.A. | N.A. | N.A. |
| DOL_ZERO$_{Na}$ (µm) | N.A. | N.A. | N.A. | N.A. | N.A. | N.A. | N.A. | N.A. | N.A. | N.A. |

TABLE 34

| (mol %) | No. 331 | No. 332 | No. 333 | No. 334 | No. 335 | No. 336 | No. 337 | No. 338 | No. 339 | No. 340 |
|---|---|---|---|---|---|---|---|---|---|---|
| SiO$_2$ | 65.32 | 65.08 | 64.61 | 64.62 | 65.15 | 64.85 | 65.03 | 64.69 | 65.16 | 64.85 |
| Al$_2$O$_3$ | 4.98 | 4.95 | 4.93 | 4.94 | 4.96 | 4.98 | 4.99 | 4.97 | 4.96 | 4.96 |
| B$_2$O$_3$ | 14.61 | 14.83 | 15.28 | 15.31 | 14.69 | 15.05 | 14.94 | 15.46 | 14.90 | 15.05 |
| Li$_2$O | 13.99 | 1.01 | 1.00 | 0.99 | 1.00 | 1.01 | 1.00 | 1.01 | 1.00 | 5.00 |
| Na$_2$O | 1.01 | 9.06 | 9.02 | 8.97 | 9.03 | 0.04 | 0.05 | 0.10 | 0.10 | 5.01 |
| K$_2$O | 0.00 | 0.00 | 0.00 | 0.01 | 0.03 | 8.97 | 8.93 | 8.66 | 8.75 | 0.00 |
| MgO | 0.00 | 4.92 | 0.06 | 0.00 | 0.00 | 4.99 | 0.07 | 0.00 | 0.02 | 4.96 |
| CaO | 0.00 | 0.04 | 4.99 | 0.02 | 0.00 | 0.00 | 4.90 | 0.00 | 0.00 | 0.05 |
| SrO | 0.00 | 0.00 | 0.00 | 4.97 | 0.00 | 0.00 | 0.00 | 4.95 | 0.00 | 0.00 |
| BaO | 0.00 | 0.00 | 0.00 | 0.06 | 5.03 | 0.00 | 0.00 | 0.06 | 5.01 | 0.00 |
| ZrO$_2$ | 0.002 | 0.000 | 0.001 | 0.002 | 0.003 | 0.003 | 0.003 | 0.000 | 0.001 | 0.002 |
| Y$_2$O$_3$ | 0.00 | 0.00 | 0.00 | 0.00 | 0.00 | 0.00 | 0.00 | 0.00 | 0.00 | 0.00 |
| ZnO | 0.00 | 0.00 | 0.00 | 0.00 | 0.00 | 0.00 | 0.00 | 0.00 | 0.00 | 0.00 |
| P$_2$O$_5$ | 0.00 | 0.00 | 0.00 | 0.00 | 0.00 | 0.00 | 0.00 | 0.00 | 0.00 | 0.00 |
| SnO$_2$ | 0.10 | 0.10 | 0.10 | 0.10 | 0.10 | 0.10 | 0.10 | 0.10 | 0.10 | 0.10 |
| Fe$_2$O$_3$ | 0.000 | 0.001 | 0.001 | 0.003 | 0.002 | 0.002 | 0.000 | 0.000 | 0.002 | 0.001 |
| TiO$_2$ | 0.001 | 0.005 | 0.002 | 0.005 | 0.001 | 0.006 | 0.002 | 0.005 | 0.001 | 0.000 |
| Cl | 0.001 | 0.001 | 0.001 | 0.001 | 0.001 | 0.001 | 0.001 | 0.001 | 0.001 | 0.001 |
| Li/(Na + K) | 13.89 | 0.11 | 0.11 | 0.11 | 0.11 | 0.11 | 0.11 | 0.12 | 0.11 | 1.00 |
| (Na + K)/Li | 0.07 | 9.01 | 9.06 | 9.06 | 9.02 | 8.94 | 9.01 | 8.68 | 8.86 | 1.00 |
| Li + Na + K | 15.00 | 10.06 | 10.02 | 9.97 | 10.07 | 10.02 | 9.98 | 9.77 | 9.85 | 10.02 |
| Li/P | — | — | — | — | — | — | — | — | — | — |
| P/Li | 0.00 | 0.00 | 0.00 | 0.00 | 0.00 | 0.00 | 0.00 | 0.00 | 0.00 | 0.00 |
| (Na − Li)/(Al + B + P) | −0.66 | 0.41 | 0.40 | 0.39 | 0.41 | −0.05 | −0.05 | −0.04 | −0.05 | 0.00 |
| (B + Na − P)/(Al + Li) | 0.82 | 4.01 | 4.10 | 4.09 | 3.98 | 2.52 | 2.50 | 2.60 | 2.52 | 2.01 |
| Si + 1.2P − 3Al − 2Li − 1.5Na − K − B | 6.29 | 19.80 | 19.00 | 19.02 | 20.00 | 23.80 | 24.12 | 23.49 | 24.47 | 17.39 |

TABLE 34-continued

| (mol %) | No. 331 | No. 332 | No. 333 | No. 334 | No. 335 | No. 336 | No. 337 | No. 338 | No. 339 | No. 340 |
|---|---|---|---|---|---|---|---|---|---|---|
| $\rho$ (g/cm$^3$) | 2.332 | 2.352 | 2.406 | 2.504 | 2.588 | 2.334 | 2.381 | 2.474 | 2.553 | 2.336 |
| $\alpha_{30\text{-}380°\ C.}$ ($\times 10^{-7}/°$ C.) | 59.5 | 62.3 | 64.7 | 66.1 | 67.4 | 65.4 | 68.0 | 69.2 | 69.3 | 56.3 |
| Ts (° C.) | 639 | 697 | 706 | 707 | 704 | 724 | 746 | 739 | 736 | 672 |
| $10^{2.5}$ dPa · s (° C.) | 1,147 | 1,310 | 1,246 | 1,223 | 1,215 | 1,407 | 1,334 | 1,310 | 1,285 | 1,289 |
| TL (° C.) | 937.6 or more | 938.7 or more | 866.78 | 857.5 | 837.35 | 955.02 | 925.8 | 838.48 | 841.75 | 931.5 |
| log$\eta$ at TL (dPa · s) | 3.53 or less | 4.39 or less | 5.2 | 5.0 | 5.3 | 4.9 | 5.0 | 5.9 | 5.8 | 4.3 |
| Acid resistance (HCl 5 wt % 80° C. 24 h) | N.A. | N.A. | N.A. | N.A. | N.A. | N.A. | N.A. | N.A. | N.A. | N.A. |
| Alkali resistance (NaOH 5 wt % 80° C. 6 h) | N.A. | N.A. | N.A. | N.A. | N.A. | N.A. | N.A. | N.A. | N.A. | N.A. |
| E (GPa) | 80 | 70 | 75 | 77 | 77 | 63 | 67 | 69 | 70 | 74 |
| K$_{1C}$ (MPa · m$^{0.5}$) | N.A. | N.A. | N.A. | N.A. | N.A. | N.A. | N.A. | N.A. | N.A. | N.A. |
| CS$_K$ (MPa) | N.A. | N.A. | N.A. | N.A. | N.A. | N.A. | N.A. | N.A. | N.A. | N.A. |
| DOL_ZERO$_K$ (µm) | N.A. | N.A. | N.A. | N.A. | N.A. | N.A. | N.A. | N.A. | N.A. | N.A. |
| CS$_{Na}$ (MPa) | N.A. | N.A. | N.A. | N.A. | N.A. | N.A. | N.A. | N.A. | N.A. | N.A. |
| DOL_ZERO$_{Na}$ (µm) | N.A. | N.A. | N.A. | N.A. | N.A. | N.A. | N.A. | N.A. | N.A. | N.A. |

TABLE 35

| (mol %) | No. 341 | No. 342 | No. 343 | No. 344 | No. 345 | No. 346 | No. 347 | No. 348 | No. 349 | No. 350 |
|---|---|---|---|---|---|---|---|---|---|---|
| SiO$_2$ | 64.95 | 64.86 | 65.04 | 64.98 | 64.94 | 65.09 | 65.60 | 65.02 | 64.78 | 65.01 |
| Al$_2$O$_3$ | 4.95 | 4.96 | 4.95 | 4.98 | 4.96 | 5.00 | 4.99 | 4.98 | 4.96 | 5.02 |
| B$_2$O$_3$ | 14.88 | 14.92 | 14.80 | 14.99 | 15.09 | 14.90 | 14.55 | 14.90 | 15.10 | 14.87 |
| Li$_2$O | 5.00 | 5.01 | 4.99 | 4.99 | 5.01 | 5.00 | 4.99 | 9.00 | 9.00 | 8.99 |
| Na$_2$O | 5.01 | 4.97 | 5.07 | 0.03 | 0.04 | 0.09 | 0.07 | 0.02 | 0.03 | 0.07 |
| K$_2$O | 0.01 | 0.01 | 0.01 | 4.94 | 4.88 | 4.71 | 4.58 | 0.96 | 0.96 | 0.86 |
| MgO | 0.06 | 0.00 | 0.00 | 4.96 | 0.06 | 0.00 | 0.02 | 4.97 | 0.06 | 0.00 |
| CaO | 5.02 | 0.02 | 0.00 | 0.03 | 4.93 | 0.00 | 0.00 | 0.04 | 5.00 | 0.01 |
| SrO | 0.00 | 5.09 | 0.00 | 0.00 | 0.00 | 5.06 | 0.00 | 0.00 | 0.00 | 5.00 |
| BaO | 0.00 | 0.05 | 5.02 | 0.00 | 0.00 | 0.06 | 5.09 | 0.00 | 0.00 | 0.06 |
| ZrO$_2$ | 0.003 | 0.002 | 0.002 | 0.001 | 0.000 | 0.002 | 0.000 | 0.000 | 0.002 | 0.002 |
| Y$_2$O$_3$ | 0.00 | 0.00 | 0.00 | 0.00 | 0.00 | 0.00 | 0.00 | 0.00 | 0.00 | 0.00 |
| ZnO | 0.00 | 0.00 | 0.00 | 0.00 | 0.00 | 0.00 | 0.00 | 0.00 | 0.00 | 0.00 |
| P$_2$O$_5$ | 0.00 | 0.00 | 0.00 | 0.00 | 0.00 | 0.00 | 0.00 | 0.00 | 0.00 | 0.00 |
| SnO$_2$ | 0.10 | 0.10 | 0.10 | 0.10 | 0.10 | 0.10 | 0.10 | 0.10 | 0.10 | 0.10 |
| Fe$_2$O$_3$ | 0.000 | 0.000 | 0.002 | 0.002 | 0.002 | 0.002 | 0.004 | 0.008 | 0.003 | 0.002 |
| TiO$_2$ | 0.002 | 0.002 | 0.003 | 0.001 | 0.001 | 0.001 | 0.006 | 0.002 | 0.005 | 0.001 |
| Cl | 0.001 | 0.003 | 0.005 | 0.005 | 0.005 | 0.005 | 0.005 | 0.005 | 0.005 | 0.005 |
| Li/(Na + K) | 1.00 | 1.01 | 0.98 | 1.00 | 1.02 | 1.04 | 1.08 | 9.19 | 9.09 | 9.69 |
| (Na + K)/Li | 1.00 | 0.99 | 1.02 | 1.00 | 0.98 | 0.96 | 0.93 | 0.11 | 0.11 | 0.10 |
| Li + Na + K | 10.02 | 9.98 | 10.08 | 9.96 | 9.93 | 9.80 | 9.64 | 9.98 | 9.99 | 9.92 |
| Li/P | — | — | — | — | — | — | — | — | — | — |
| P/Li | 0.00 | 0.00 | 0.00 | 0.00 | 0.00 | 0.00 | 0.00 | 0.00 | 0.00 | 0.00 |
| (Na − Li)/(Al + B + P) | 0.00 | 0.00 | 0.00 | −0.25 | −0.25 | −0.25 | −0.25 | −0.45 | −0.45 | −0.45 |
| (B + Na − P)/(Al + Li) | 2.00 | 1.99 | 2.00 | 1.51 | 1.52 | 1.50 | 1.46 | 1.07 | 1.08 | 1.07 |
| Si + 1.2P − 3Al − 2Li − 1.5Na − K − B | 17.68 | 17.58 | 17.77 | 20.10 | 20.01 | 20.37 | 21.41 | 16.20 | 15.81 | 16.15 |
| $\rho$ (g/cm$^3$) | 2.377 | 2.475 | 2.559 | 2.322 | 2.360 | 2.448 | 2.532 | 2.311 | 2.351 | 2.442 |
| $\alpha_{30\text{-}380°\ C.}$ ($\times 10^{-7}/°$ C.) | 59.2 | 60.7 | 62.2 | 57.4 | 60.0 | 62.1 | 62.1 | 50.2 | 52.9 | 54.0 |
| Ts (° C.) | 683 | 679 | 677 | 689 | N.A. | 709 | 689 | 679 | 690 | 590 |
| $10^{2.5}$ dPa · s (° C.) | 1,221 | 1,219 | 1,206 | 1,357 | 1,278 | 1,254 | 1,241 | 1,265 | 1,221 | 1,216 |
| TL (° C.) | 912.44 | 908.9 | 903.35 | 962.62 | 840.39 | 787.42 | 799.61 | 913 | 945.82 | 955.02 |
| log$\eta$ at TL (dPa · s) | 4.2 | 4.3 | 4.3 | 4.3 | 5.5 | 6.1 | 5.7 | 4.4 | 3.9 | 3.9 |
| Acid resistance (HCl 5 wt % 80° C. 24 h) | N.A. | N.A. | N.A. | N.A. | N.A. | N.A. | N.A. | N.A. | N.A. | N.A. |
| Alkali resistance (NaOH 5 wt % 80° C. 6 h) | N.A. | N.A. | N.A. | N.A. | N.A. | N.A. | N.A. | N.A. | N.A. | N.A. |

TABLE 35-continued

| (mol %) | No. 341 | No. 342 | No. 343 | No. 344 | No. 345 | No. 346 | No. 347 | No. 348 | No. 349 | No. 350 |
|---|---|---|---|---|---|---|---|---|---|---|
| E (GPa) | 77 | 79 | 79 | 69 | 72 | 74 | 75 | 76 | 79 | 80 |
| $K_{IC}$ (MPa · m$^{0.5}$) | N.A. | N.A. | N.A. | N.A. | N.A. | N.A. | N.A. | N.A. | N.A. | N.A. |
| $CS_K$ (MPa) | N.A. | N.A. | N.A. | N.A. | N.A. | N.A. | N.A. | N.A. | N.A. | N.A. |
| DOL_ZERO$_K$ (μm) | N.A. | N.A. | N.A. | N.A. | N.A. | N.A. | N.A. | N.A. | N.A. | N.A. |
| $CS_{Na}$ (MPa) | N.A. | N.A. | N.A. | N.A. | N.A. | N.A. | N.A. | N.A. | N.A. | N.A. |
| DOL_ZERO$_{Na}$ (μm) | N.A. | N.A. | N.A. | N.A. | N.A. | N.A. | N.A. | N.A. | N.A. | N.A. |

TABLE 36

| (mol %) | No. 351 | No. 352 | No. 353 | No. 354 | No. 355 | No. 35 6 | No. 357 | No. 358 | No. 359 | No. 360 | No. 361 |
|---|---|---|---|---|---|---|---|---|---|---|---|
| $SiO_2$ | 65.27 | 64.78 | 64.37 | 64.67 | 64.54 | 65.00 | 65.50 | 65.32 | 64.83 | 64.93 | 64.39 |
| $Al_2O_3$ | 4.99 | 5.00 | 4.97 | 4.96 | 4.95 | 5.00 | 4.99 | 4.97 | 4.97 | 4.94 | 4.92 |
| $B_2O_3$ | 14.68 | 15.10 | 15.50 | 15.16 | 15.34 | 14.81 | 14.20 | 14.57 | 14.84 | 14.82 | 15.65 |
| $Li_2O$ | 9.00 | 4.99 | 5.00 | 5.01 | 5.00 | 5.00 | 5.01 | 5.00 | 5.00 | 4.99 | 4.99 |
| $Na_2O$ | 0.05 | 0.02 | 0.03 | 0.07 | 0.06 | 0.02 | 0.05 | 0.03 | 0.06 | 0.04 | 0.08 |
| $K_2O$ | 0.85 | 0.00 | 0.00 | 0.00 | 0.00 | 0.00 | 0.00 | 0.00 | 0.00 | 0.00 | 0.00 |
| MgO | 0.02 | 6.93 | 1.02 | 1.00 | 1.01 | 4.98 | 4.94 | 4.92 | 0.06 | 0.07 | 0.00 |
| CaO | 0.00 | 1.04 | 7.00 | 1.01 | 1.04 | 5.05 | 0.06 | 0.05 | 5.02 | 5.08 | 0.04 |
| SrO | 0.01 | 1.03 | 1.01 | 6.94 | 1.00 | 0.01 | 5.10 | 0.01 | 5.04 | 0.01 | 4.87 |
| BaO | 5.03 | 1.01 | 1.00 | 1.05 | 6.96 | 0.00 | 0.05 | 5.03 | 0.05 | 4.99 | 4.95 |
| $ZrO_2$ | 0.002 | 0.003 | 0.002 | 0.003 | 0.002 | 0.004 | 0.004 | 0.000 | 0.002 | 0.003 | 0.000 |
| $Y_2O_3$ | 0.00 | 0.00 | 0.00 | 0.00 | 0.00 | 0.00 | 0.00 | 0.00 | 0.00 | 0.00 | 0.00 |
| ZnO | 0.00 | 0.00 | 0.00 | 0.00 | 0.00 | 0.00 | 0.00 | 0.00 | 0.00 | 0.00 | 0.00 |
| $P_2O_5$ | 0.00 | 0.00 | 0.00 | 0.00 | 0.00 | 0.00 | 0.00 | 0.00 | 0.00 | 0.00 | 0.00 |
| $SnO_2$ | 0.10 | 0.10 | 0.10 | 0.10 | 0.10 | 0.10 | 0.10 | 0.10 | 0.10 | 0.10 | 0.10 |
| $Fe_2O_3$ | 0.002 | 0.004 | 0.002 | 0.002 | 0.001 | 0.003 | 0.003 | 0.000 | 0.002 | 0.005 | 0.003 |
| $TiO_2$ | 0.003 | 0.000 | 0.000 | 0.004 | 0.003 | 0.005 | 0.001 | 0.004 | 0.009 | 0.007 | 0.009 |
| Cl | 0.005 | 0.005 | 0.007 | 0.007 | 0.007 | 0.007 | 0.007 | 0.007 | 0.007 | 0.007 | 0.007 |
| Li/(Na + K) | 10.00 | — | — | — | — | — | — | — | — | — | — |
| (Na + K)/Li | 0.10 | 0.00 | 0.01 | 0.01 | 0.01 | 0.00 | 0.01 | 0.01 | 0.01 | 0.01 | 0.02 |
| Li + Na + K | 9.90 | 5.01 | 5.04 | 5.09 | 5.06 | 5.02 | 5.06 | 5.04 | 5.07 | 5.03 | 5.06 |
| Li/P | — | — | — | — | — | — | — | — | — | — | — |
| P/Li | 0.00 | 0.00 | 0.00 | 0.00 | 0.00 | 0.00 | 0.00 | 0.00 | 0.00 | 0.00 | 0.00 |
| (Na − Li)/ (Al + B + P) | −0.45 | −0.25 | −0.24 | −0.25 | −0.24 | −0.25 | −0.26 | −0.25 | −0.25 | −0.25 | −0.24 |
| (B + Na − P)/ (Al + Li) | 1.05 | 1.51 | 1.56 | 1.53 | 1.55 | 1.48 | 1.43 | 1.46 | 1.49 | 1.50 | 1.59 |
| Si + 1.2P − 3Al − 2Li − 1.5Na − K − B | 16.69 | 24.68 | 23.91 | 24.48 | 24.28 | 25.14 | 26.25 | 25.80 | 24.97 | 25.23 | 23.88 |
| ρ (g/cm$^3$) | 2.523 | 2.367 | N.A. | N.A. | 2.610 | N.A. | 2.420 | 2.493 | N.A. | 2.539 | 2.628 |
| $\alpha_{30\text{-}380°\,C.}$ (×10$^{-7}$/° C.) | 55.5 | 42.1 | (45) | (47) | 48.7 | (41) | 43.8 | 45.0 | (45) | 48.0 | 50.0 |
| Ts (° C.) | 674 | 827 | N.A. | N.A. | N.A. | N.A. | N.A. | N.A. | N.A. | N.A. | N.A. |
| 10$^{2.5}$ dPa · s (° C.) | 1,209 | 1,371 | N.A. | N.A. | 1,285 | N.A. | 1,344 | 1,340 | N.A. | 1,294 | 1,276 |
| TL (° C.) | 948.55 | 1,011.8 | N.A. | N.A. | 1,019.38 | N.A. | 1,015.22 | 996.06 | N.A. | 1,026.37 | 1,031.86 |
| logη at TL (dPa · s) | 3.9 | 4.6 | N.A. | N.A. | 3.9 | N.A. | 4.2 | 4.3 | N.A. | 3.9 | 3.7 |
| Acid resistance (HCl 5 wt % 80° C. 24 h) | N.A. | N.A. | N.A. | N.A. | N.A. | N.A. | N.A. | N.A. | N.A. | N.A. | N.A. |
| Alkali resistance (NaOH 5 wt % 80° C. 6 h) | N.A. | N.A. | N.A. | N.A. | N.A. | N.A. | N.A. | N.A. | N.A. | N.A. | N.A. |
| E (GPa) | 79 | 74 | N.A. | N.A. | 77 | N.A. | 75 | 74 | N.A. | 78 | 79 |
| $K_{IC}$ (MPa · m$^{0.5}$) | N.A. | N.A. | N.A. | N.A. | N.A. | N.A. | N.A. | N.A. | N.A. | N.A. | N.A. |
| $CS_K$ (MPa) | N.A. | N.A. | N.A. | N.A. | N.A. | N.A. | N.A. | N.A. | N.A. | N.A. | N.A. |
| DOL_ZERO$_K$ (μm) | N.A. | N.A. | N.A. | N.A. | N.A. | N.A. | N.A. | N.A. | N.A. | N.A. | N.A. |
| $CS_{Na}$ (MPa) | N.A. | N.A. | N.A. | N.A. | N.A. | N.A. | N.A. | N.A. | N.A. | N.A. | N.A. |
| DOL_ZERO$_{Na}$ (μm) | N.A. | N.A. | N.A. | N.A. | N.A. | N.A. | N.A. | N.A. | N.A. | N.A. | N.A. |

Samples in the tables were each produced as described below. First, glass raw materials were blended so as to give a glass composition shown in the table, and were melted at 1,600° C. for 21 hours with a platinum pot. Subsequently, the resultant molten glass was poured out on a carbon sheet and formed into a flat sheet shape, followed by being cooled in a temperature region of from an annealing point to a strain point at a rate of 3° C./min. Thus, a glass substrate (glass substrate to be tempered) was obtained. The surface of the resultant glass substrate was optically polished so as to give a sheet thickness of 1.5 mm, and then the glass substrate was evaluated for various characteristics.

The density (p) is a value measured by a well-known Archimedes method.

The thermal expansion coefficient ($\alpha_{30\text{-}380°\ C.}$) at 30° C. to 380° C. is a value measured for an average thermal expansion coefficient with a dilatometer.

The temperature ($10^{2.5}$ dPa·s) at a viscosity at high temperature of $10^{2.5}$ dPa·s is a value measured by a platinum sphere pull up method.

The softening point (Ts) is a value measured based on a method of ASTM C338.

The liquidus temperature (TL) was determined as a temperature obtained as described below. Glass powder which had passed through a standard 30-mesh sieve (500 µm) and remained on a 50-mesh sieve (300 µm) was loaded into a platinum boat, and the platinum boat was kept for 24 hours in a temperature gradient furnace and was then taken out of the furnace. At this time, a highest temperature at which devitrification (devitrified stones) was observed with a microscope in glass was measured. The liquidus viscosity (log η at TL) is a value measured for a viscosity at the liquidus temperature by a platinum sphere pull up method, and is logarithmically represented as log η.

The Young's modulus (E) is a value calculated by a method in conformity with JIS R1602-1995 "Testing methods for elastic modulus of fine ceramics."

The fracture toughness $K_{1C}$ is a value calculated by a method in conformity with JIS R1607-2015 "Testing methods for fracture toughness of fine ceramics at room temperature."

The acid resistance test is evaluated as described below. A glass sample having been subjected to mirror polishing treatment on both sides so as to give dimensions of 50 mm×10 mm×1.0 mm was used as a measurement sample. The sample was sufficiently washed with a neutral detergent and pure water, and was then immersed in a 5 mass % HCl aqueous solution warmed to 80° C. for 24 hours. In this case, a mass loss (mg/cm²) per unit surface area before and after the immersion was calculated.

The alkali resistance test is evaluated as described below. A glass sample having been subjected to mirror polishing treatment on both sides so as to give dimensions of 50 mm×10 mm×1.0 mm was used as a measurement sample. The sample was sufficiently washed with a neutral detergent and pure water, and was then immersed in a 5 mass % NaOH aqueous solution warmed to 80° C. for 6 hours. In this case, a mass loss (mg/cm²) per unit surface area before and after the immersion was calculated.

As apparent from the tables, it is conceived that each of Sample Nos. 1 to 361 has an average linear thermal expansion coefficient within the temperature range of from 30° C. to 380° C. of $39.6×10^{-7}$/° C. or more and $107.4×10^{-7}$/° C. or less, a Young's modulus of 63 GPa or more, and a fracture toughness $K_{1C}$ of 0.91 MPa·m$^{0.5}$ or more, and is hence less liable to cause a dimensional change of the substrate to be processed and less liable to be broken at the time of dropping.

Subsequently, each of the glass substrates was subjected to ion exchange treatment by being immersed in a KNO$_3$ molten salt at 430° C. for 4 hours. Thus, a tempered glass substrate having a compressive stress layer in a glass surface was obtained. After that, the glass surface was washed, and the compressive stress value (CS$_K$) and the depth of layer (DOL_ZERO$_K$) of the compressive stress layer on the outermost surface were calculated based on the number of interference fringes observed with a surface stress meter FSM-6000 (manufactured by Orihara Industrial Co., Ltd.) and intervals therebetween. Herein, the "DOL_ZERO$_K$" is a depth at which the compressive stress value becomes zero. In calculation of the stress characteristics, the refractive index and the optical elastic constant of each sample were set to 1.51 and 30.1 [(nm/cm)/MPa], respectively.

In addition, each of the glass substrates was subjected to ion exchange treatment by being immersed in a NaNO$_3$ molten salt at 380° C. for 1 hour. Thus, a tempered glass substrate was obtained. After that, the glass surface was washed, and the compressive stress value (CS$_{Na}$) and the depth of layer (DOL_ZERO$_{Na}$) of the compressive stress layer on the outermost surface were calculated based on a retardation distribution curve observed with a scattered light photoelastic stress meter SLP-1000 (manufactured by Orihara Industrial Co., Ltd.). Herein, the "DOL_ZERO$_{Na}$" is a depth at which the stress value becomes zero. In calculation of the stress characteristics, the refractive index and the optical elastic constant of each sample were set to 1.51 and 30.1 [(nm/cm)/MPa], respectively.

As apparent from the tables, it is conceived that each of Sample Nos. 1 to 361, which has a compressive stress value (CS$_K$) of the compressive stress layer on the outermost surface of 473 MPa or more when having been subjected to the ion exchange treatment with the KNO$_3$ molten salt, and has a compressive stress value (CS$_{Na}$) of the compressive stress layer on the outermost surface of 165 MPa or more when having been subjected to the ion exchange treatment with the NaNO$_3$ molten salt, can be subjected to ion exchange treatment with any of these molten salts, and is less liable to be broken at the time of dropping.

Example 2

First, glass raw materials were blended so as to give glass compositions of Sample Nos. 2 and 34 shown in Table 1, and were melted at 1,600° C. for 21 hours with a platinum pot. Subsequently, the resultant molten glass was poured out on a carbon sheet and formed into a flat sheet shape, followed by being cooled in a temperature region of from an annealing point to a strain point at a rate of 3° C./min. Thus, a glass substrate was obtained. The surface of the resultant glass substrate was optically polished so as to give a sheet thickness of 0.7 mm for Sample No. 2, and a sheet thickness of 0.8 mm for Sample No. 34.

Next, the glass substrate was subjected to ion exchange treatment by being immersed in a NaNO$_3$ molten salt (concentration of NaNO$_3$: 100 mass %) at 380° C. for 3 hours, and was then subjected to ion exchange treatment by being immersed in a mixed molten salt of KNO$_3$ and LiNO$_3$ (concentration of LiNO$_3$: 2.5 mass %) at 380° C. for 75 minutes. Further, the surface of the resultant tempered glass substrate was washed, and then the stress profile of the tempered glass substrate was measured with a scattered light photoelastic stress meter SLP-1000 (manufactured by Orihara Industrial Co., Ltd.) and a surface stress meter FSM-6000 (manufactured by Orihara Industrial Co., Ltd.). As a result, the same non-monotonic stress profile as in FIG. 4, that is, a stress profile having a first peak, a second peak, a first bottom, and a second bottom was obtained in each case.

Example 3

First, glass raw materials were blended so as to give glass compositions of Sample Nos. 108 and 145 shown in Table 5, and were melted at 1,600° C. for 21 hours with a platinum pot. Subsequently, the resultant molten glass was poured out on a carbon sheet and formed into a flat sheet shape, followed by being cooled in a temperature region of from an annealing point to a strain point at a rate of 3° C./min. Thus, a glass substrate was obtained. The surface of the resultant glass substrate was optically polished so as to give a sheet thickness of 0.7 mm.

Next, the glass substrate was subjected to ion exchange treatment by being immersed in a $NaNO_3$ molten salt (concentration of $NaNO_3$: 100 mass %) at 380° C. for 3 hours, and was then subjected to ion exchange treatment by being immersed in a mixed molten salt of $KNO_3$ and $LiNO_3$ (concentration of $LiNO_3$: 1.5 mass %) at 380° C. for 45 minutes. Further, the surface of the resultant tempered glass substrate was washed, and then the stress profile of the tempered glass substrate was measured with a scattered light photoelastic stress meter SLP-1000 (manufactured by Orihara Industrial Co., Ltd.) and a surface stress meter FSM-6000 (manufactured by Orihara Industrial Co., Ltd.). As a result, the same non-monotonic stress profile as in FIG. 5, that is, a stress profile having a first peak, a second peak, a first bottom, and a second bottom was obtained in each case. Accordingly, it is expected that the resultant tempered glass substrate has a low breakage probability at the time of dropping.

Example 4

First, a glass batch obtained by blending glass raw materials so as to give a glass composition shown in the table was loaded into a platinum crucible, followed by being melted at 1,500° C. to 1,700° C. for 24 hours, fined, and homogenized. At the time of melting of the glass batch, the batch was homogenized by being stirred with a platinum stirrer. Next, the molten glass was poured out on a carbon sheet and formed into a sheet shape, followed by being annealed at a temperature around an annealing point for 30 minutes.

Subsequently, the glass substrates according to Sample Nos. 1 to 361 were each processed into 000 mm×0.8 mm in thickness, and both surfaces thereof were then subjected to polishing treatment with a polishing device. Specifically, both the surfaces of the glass substrate were sandwiched between a pair of polishing pads having different outer diameters, and both the surfaces of the glass substrate were subjected to polishing treatment while the glass substrate and the pair of polishing pads were rotated together. The polishing treatment was controlled so that part of the glass substrate sometimes protruded from the polishing pads. The polishing pads were each made of urethane, a polishing slurry used for the polishing treatment had an average particle diameter of 2.5 μm, and a polishing rate was 15 m/min. The resultant glass substrates having been subjected to the polishing treatment were each measured for a total thickness variation (TTV) and a warpage level with SBW-331ML/d manufactured by Kobelco Research Institute, Inc. As a result, the total thickness variation (TTV) and the warpage level of each of the glass substrates were found to be 0.38 μm and 28 μm, respectively. The glass substrates were each conceived to be suitable as the support glass substrate.

INDUSTRIAL APPLICABILITY

The support glass substrate of the present invention is suitable as a support glass substrate for manufacturing a WLP or a PLP. The support glass substrate of the present invention is expected to be applied to applications for which high mechanical strength is required, for example, a window glass, a substrate for a magnetic disk, a substrate for a flat panel display, a substrate for a flexible display, a cover glass for a solar cell, a cover glass for a solid state image sensor, and a cover glass for an automobile, in addition to the above-mentioned applications.

REFERENCE SIGNS LIST

1, 27, 30 laminated substrate
10, 26, 31 support glass substrate
11, 24, 34 substrate to be processed
12, 32 peeling layer
13, 21, 25, 33 adhesive layer
20 supporting member
22, 35 semiconductor chip
23 sealing material
28 wiring
29 solder bump
36 polishing device
37 UV light

The invention claimed is:

1. A support glass substrate for supporting a substrate to be processed, the support glass substrate comprising lithium aluminosilicate-based glass, having as a glass composition, in terms of mol %, 50% to 80% of $SiO_2$, 4% to 25% of $Al_2O_3$, 0% to 16% of $B_2O_3$, 0.9% to 15% of $Li_2O$, 8.09% to 21% of $Na_2O$, 0% to 15% of $K_2O$, 0% to 10% of $MgO$, 0% to 10% of $ZnO$, and 0.1% to 15% of $P_2O_5$, having 0.1 to 0.99 of a molar ratio $[Li_2O]/([Na_2O]+[K_2O])$, and having an average linear thermal expansion coefficient within a temperature range of from 30° C. to 380° C. of $38\times10^{-7}$/° C. or more and $160\times10^{-7}$/° C. or less.

2. The support glass substrate according to claim 1, wherein the support glass substrate satisfies the following relationship: a molar ratio $([Na_2O]—[Li_2O])/([Al_2O_3]+[B_2O_3]+[P_2O_5])\leq1.50$.

3. The support glass substrate according to claim 1, wherein the support glass substrate satisfies the following relationship: a molar ratio $([B_2O_3]+[Na_2O]—[P_2O_5])/([Al_2O_3]+[Li_2O])\geq0.001$.

4. The support glass substrate according to claim 1, wherein the support glass substrate comprises 12 mol % or more of $([Li_2O]+[Na_2O]+[K_2O])$, and satisfies the following relationship: $[SiO_2]+1.2\times[P_2O_5]-3\times[Al_2O_3]-2\times[Li_2O]-1.5\times[Na_2O]—[K_2O]—[B_2O_3]\geq-40\%$.

5. The support glass substrate according to claim 1, wherein the support glass substrate has a temperature at a high temperature viscosity of $10^{2.5}$ dPa·s of less than 1,660° C.

6. The support glass substrate according to claim 1, wherein the support glass substrate comprises overflow-merged surfaces in a middle portion thereof in a sheet thickness direction.

7. The support glass substrate according to claim 1, wherein the support glass substrate has a mass loss of 100.0 mg/cm$^2$ or less per unit surface area when immersed in a 5 mass % HCl aqueous solution warmed to 80° C. for 24 hours.

8. The support glass substrate according to claim 1, wherein the support glass substrate has a mass loss of 5.0 mg/cm$^2$ or less per unit surface area when immersed in a 5 mass % NaOH aqueous solution warmed to 80° C. for 6 hours.

9. The support glass substrate according to claim 1, wherein the support glass substrate comprises a compressive stress layer in a glass surface thereof.

10. The support glass substrate according to claim 9, wherein the compressive stress layer has a compressive stress value of from 165 MPa to 1,000 MPa on an outermost surface.

11. The support glass substrate according to claim 9, wherein the compressive stress layer has a depth of layer of from 50 μm to 200 μm.

12. The support glass substrate according to claim 1, wherein the support glass substrate comprises a compressive stress layer in a glass surface thereof, comprises, as the glass composition, 17 mol % or more of $Al_2O_3$, 1 mol % or more of $P_2O_5$, and 12 mol % or more of ($[Li_2O]+[Na_2O]+[K_2O]$), and satisfies the following relationship: $[SiO_2]+1.2\times[P_2O_5]-3\times[Al_2O_3]-2\times[Li_2O]-1.5\times[Na_2O]—[K_2O]—[B_2O_3]\geq-20$ mol %.

13. The support glass substrate according to claim 9, wherein the support glass substrate has a stress profile having at least a first peak, a second peak, a first bottom, and a second bottom in a thickness direction.

14. The support glass substrate according to claim 1, wherein the support glass substrate has a wafer shape or a substantially disc shape having a diameter of from 100 mm to 500 mm, has a sheet thickness of less than 2.0 mm, has a total thickness variation (TTV) of 5 μm or less, and has a warpage level of 60 μm or less.

15. The support glass substrate according to claim 1, wherein the support glass substrate has a substantially rectangular shape with a length of a side of 200 mm or more, has a sheet thickness of 1.0 mm or more, and has a total thickness variation (TTV) of 30 μm or less.

16. The support glass substrate according to claim 15, wherein the support glass substrate has a corner angle of from 89.0° to 91.0° when seen from above.

17. The support glass substrate according to claim 1, wherein the support glass substrate comprises a positioning portion in an outer peripheral portion thereof.

18. The support glass substrate according to claim 17, wherein the positioning portion has any one of a notch structure, a chamfer structure, and a cutout structure.

19. A laminate, comprising at least a substrate to be processed and a support glass substrate for supporting the substrate to be processed, wherein the support glass substrate is the support glass substrate according to claim 1.

20. The laminate according to claim 19, wherein the substrate to be processed comprises at least a semiconductor chip molded with a sealing material.

21. A method of manufacturing a semiconductor package, the method comprising the steps of:

preparing a laminate comprising at least a substrate to be processed and a support glass substrate for supporting the substrate to be processed; and subjecting the substrate to be processed to processing treatment, wherein the support glass substrate is the support glass substrate according to claim 1.

22. The method of manufacturing a semiconductor package according to claim 21, wherein the step of subjecting the substrate to be processed to processing treatment comprises arranging wiring on one surface of the substrate to be processed.

23. The method of manufacturing a semiconductor package according to claim 21, wherein the step of subjecting the substrate to be processed to processing treatment comprises forming a solder bump on one surface of the substrate to be processed.

\* \* \* \* \*